(12) United States Patent
Taylor et al.

(10) Patent No.: US 12,245,500 B2
(45) Date of Patent: Mar. 4, 2025

US012245500B2

(54) DOPED ORGANIC SEMICONDUCTORS AND METHODS OF MAKING THE SAME

(71) Applicant: NEW YORK UNIVERSITY, New York, NY (US)

(72) Inventors: André D. Taylor, Brooklyn, NY (US); Jaemin Kong, Gyeongsangnam-do (KR); Jason Alexander Röhr, Brooklyn, NY (US)

(*) Notice: Subject to any disclaimer, the term of this patent is extended or adjusted under 35 U.S.C. 154(b) by 44 days.

(21) Appl. No.: 17/709,522

(22) Filed: Mar. 31, 2022

(65) Prior Publication Data

US 2022/0328764 A1    Oct. 13, 2022

Related U.S. Application Data

(60) Provisional application No. 63/170,085, filed on Apr. 2, 2021.

(51) Int. Cl.
| | |
|---|---|
| *H01L 21/00* | (2006.01) |
| *H01G 9/20* | (2006.01) |
| *H01L 27/14* | (2006.01) |
| *H10K 30/30* | (2023.01) |
| *H10K 85/60* | (2023.01) |

(52) U.S. Cl.
CPC ......... *H10K 85/633* (2023.02); *H01G 9/2009* (2013.01); *H01G 9/2018* (2013.01); *H10K 30/30* (2023.02); *H10K 85/60* (2023.02); *H10K 85/624* (2023.02)

(58) Field of Classification Search
CPC ...... H10K 85/633; H10K 30/30; H10K 85/60; H10K 85/624; H01G 9/2009; H01G 9/2018; H01L 27/14
See application file for complete search history.

(56) References Cited

PUBLICATIONS

CO2-Responsive Water-Soluble Conjugated Polymers for In Vitro and In Vivo Biological Imaging, Cheng et al., Biomacromolecules 2020, 21, 5282-5291.*
Stable high-performance hybrid perovskite solar cells with ultrathin polythiophene as hole-transporting layer, Yan et al., Nano Research 2015, 8(8): 2474-2480.*
CO2 doping of organic interlayers for perovskite solar cells, Kong et al, Nature | vol. 594 | Jun. 3, 2021.*
Charge-carrying films for solar cells made quickly, Lu et al., Nature | vol. 594 | Jun. 3, 2021.*
Dawson, J. A. et al. Mechanisms of Lithium Intercalation and Conversion Processes in Organic-Inorganic Halide Perovskites. ACS Energy Lett. 2017, 2, 1818.
Abate, A. et al. Lithium salts as "redox active" p-type dopants for organic semiconductors and their impact in solid-state dye-sensitized solar cells. Phys. Chem. Chem. Phys. 2013, 15, 2572.
Boyd, C. C. et al. Understanding Degradation Mechanisms and Improving Stability of Perovskite Photovoltaics. Chem. Rev. 2019, 119, 3418.
Cappel, U. B. et al. Oxygen-Induced Doping of Spiro-MeOTAD in Solid-State Dye-Sensitized Solar Cells and Its Impact on Device Performance. Nano Lett. 2012, 12, 4925-4931.
Eperon, G. E. et al. The Importance of Moisture in Hybrid Lead Halide Perovskite Thin Film Fabrication ACS Nano 2015, 9, 9380.
Hawash, Z. et al. Moisture and Oxygen Enhance Conductivity of LiTFSI-Doped Spiro-MeOTAD Hole Transport Layer in Perovskite Solar Cells. Adv. Mater. Interfaces 2016, 3, 1600117.
Lamberti, F. et al. Evidence of Spiro-OMeTAD De-doping by tert-Butylpyridine Additive in Hole Transporting Layers for Perovskite Solar Cells. Chem 2019, 5, 1806.
Li, Z. et al. Extrinsic ion migration in perovskite solar cells. Energy Environ. Sci. 2017, 10, 1234.
Lin, W. C. et al. Interpenetration of CH3NH3PbI3 and TiO2 improves perovskite solar cells while TiO2 expansion leads to degradation. Phys. Chem. Chem. Phys. 2017, 19, 21407.
McMeekin, D. P. et al. Solution-Processed All-Perovskite Multi-junction Solar Cells. Joule 2019, 3, 387.
Nguyen, W. H. et al. Enhancing the Hole-Conductivity of Spiro-OMeTAD without Oxygen or Lithium Salts by Using Spiro(TFSI)2 in Perovskite and Dye-Sensitized Solar Cells. J. Am. Chem. Soc. 2014, 136, 10996-11001.
Schloemer, T. H. et al. Doping strategies for small molecule organic hole-transport materials: impacts on perovskite solar cell performance and stability. Chem. Sci. 2019, 10, 1904.
Tan, B. et al. LiTFSI-Free Spiro-OMeTAD-Based Perovskite Solar Cells with Power Conversion Efficiencies Exceeding 19% Adv. Energ. Mater. 2019, 9, 1901519.
Wang, S. et al. Spectrum-Dependent Spiro-OMeTAD Oxidization Mechanism in Perovskite Solar Cells. ACS Appl. Mater. Interfaces 2015, 7, 24791-24798.
Yurash, B. et al. Towards understanding the doping mechanism of organic semiconductors by Lewis acids. Nat. Mater. 2019, 18, 1327.

* cited by examiner

*Primary Examiner* — Haidung D Nguyen
(74) *Attorney, Agent, or Firm* — Riverside Law LLP

(57) ABSTRACT

A doped organic semiconductor is produced using the method of providing an organic semiconductor solution, contacting the organic semiconductor solution with $CO_2$; and irradiating the organic semiconductor solution with ultraviolet light. A composition is described, the composition comprising an organic semiconductor; and a metal salt having the formula $M^+X^-$ wherein $X^-$ is a monoanionic species; and wherein the ratio of $M^+$ to $X^-$ in the hole transport material is less than about 1.00. An additional composition is described, the composition comprising an organic semiconductor; a metal salt having the formula $M^+X^-$ wherein $X^-$ is a monoanionic species; and a metal carbonate; wherein the total metal content of the composition is approximately equal to the $X^-$ content of the composition.

14 Claims, 35 Drawing Sheets

Mass (m/z) = 7.137 (Li),
cts: 4856; Max: 3; scale: 100 μm

Mass (m/z) = 7.137 (Li),
cts: 270007; Max: 20; scale: 100 μm

DOPED ORGANIC SEMICONDUCTORS AND METHODS OF MAKING THE SAME

CROSS-REFERENCE TO RELATED APPLICATIONS

The present application claims priority to U.S. Provisional Application No. 63/170,085, filed Apr. 2, 2021, which is incorporated by reference herein in its entirety.

STATEMENT REGARDING FEDERALLY SPONSORED RESEARCH OR DEVELOPMENT

This invention was made with government support under Grant No. CBET-0954985, awarded by the National Science Foundation, and by Contract No. DE-SC0012704, awarded by the Department of Energy. The Government has certain rights in the invention.

BACKGROUND OF THE INVENTION

Doping is key in leveraging control of the electrical properties of semiconductors (Chiang, C. K. et al. Phys Rev Lett 1977, 39, 1098-1101; Macdiarmid, A. G. & Heeger, A. J. Synthetic Met 1980, 1, 101-118; Macdiarmid, A. G. & Heeger, A. J. Synthetic Met 1980, 1, 101-118), as it governs the essential parameters in their electronic applications (Blochwitz, J., et al., Appl Phys Lett 1998, 73, 729-731; Walzer, K., et al., Chem Rev 2007, 107, 1233-1271; Yim, K. H. et al. Adv Mater 2008, 20, 3319; Zhang, Y., et al., Adv Funct Mater 2009, 19, 1901-1905; Yurash, B. et al. Nat Mater 2019, 18, 1327-1334). In perovskite solar cells, organic semiconductors are often used as essential interlayers between the photoactive layer and the electrodes. Their electrical properties significantly affect charge collection efficiencies and therefore determine the overall device performance (Cho, A. N. & Park, N. G. Chemsuschem 2017, 10, 3687-3704; Zhang, W. X. et al. Adv Sci 2018, 5, 1800159). 2,2',7,7'-Tetrakis[N,N-di(4-methoxyphenyl)amino]-9,9-spirobifluorene (spiro-OMeTAD), a π-conjugated small molecule, is the most commonly used semiconductor for the hole-conducting layer (Hawash, Z., et al., Adv Mater Interfaces 2018, 5, 1700623; Bach, U. et al. Nature 1998, 395, 583-585; Green, M. A., et al. Nat Photonics 2014, 8, 506-514; Tan, H. R. et al. Science 2017, 355, 722-726; Saliba, M. et al. Energ Environ Sci 2016, 9, 1989-1997; Lee, C. P., et al., Mater Today 2017, 20, 267-283). To enhance the electrical conductivity of spiro-OMeTAD, lithium bis(trifluoromethane)sulfonimide (LiTFSI) is typically employed for a doping process that is conventionally initiated by exposing the spiro-OMeTAD:LiTFSI blend films to air and light for several hours, with oxygen acting as the p-type dopant (Cappel, et al., Nano Lett 2012, 12, 4925-4931; Abate, A. et al. Phys Chem Chem Phys 2013, 15, 2572-2579; Wang, S., et al., Acs Appl Mater Inter 2015, 7, 24791-24798; Nguyen, W. H., et al., J Am Chem Soc 2014, 136, 10996-11001). This time-costly process largely depends on ambient conditions and is a hindrance to the commercialization of perovskite solar cells.

There remains a need in the art for improved methods of doping semiconductors. The present invention addresses this unmet need.

SUMMARY OF THE INVENTION

In one aspect, the present invention relates to a composition comprising an organic semiconductor; and a metal salt having the formula $M^+X^-$; wherein $X^-$ is a monoanionic species; and wherein the ratio of $M^+$ to $X^-$ in the hole transport material is less than about 1.00. In one embodiment, the metal salt is LiTFSI, LiPFSI, or $LiPF_6$. In one embodiment, the organic semiconductor comprises spiro-OMeTAD or a derivative thereof.

In another aspect, the present invention relates to a composition comprising an organic semiconductor; a metal salt having the formula $M^+X^-$ wherein $X^-$ is a monoanionic species; and a metal carbonate having the formula $M_2CO_3$; wherein the metal of the carbonate and the metal of the metal salt are the same; and wherein the total metal content of the composition is approximately equal to the $X^-$ content of the composition. In one embodiment, the organic semiconductor comprises a semiconducting polymer selected from the group consisting of poly(3-hexylthiophene) (P3HT), poly[(2,6-(4,8-bis(5-(2-ethylhexyl)thiophen-2-yl)-benzo[1,2-b:4,5-b']dithiophene))-alt-(5,5-(1',3'-di-2-thienyl-5',7'-bis(2-ethylhexyl)benzo[1',2'-c:4',5'-c']dithiophene-4,8-dione)]) (PBDB-T), poly[bis(4-phenyl)(2,4,6-trimethylphenyl)amine](PTAA), and poly[2-methoxy-5-(2-ethylhexyloxy)-1,4-phenylenevinylene] (MEH-PPV). In one embodiment, the metal salt is LiTFSI, LiPFSI, or $LiPF_6$.

In another aspect, the present invention relates to a method of producing a doped organic semiconductor, the method comprising the steps of providing an organic semiconductor solution; contacting the organic semiconductor solution with $CO_2$; and irradiating the organic semiconductor solution with ultraviolet light. In one embodiment, the method further comprises the step of removing at least one precipitate from the organic semiconductor solution. In one embodiment, the method further comprises the step of isolating a mixture of the organic semiconductor and a doped organic semiconductor from the organic semiconductor solution. In one embodiment, the precipitate comprises $M_2CO_3$.

In one embodiment, the step of contacting the organic semiconductor with $CO_2$ comprises the step of bubbling $CO_2$ through the organic semiconductor solution. In one embodiment, the step of contacting the organic semiconductor with $CO_2$ occurs simultaneously with the step of irradiating the organic semiconductor solution with ultraviolet light.

In one embodiment, the organic semiconductor solution comprises at least one organic semiconductor. In one embodiment, the organic semiconductor solution comprises spiro-OMeTAD or a derivative thereof. In one embodiment, the organic semiconductor solution comprises a semiconducting polymer. In one embodiment, the semiconducting polymer is selected from the group consisting of poly(3-hexylthiophene) (P3HT), poly[(2,6-(4,8-bis(5-(2-ethylhexyl)thiophen-2-yl)-benzo[1,2-b:4,5-b']dithiophene))-alt-(5,5-(1',3'-di-2-thienyl-5',7'-bis(2-ethylhexyl)benzo[1',2'-c:4',5'-c']dithiophene-4,8-dione)]) (PBDB-T), poly[bis(4-phenyl)(2,4,6-trimethylphenyl)amine] (PTAA), and poly[2-methoxy-5-(2-ethylhexyloxy)-1,4-phenylenevinylene] (MEH-PPV). In one embodiment, the organic semiconductor solution comprises LiTFSI.

In another aspect, the present invention relates to doped organic semiconductor material produced using the methods described herein, as well as hole transport layer comprising the doped organic semiconductor material and a photovoltaic device comprising the doped organic semiconductor material.

BRIEF DESCRIPTION OF THE DRAWINGS

The following detailed description of preferred embodiments of the invention will be better understood when read in conjunction with the appended drawings. For the purpose of illustrating the invention, there are shown in the drawings embodiments which are presently preferred. It should be understood, however, that the invention is not limited to the precise arrangements and instrumentalities of the embodiments shown in the drawings.

DETAILED DESCRIPTION

Figure 1:
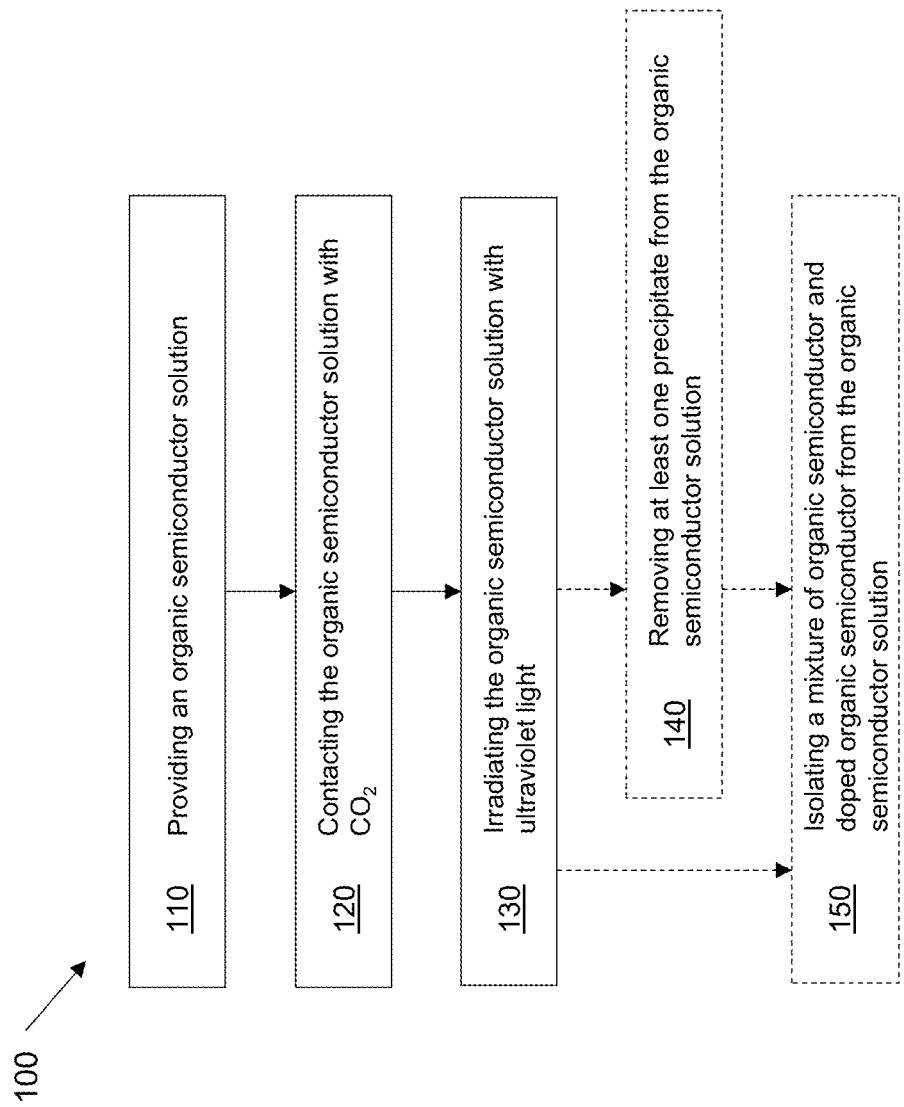
FIG. 1 is a flowchart showing an exemplary method of the invention.

It is to be understood that the figures and descriptions of the present invention have been simplified to illustrate elements that are relevant for a clear understanding of the present invention, while eliminating, for the purpose of clarity, many other elements found in photovoltaic devices. Those of ordinary skill in the art may recognize that other elements and/or steps are desirable and/or required in implementing the present invention. However, because such elements and steps are well known in the art, and because they do not facilitate a better understanding of the present invention, a discussion of such elements and steps is not provided herein. The disclosure herein is directed to all such variations and modifications to such elements and methods known to those skilled in the art.

As used herein, each of the following terms has the meaning associated with it in this section. Unless defined otherwise, all technical and scientific terms used herein generally have the same meaning as commonly understood by one of ordinary skill in the art to which this invention belongs.

The articles "a" and "an" are used herein to refer to one or to more than one (i.e. to at least one) of the grammatical object of the article. By way of example, "an element" means one element or more than one element.

As used herein, the term "about" will be understood by persons of ordinary skill in the art and will vary to some extent depending on the context in which it is used. As used herein when referring to a measurable value such as an amount, a temporal duration, and the like, the term "about" is meant to encompass variations of 20% or ±10%, more preferably +5%, even more preferably ±1%, and still more preferably +0.1% from the specified value, as such variations are appropriate to perform the disclosed methods.

As used herein, the terms "electrode" and "contact" may refer to a layer that provides a medium for delivering current to an external circuit or providing a bias current or voltage to the device. For example, an electrode, or contact, may provide the interface between the active regions of an organic photosensitive optoelectronic device and a wire, lead, trace or other means for transporting the charge carriers to or from the external circuit. Examples of electrodes include anodes and cathodes, which may be used in a photosensitive optoelectronic device.

As used herein, the term "transparent" may refer to a material that permits at least 50% of the incident electromagnetic radiation in relevant wavelengths to be transmitted through it. In a photosensitive optoelectronic device, it may be desirable to allow the maximum amount of ambient electromagnetic radiation from the device exterior to be admitted to the photoconductive active interior region. That is, the electromagnetic radiation must reach a photoconductive layer(s), where it can be converted to electricity by photoconductive absorption. This often dictates that at least one of the electrical contacts or electrodes should be minimally absorbing and minimally reflecting of the incident electromagnetic radiation. In some cases, such a contact should be transparent or at least semi-transparent. In one embodiment, the transparent material may form at least part of an electrical contact or electrode.

As used herein, the term "semi-transparent" may refer to a material that permits some, but less than 50% transmission of ambient electromagnetic radiation in relevant wavelengths. Where a transparent or semi-transparent electrode is used, the opposing electrode may be a reflective material so that light which has passed through the cell without being absorbed is back reflected through the cell.

As used and depicted herein, a "layer" refers to a member or component of a device, for example an optoelectronic device, being principally defined by a thickness, for example in relation to other neighboring layers, and extending outward in length and width. It should be understood that the term "layer" is not necessarily limited to single layers or sheets of materials. In addition, it should be understood that the surfaces of certain layers, including the interface(s) of such layers with other material(s) or layers(s), may be imperfect, wherein said surfaces represent an interpenetrating, entangled or convoluted network with other material(s) or layer(s). Similarly, it should also be understood that a layer may be discontinuous, such that the continuity of said layer along the length and width may be disturbed or otherwise interrupted by other layer(s) or material(s).

As used herein, a "photoactive region" refers to a region of a device that absorbs electromagnetic radiation to generate excitons. Similarly, a layer is "photoactive" if it absorbs electromagnetic radiation to generate excitons. The excitons may dissociate into an electron and a hole in order to generate an electrical current.

As used herein, "spin coating" may refer to the process of solution depositing a layer or film of one material (i.e., the coating material) on a surface of an adjacent substrate or layer of material. The spin coating process may include applying a small amount of the coating material on the center of the substrate, which is either spinning at low speed or not spinning at all. The substrate is then rotated at high speed in order to spread the coating material by centrifugal force. Rotation is continued while the fluid spins off the edges of the substrate, until the desired thickness of the film is achieved. The applied solvent is usually volatile, and simultaneously evaporates. Therefore, the higher the angular speed of spinning, the thinner the film. The thickness of the film also depends on the viscosity and concentration of the solution and the solvent.

As used herein, the term "substrate" refers to a structural surface beneath or above a layered material or coating (e.g., glass or polymer coating). In one embodiment, substrate materials can be used for encapsulation of devices. In one embodiment, special encapsulants can be also used to project devices from degradation such as oxygen transmission and moisture ingress.

As used herein, the term "spiro-OMeTAD" refers to 2,2',7,7'-tetrakis[N,N-di(4-methoxyphenyl)amino]-9,9-spirobifluorene.

As used herein, the term "Li-TFSI" or "LiTFSI" refers to lithium bis(trifluoromethane)sulfonimide.

As used herein, the term "TFSI$^-$" refers to the bis(trifluoromethane)sulfonimide anion.

As used herein, the term "tBP" refers to 4-tert-butylpyridine.

Throughout this disclosure, various aspects of the invention can be presented in a range format. It should be understood that the description in range format is merely for convenience and brevity and should not be construed as an inflexible limitation on the scope of the invention. Accordingly, the description of a range should be considered to have specifically disclosed all the possible sub-ranges as well as individual numerical values within that range. For example, description of a range such as from 1 to 6 should be considered to have specifically disclosed sub-ranges such as from 1 to 3, from 1 to 4, from 1 to 5, from 2 to 4, from 2 to 6, from 3 to 6 etc., as well as individual numbers within that range, for example, 1, 2, 2.7, 3, 4, 5, 5.3, and 6. This applies regardless of the breadth of the range.

Description

The present invention is based in part on the unexpected discovery that bubbling a semiconductor in solution with $CO_2$ under light promotes p-doping of the semiconductor solution and improves conductivity of the resulting film.

Methods of the Invention

In one aspect, the present invention relates to a method of producing a doped organic semiconductor. Exemplary method 100 is depicted in FIG. 1. In step 110, an organic semiconductor solution is provided. In step 120, the organic semiconductor solution is contacted with $CO_2$. In step 130, the organic semiconductor solution is irradiated with ultraviolet light. In some embodiments, step 120 and step 130 are performed simultaneously.

In one embodiment, the organic semiconductor solution comprises at least one small molecule semiconductor. In one embodiment, the organic semiconductor solution comprises spiro-OMeTAD. In one embodiment, the organic semiconductor solution further comprises t-butyl pyridine (tBP). However, the organic semiconductor solution is not limited to these components and may include any material known to those of skill in the art.

In one embodiment, the organic semiconductor comprises at least one electrolyte or metal salt. In one embodiment, the organic semiconductor comprises at least one metal salt having the formula $M^+X^-$ wherein M is a monocationic metal, such as an alkali metal, transition metal, rare earth metal, post-transition metal, or metalloid and $X^-$ is a monoanionic organic species. Contemplated alkali metals include lithium, sodium, potassium, rubidium, and cesium. Contemplated alkaline metals include beryllium, magnesium, calcium, strontium, and barium. Exemplary transition metals include, but are not limited to, scandium, titanium, vanadium, chromium, manganese, iron, cobalt, nickel, copper, zinc, yttrium, zirconium, niobium, molybdenum, technetium, ruthenium, rhodium, palladium, silver, cadmium, hafnium, tantalum, tungsten, rhenium, osmium, iridium, platinum, gold, and mercury. Exemplary post-transition metals include aluminum, gallium, indium, tin, thallium, lead, and bismuth. Exemplary metalloids include boron, silicon, germanium, arsenic, antimony, and tellurium. Exemplary rare earth elements include lanthanum, cerium, praseodymium, neodymium, promethium, samarium, europium, gadolinium, terbium, dysprosium, holmium, erbium, thulium, ytterbium, and lutetium.

In one embodiment, the electrolyte comprises a lithium salt. In one embodiment, the lithium salt comprises a compound having the formula LiX, where X is a monoanionic species. In one embodiment, the electrolyte comprises a sodium salt. In one embodiment, the sodium salt comprises a compound having the formula NaX, where X is a monoanionic species. In one embodiment, the electrolyte comprises a silver salt. In one embodiment, the silver salt comprises a compound having the formula AgX. In one embodiment, the electrolyte comprises a copper salt. In one embodiment, the copper salt comprises a compound having the formula CuX. In one embodiment, the electrolyte comprises an organic cation.

Exemplary monoanionic species X include, but are not limited to, hexafluorophosphate ($PF_6^-$), tetrafluoroborate ($BF_4^-$), hexafluoroarsenate ($AsF_6^-$), perchlorate ($ClO_4^-$), bis(trifluoromethylsulfonyl)imide [$(SO_2CF_3)_2N$]$^-$), bis(perfluoroethylsulfonyl) imide[$(SO_2C_2F_5)_2N$]$^-$), trifluoromethanesulfonate ($CF_3SO_3^-$), nonafluorobutanesulfonate ($C_4F_9SO_3^-$), difluoro oxalato borate anion ($BF_2(C_2O_4)^-$), cyclo-hexafluoropropane-1,3-bis(sulfonyl)imide ($NSO_2C_3F_6SO_2^-$), bis(fluorosulfonyl)imide (($SO_2F)_2N^-$), fluoroalkyl-phosphates, and the like.

Exemplary electrolytes include, but are not limited to, lithium hexafluorophosphate ($LiPF_6$), lithium tetrafluoroborate ($LiBF_4$), lithium hexafluoroarsenate ($LiAsF_6$), lithium perchlorate ($LiClO_4$), lithium bis(trifluoromethylsulfonyl) imide (LiTFSI), lithium bis(perfluoroethylsulfonyl) imide ($LiN(C_2F_5SO_2)_2$), lithium trifluorosulfonate ($CF_3SO_3Li$), lithium nonafluorobutanesulfonate, lithium difluoro oxalato borate anion (LiDFOB), lithium bis(oxalato)borate (LiBOB), lithium cyclo-hexafluoropropane-1,3-bis(sulfonyl) imide, sodium bis(fluorosulfonyl)imide (NaFSI), sodium bis(trifluoromethylsulfonyl)imide (NaTFSI), sodium bis (pentafluoroethanesulfonyl)imide (NaBETI), Li-Fluoroalkyl-Phosphates ($LiPF_3(CF_2CF_3)_3$), and the like. In one embodiment, the organic semiconductor solution further comprises a cobalt salt, such as FK209 Co(III)TFSI salt, FK209 Co(III) $PF_6$ salt, FK102 Co(III)TFSI salt, or FK102 Co(III) $PF_6$ salt.

In one embodiment, the electrolyte is present in excess. In one embodiment, the ratio of electrolyte to small molecule conductor in the organic semiconductor solution is between about 100:1 and about 1:100. In one embodiment, the ratio of electrolyte to small molecule conductor is greater than or equal to about 1:10, 1:9, 1:8, 1:7, 1:6, 1:5, 1:4, 1:3, 1:2, 1:1, 2:1, 3:1, 4:1, 5:1, 6:1, 7:1, 8:1, 9:1, or 10:1.

In one embodiment, the organic semiconductor solution comprises a semiconducting polymer. Exemplary semiconducting polymer classes include, but are not limited to, poly(fluorene)s, polyphenylenes, polypyrenes, polyazulenes, polynaphthalenes, poly(pyrrole)s, polycarbazoles, polyindoles, polyazepines, polyanilines, poly(thiophene)s, poly(p-phenylene sulfide)s, poly(acetylene)s, or poly(p-phenylene vinylene)s, benzothiadiazole, or any combination thereof. Exemplary semiconducting polymers include, but are not limited to, poly(3-hexylthiophene) (P3HT), poly[(2,6-(4,8-bis(5-(2-ethylhexyl)thiophen-2-yl)-benzo[1,2-b:4,5-b']dithiophene))-alt-(5,5-(1',3'-di-2-thienyl-5',7'-bis(2-ethylhexyl)benzo[1',2'-c:4',5'-c']dithiophene-4,8-dione)]) (PBDB-T), poly[bis(4-phenyl)(2,4,6-trimethylphenyl)amine](PTAA), poly[2-methoxy-5-(2-ethylhexyloxy)-1,4-phenylenevinylene] (MEH-PPV), poly[4,8-bis-(2-ethylhexyl-thiophene-5-yl)-benzo[1,2-b:4,5-b']dithiophene-2,6-diyl]-alt-[2-(2'-ethyl-hexanoyl)-thieno[3,4-b]thiophen-4,6-diyl](PBDTTT-CT), poly[N-9'-hepta-decanyl-2,7-carbazole-alt-5,5-(4',7'-di-2-thienyl-2',1',3'-enzothiadiazole)] (PCDTBT), poly[6-fluoro-2,3-bis-(3-octyloxyphenyl) quinoxaline-5,8-diyl-alt-thiophene-2,5-diyl] (FTQ), poly(3-octylthiophene) (P3 T), poly(3-hexyloxythiophene) (P3DOT), poly(3-methylthiophene) (PMeT), poly(3-dodecylthiophene) (P3DDT), poly(3-dodecylthienylenevinylene) (PDDTV), poly(3,3 dialkylquarterthiophene) (PQT), poly-dioctyl-fluorene-co-bithiophene (F8T2), Poly[[4,8-bis[(2-ethylhexyl)oxy]benzo[1,2-b:4,5-b']dithiophene-2,6-diyl][3-fluoro-2-[(2-ethylhexyl)carbonyl]thieno[3,4-b]thiophenediyl]](PTB7), poly-(2,5,-bis(3-alkylthiophene-2-yl)thieno[3,2-b]thiophene) (PBTTT-C12), poly[2,7-(9,9'-dihexylfluorene)-alt-2,3-dimethyl-5,7-dithien-2-yl-2,1,3-benzothiadiazole](PFDDTBT), poly{[2,7-(9,9-bis-(2-ethylhexyl)-fluorene)]-alt-[5,5-4,7-di-20-thienyl-2,1,3-benzothiadiazole)]} (BisEH-PFDTBT), poly {[2,7-(9,9-bis-(3,7-dimethyl-octyl)-fluorene)]-alt-[5,5-(4,7-di-20-thienyl-2,3-benzothiadiazole)]} (BisDMO-PFDTBT), poly [N-9"-hepta-decanyl-2,7-carbazole-alt-5,5-(4',7'-di-2-thienyl-2',1',3'-benzothiadiazole)](PCDT3BT), poly[4,8-bis-substituted-benzo[1,2-b:4,5-b']dithiophene-2,6-diyl-alt-4-substituted-thieno[3,4-b]thio-phene-2,6-diyl] (PBDTTT-C-T), Poly(benzo[1,2-b:4,5-b']dithiophene-alt-thieno[3,4-c] pyrrole-4,6-dione (PBDTTPD), poly((4,4-dioctyldithieno(3,2-b:2',3'-d)silole)-2,6-diyl-alt-(2,1,3-benzothiadiazole)-4,7-diyl) (PSBTBT), poly[4,8-bis(5-(2-ethylhexyl)thiophen-2-yl)benzo[1,2-b;4,5-b']dithiophene-2,6-diyl-alt-(4-(2-ethylhexyl)-3-fluorothieno[3,4-b]thiophene-)-2-carboxylate-2-6-diyl)] (PTB7-Th), poly[(5,6-difluoro-2,1,3-benzothiadiazol-4,7-diyl)-alt-(3,3'''-di(2-octyldodecyl)-2,2',5',2'',5'',2'''-quaterthiophen-5,5'''-diyl)] (PffBT4T-20D), poly [(2,5-bis(2-hexyldecyloxy)phenylene)-alt-(5,6-difluoro-4,7-di(thiophen-2-yl)benzo[c]-[1,2,5]thiadiazole)] (PPDT2FBT), Poly[2-(5-(4,8-bis(5-((2-butyloctyl)thio)thiophen-2-yl)benzo[1,2-b:4,5-b']dithiophen-2-yl)-4-octylthiophen-2-yl)-5-(4-octylthiophen-2-yl)-1,3,4-thiadiazole] (PBDTS-TDZ), Poly[2,5-(2-decyltetradecyl)-3,6-diketopyrrolopyrrole-alt-5,5-(2,5-di(thien-2-yl)thieno[3,2-b]thiophene)] (PDPPTT), Poly[2,5-(2-octyldodecyl)-3,6-diketopyrrolopyrrole-alt-5,5-(2,5-di(thien-2-yl)thieno [3,2-b] thiophene)](PDPP2T-TT-OD), and poly{1-(5-(4,8-bis((2-ethylhexyl)oxy)-6-methylbenzo[1,2-b:4,5-b0]dithiophen-2-yl)thiophen-2-yl)-5,7-bis-(2-ethylhexyl)-3-(5-methylthiophen-2-yl)benzo[1,2-c:4,5-c0]dithiophene-4,8-dione} (PDBD-O), poly(benzimidazobenzophenanthroline), diphenyl terminated poly[(2,5-didecyloxy-1,4-phenylene) (2,4,6-triisopropylphenylborane)], poly(2,5-di(3,7-dimethyloctyloxy)cyanoterephthalylidene), poly(2,5-di(hexyloxy) cyanoterephthalylidene), poly(5-(3,7-dimethyloctyloxy)-2-methoxy-cyanoterephthalylidene), poly(2,5-di(octyloxy) cyanoterephthalylidene), poly(5-(2-ethylhexyloxy)-2-methoxy-cyanoterephthalylidene), and the like.

In one embodiment, the step of contacting the organic semiconductor solution with $CO_2$ comprises the step of contacting the solution with solid $CO_2$ ("dry ice"). For example, some quantity of dry ice may be added to the solution. In one embodiment, the solution is permitted to warm, thereby causing the release $CO_2$ gas.

In one embodiment, the step of contacting the organic semiconductor solution with $CO_2$ comprises the step of carbonating the solution. In one embodiment, the solution may be carbonated with any device or instrument capable of introducing $CO_2$ into a solution with concomitant pressurization of the system. In one embodiment, the pressure within the system comprising the solution may be maintained for any period of time and at any pressure or temperature. In one embodiment, the solution is depressurized, such as by opening the system to atmospheric conditions.

In one embodiment, the step of contacting the organic semiconductor solution with $CO_2$ comprises the step of bubbling $CO_2$ gas through the semiconductor solution. For example, a gas outlet may be positioned outside the solution, such as in a "head space" of a reaction vessel, and a gas inlet may be immersed in the solution, or otherwise placed in such as a way as to permit transit of gas through the solution. There is no particular limit to the duration of the $CO_2$ bubbling treatment. Said duration may be tuned depending on the concentration of the organic semiconductor solution, the components, the solvent identity, the volume of solvent, and any other factors affecting diffusion (such as stir rate, etc.). Similarly, there is no particular limit to the rate of $CO_2$ bubbling, which may depend on the $CO_2$ source utilized. In one embodiment, the $CO_2$ is bubbled at a rate of about 2 mL/min. In one embodiment, the solution is bubbled with $CO_2$ for about 1 minute. In one embodiment, the solution is bubbled with $CO_2$ for greater than 1 minute.

The apparatus used for bubbling $CO_2$ can be any apparatus known to those of skill in the art. In one embodiment, the step of contacting the organic semiconductor solution with $CO_2$ is performed in a $CO_2$ atmosphere. In one embodiment, the $CO_2$ content of ambient air is not sufficient to cause the inventive effects. In one embodiment, the $CO_2$ content of exhaled air is not sufficient to cause the inventive effects. In one embodiment, the $CO_2$ content of the gas is at least about 5%, at least about 10%, at least about 15%, at least about 20%, at least about 25%, at least about 30%, at least about 35%, at least about 40%, at least about 45%, at least about 50%, at least about 55%, at least about 60%, at least about 65%, at least about 70%, at least about 75%, at least about 80%, at least about 85%, at least about 90%, at least about 95%, or about 100%. In one embodiment, the $CO_2$ gas further comprises one or more additional gases, such as but not limited to nitrogen, oxygen, hydrogen, helium, and argon.

In one embodiment, $O_2$ gas may be bubbled instead of $CO_2$ gas.

In one embodiment, the irradiation with ultraviolet (UV) light may be performed using any method known in the art, for example, by a method using a low-pressure mercury lamp, a high pressure mercury lamp, a mercury-xenon lamp, a UV laser or otherwise focused beam device, or the like. In one embodiment, the UV light has a wavelength between about 100 nm and about 400 nm. In one embodiment, the UV light has a wavelength between about 100 nm and about 280 nm. In one embodiment, the UV light has a wavelength between about 280 nm and about 315 nm. In one embodiment, the UV light has a wavelength between about 315 nm and about 400 nm. In one embodiment, the UV light has a wavelength of about 365 nm.

In some embodiments, the step of irradiating the solution with UV light comprises the step of irradiating the solution with visible light. In one embodiment, the light has a wavelength between 380 nm and 450 nm. In one embodiment, the light has a wavelength between 400 nm and 700 nm. In one embodiment, the light has a wavelength between 450 nm and 495 nm. In one embodiment, the light has a wavelength between 495 nm and 570 nm. In one embodiment, the light has a wavelength between 570 nm and 590 nm. In one embodiment, the light has a wavelength between 590 nm and 620 nm. In one embodiment, the light has a wavelength between 620 nm and 750 nm.

In some embodiments, the step of irradiating the solution with UV light further comprises the step of identifying the ideal absorption wavelength for the organic semiconductor. In one embodiment, the absorption wavelength for a particular organic semiconductor may be determined using methods generally known to those of skill in the art. However, the wavelength of light with which the organic semiconductor is irradiated is not limited to the absorption wavelength thus determined. In one embodiment, wavelength of light corresponds to the energy greater than the band gap of the organic semiconductor.

In one embodiment, the organic semiconductor solution comprises an organic solvent. Exemplary solvents include, but are not limited to, water, methanol, ethanol, 1-propanol, 2-propanol, n-butanol, 1-pentanol, t-butyl alcohol, carbon tetrachloride, chlorobenzene, dichlorobenzene (ortho-, meta-, or para-), ethylbenzene, ortho-, meta- or para-xylene, ethyl acetate, acetone, dichloromethane, chloroform, benzene, toluene, ethylene glycol, pentane, hexane, petroleum ether, diethyl ether, acetic acid, acetonitrile, 1,2-dimethoxyethane, dimethylformamide, dimethyl sulfoxide, 1,4-dioxane, n-methyl-2-pyrrolidinone, nitromethane, pyridine, tetrahydrofuran, triethylamine, quinoline, cumene, high boiling ethers, gamma butyrolactone, ethyl lactate, methyl 2-hydroxyisobutyrate, PGMEA, cyclohexanone, tetrahydrofurfuryl alcohol, propylene carbonate, 2-heptanone, NMP, diacetone alcohol, ionic liquids, glycerin, and combinations thereof. In one embodiment, the solvent comprises chlorobenzene, dichloromethane, chloroform, or carbon tetrachloride.

In one embodiment, the bubbling of $CO_2$ and/or irradiation with UV light is performed at room temperature. In one embodiment, the bubbling of $CO_2$ and/or irradiation with UV light is performed at elevated temperature (i.e., greater than room temperature). In one embodiment, the bubbling of $CO_2$ and/or irradiation with UV light is performed at decreased temperature (i.e., lower than room temperature).

In one embodiment, the method further comprises step 140, in which at least one precipitate is removed from the organic semiconductor solution. Precipitates may be removed using any method known in the art, including but not limited to vacuum filtration and centrifugation. In one embodiment, the method does not include the step of removing a precipitate. In one embodiment, the precipitate comprises a carbonate salt or a bicarbonate salt. In one embodiment, the precipitate comprises $Li_2CO_3$. In one embodiment, the precipitate comprises carbon. In one embodiment, the precipitate comprises one or more additional carbon-containing species.

In one embodiment, the method further comprises step 150, in which a doped organic semiconductor material is isolated from the solution. In one embodiment, said step comprises the step of pouring the organic semiconductor solution into a second solvent, such as a solvent in which the organic semiconductor is sparingly soluble or insoluble. In one embodiment, the isolation step affords a mixture of doped and non-doped semiconductor. In one embodiment, solvent in which the organic semiconductor is dissolved is at least partially miscible in the second solvent Exemplary solvents may include hexanes, pentane, benzene, alkylbenzenes (i.e, toluene and the like), diethyl ether, methyl tert-butyl ether (MTBE), and any other solvent disclosed herein or known in the art. The solid precipitate can then be filtered from the second solvent using any method known to those of skill in the art.

Compositions of the Invention

In one aspect, the present invention relates to a composition comprising: an organic semiconductor; and a metal salt having the formula $M^{++}X^-$; wherein $X^-$ is a monoanionic species; and wherein the ratio of $M^+$ to $X^-$ in the hole transport material is less than about 1.00.

In another aspect, the present invention relates to a composition comprising an organic semiconductor; a metal salt having the formula $M^+X^-$ wherein $X^-$ is a monoanionic species; and a metal carbonate having the formula $M_2CO_3$, where the M of the metal salt and the M of the carbonate is the same metal; wherein the total metal content (M) of the composition is approximately equal to the $X^-$ content of the composition. In one embodiment, the metal is Li and the carbonate is lithium carbonate.

In some embodiments, the composition of the invention may be a doped hole transport material. In one embodiment, the composition comprises at least one small molecule semiconductor. In one embodiment, the small molecule semiconductor comprises a mixture of ground state compounds and excited state compounds, such as excited derivatives of the ground state compounds. In one embodiment, the excited state compounds include radical cations and diradical-dications. In one embodiment, the small molecule semiconductor comprises spiro-OMeTAD or any derivative thereof. In one embodiment, the small molecule semiconductor comprises spiro-OMeTAD$^{\cdot+}$. In one embodiment, the small molecule semiconductor comprises spiro-OMeTAD$^{\cdot 2+}$. In one embodiment, the radical cations and diradical dications comprise stabilizing anion(s), such as TFSI$^-$, in a proportion so as to render the overall complex neutral.

In some embodiments, composition further comprises 4-tert-butylpyridine. In one embodiment, the composition is produced using the methods described herein. For example, as described above, in some embodiments, the composition is produced by providing an organic semiconductor solution, contacting the organic semiconductor solution with $CO_2$, and irradiating the organic semiconductor solution is with ultraviolet light. In some embodiments, the contacting with $CO_2$ step and irradiating step are performed simultaneously.

In some embodiments, the composition comprises about 5%, about 10%, about 15%, about 20%, about 25%, about 30%, about 35%, about 40%, about 45%, about 50%, about 55%, about 60%, about 65%, about 70%, about 75%, about 80%, about 85%, about 90%, about 95%, or about 100% excited state compound.

In one embodiment, the doped hole transport material comprises at least about 5%, at least about 10%, at least about 15%, at least about 20%, at least about 25%, at least about 30%, at least about 35%, at least about 40%, at least about 45%, at least about 50%, at least about 55%, at least about 60%, at least about 65%, at least about 70%, at least about 75%, at least about 80%, at least about 85%, at least about 90%, or at least about 95% excited state compound.

In some embodiments, the composition formed using the methods of the invention comprises a lithium salt having the formula Li$^+$X$^-$, a sodium salt having the formula Na$^+$X$^-$, or any other ionic species having the formula M$^{(n+)}$X$_n^-$, where M is a cationic species and n is the oxidation state of the metal M.

In some aspects, the composition further comprises a carbonate salt or a bicarbonate salt. In one embodiment, the composition comprises Li$_2$CO$_3$, Na$_2$CO$_3$, K$_2$CO$_3$, or CoCO$_2$. In some embodiments, the carbonate salt is formed from the reaction between $CO_2$, an organic semiconductor material, and/or a metal cation in the presence of ultraviolet light. In some embodiments, the carbonate salt is formed from the reaction between m and $CO_2$ in the presence of ultraviolet light. In some embodiments, the counterion to the carbonate salt is any cationic species present in the organic semiconductor solution. In one embodiment, the counterion to the carbonate salt is the cation of the electrolyte in the composition. In one embodiment, when the electrolyte comprises a lithium salt, the total lithium content of the composition is approximately equal to the X$^-$ content of the composition. In one embodiment, the only source of lithium in the solution, and the only source of X$^-$ in the composition, is the lithium electrolyte having the formula Li$^+$X$^-$. In some embodiments, the reaction between $CO_2$, the organic semiconductor, and the Li$^+$ in solution causes some of the Li$^+$ cations to associate with formed CO$_3^{2-}$ species, thereby forming Li$_2$CO$_3$ and [organic semiconductor]$^{(n+\cdot)}$[X]$_n$ species. In one embodiment, the same reaction/effect is observed for Na$^+$X$^-$ electrolytes or M$^{(n+)}$X$_n^-$ electrolytes.

In one embodiment, the step of removing precipitate (disclosed elsewhere herein) causes in part a depletion of the Li or Na (or M$^{(n+)}$) content of the material relative to the X$^-$ content, such as by removing any formed metal carbonate salts. In some embodiments, the metal carbonate salt is removed, but the [organic semiconductor]$^{(n+\cdot)}$[X]$_n$ species remains in solution, thereby causing the ratio of Li$^+$ (or Na$^+$) to X$^-$ in the resulting material to drop below unity. In one embodiment, the ratio of Li$^+$ (or Na$^+$) to X$^-$ is less than 1.00, less than about 0.95, less than about 0.90, less than about 0.85, less than about 0.80, less than about 0.75, less than about 0.70, less than about 0.65, less than about 0.60, less than about 0.55, less than about 0.50, less than about 0.45, less than about 0.40, less than about 0.35, less than about 0.30, less than about 0.25, less than about 0.20, less than about 0.15, less than about 0.10, or less than about 0.05.

Devices of the Invention

In one aspect, the present invention relates in part to a photovoltaic device comprising any composition described herein. In one embodiment, the composition may be in a hole transporting layer of the device.

As disclosed herein, the various compositions or molecules produced using the methods described herein may be provided within a solar cell or photovoltaic (PV) cell. As supported by the Example section below, the various compositions or molecules for an PV cell disclosed herein may be advantageous in providing one or more improvements over conventionally known PV cells. In one embodiment, the device further comprises an encapsulation layer to prevent degradation.

In one embodiment, the device is deposited on a substrate.

Although devices may be described herein for use in PV cells, it is understood that devices, layer configurations, and methods of the present disclosure may also be used in a variety of other optoelectronic devices, including but not limited to charge coupled devices (CCDs), photosensors, light emitting diodes (LEDs) organic light emitting diodes (OLEDs), thermoelectric devices, or any other suitable device.

EXPERIMENTAL EXAMPLES

The invention is now described with reference to the following Examples. These Examples are provided for the purpose of illustration only, and the invention is not limited to these Examples, but rather encompasses all variations that are evident as a result of the teachings provided herein.

The present invention is based in part on the unexpected discovery that bubbling a solution including a semiconductor (herein, spiro-OMeTAD) and a metal salt (herein, LiTFSI) with $CO_2$ under light (herein, UV light) which has a shorter wavelength or a larger energy than the band gap (energy gap between the highest occupied molecular orbital level and the lowest unoccupied molecular orbital level) of a semiconductor promotes p-doping of the semiconductor in the solution and improves conductivity of the resulting film.

Example 1: $CO_2$-Treated Spiro-OMeTAD:LiTFSI Solutions

Described herein is a fast and reproducible doping method by bubbling a spiro-OMeTAD:LiTFSI solution with $CO_2$ under UV light. This new approach promptly promotes p-type doping of spiro-OMeTAD as $CO_2$ steals electrons from the photoexcited semiconductor, precipitating carbonates. The $CO_2$-treated interlayer exhibits ~100 times higher conductivity than a pristine film while realizing stable, high-efficiency perovskite solar cells without any further post-treatments. This doping method can be extended beyond small molecules and can also be applied to π-conjugated polymers.

Materials and Methods

Chemical reagents: Perovskite precursor compounds [formamidinium iodide (FAI) (Greatcell Solar Ltd), methylammonium bromide (MABr) (Greatcell Solar Ltd), cesium iodide (CsI) (99.999%, Sigma-Aldrich), lead iodide ($PbI_2$) (99.99%, trace metals basis, TCI Chemicals), lead bromide ($PbBr_2$) (98%, Sigma-Aldrich)], materials for charge transporting layers [$TiCl_4$ (99.9%, Sigma-Aldrich), KOH (ACS reagent, ≥85%, pellets, Sigma-Aldrich), Spiro-OMeTAD (99%, Sigma-Aldrich), P3HT ($M_w$=50-70K, Rieke Metals), PBDB-T ($M_w$≥70K, Brilliant Matters), PTAA ($M_n$=7-10K, Sigma-Aldrich), MEH-PPV ($M_w$>100K, Lumtec), bis(trifluoromethane)sulfonimide lithium salt (99.95% trace metals basis, Sigma-Aldrich)], and solvents [N,N-dimethylformamide (DMF) (anhydrous, 99.8%, Sigma-Aldrich), Dimethyl sulfoxide (DMSO) (99+%, Alfa Aesar), chlorobenzene (CB) (anhydrous, 99.8%, Sigma-Aldrich), chloroform (≥99.5%, Sigma-Aldrich), benzyl alcohol (anhydrous, 99.8%, Sigma-Aldrich), diethyl ether (anhydrous, ≥99.7%, Sigma-Aldrich), acetonitrile (anhydrous, 99.8%, Sigma-Aldrich), 4-tert-butylpyridine (98%, Sigma-Aldrich), methanol (AmericanBio), ethanol (Macron), acetone (Decon), hexane (Sigma-Aldrich)] were purchased from chemical vendors and were used as received without further purifications.

Synthesis of chlorine-capped $TiO_2$ nanocrystals: Chlorine-capped $TiO_2$ (Cl—$TiO_2$) nanocrystals for the electron transporting layer were obtained using previously-reported procedures (Tan, H. R. et al. Science 2017, 355, 722-726). Briefly, 4 mL of $TiCl_4$ was slowly injected into 16 mL of cold anhydrous ethanol, and a yellow solution was obtained. 80 mL of anhydrous benzyl alcohol was added in the solution, and the mixture was stirred for 10 min. After the addition of benzyl alcohol, the solution color turned reddish. The mixed solution was then transferred to an oven and stored at 85° C. for 12 hours. To get $TiO_2$ nanocrystals precipitated in the solution, diethyl ether was added. $TiO_2$ nanocrystals were collected by centrifugation at 5000 rpm for 2 min. The collected $TiO_2$ nanocrystals were subsequently washed by anhydrous ethanol and diethyl ether and dried under vacuum for 12 hours. To obtain Cl—$TiO_2$ colloidal solution (~5 mg/mL), the dried $TiO_2$ nanocrystal powder was put in a solvent mixture of anhydrous chloroform and anhydrous methanol (1:1 volume ratio) and the dispersion solution was sonicated for 2 hours before use.

Preparation of organic semiconductor solutions: To prepare a spiro-OMeTAD:LiTFSI solution, 65 mg of spiro-OMeTAD was dissolved in 1 mL of chlorobenzene (CB), and 20 μL of 4-tert-butylpyridine (tBP) and 70 μL of LiTFSI solution (170 mg of LiTFSI in 1 mL of acetonitrile) were added into the spiro-OMeTAD solution. For MPPT, a thicker solution of spiro-OMeTAD:LiTFSI was prepared to match the concentration of co-doped spiro-OMeTAD solution. Briefly, 100 mg of spiro-OMeTAD was dissolved in 1.1 mL of CB, and 40 μL of LiTFSI solution (574 mg of LiTFSI in 1 mL of acetonitrile) and 35 μL of tBP were added in the neat spiro-OMeTAD solution. For the $CO_2$ doping process, spiro-OMeTAD:LiTFSI solution was prepared with a marginal amount of tBP (5 uL) since tBP tends to reduce the oxidized spiro-OMeTAD. Thus, the rest of tBP (30 uL) was added after the $CO_2$ doping process was finished. For a co-doped spiro-OMeTAD solution, FK209 Co(III)TFSI was added as an additional metal salt together with the primary metal salt, LiTFSI. Briefly, 100 mg of spiro-OMeTAD was dissolved in 1.1 mL of CB. In the neat spiro-OMeTAD solution, 23 μL of LiTFSI solution (540 mg of LiTFSI in 1 mL of acetonitrile), 10 μL of FK 209 Co(III)TFSI solution (376 mg of FK 209 Co(III)TFSI in 1 mL of acetonitrile), and 39 μL of tBP were added (Kim, G. et al. Sol Rrl 2020, 4). To prepare the polymer solutions, a slightly modified PTAA solution preparation was used (Lee, J. et al. A Adv Energy Mater 2017, 7), with the same tBP and LiTFSI solution that had been used for the spiro-OMeTAD solution preparation. For instance, 20 mg of P3HT was dissolved in 1 mL of CB, and 7.5 μL of tBP and 15 μL of LiTFSI solution (170 mg of LiTFSI in 1 mL of acetonitrile) were added into the polymer solution. For the PBDB-T solution, 10 mg of PBDB-T in 1 mL of CB was added. In the polymer solution, 3.3 μL of tBP and 7.5 μL of LiTFSI solution were added. To prepare the PTAA solution, 10 mg of PTAA was dissolved in 1 mL of chloroform (CF), and 3.3 μL of tBP and 7.5 μL of LiTFSI solution were added into the polymer solution. For the MEH-PPV solution, 5 mg of MEH-PPV in 1 mL of toluene were added, and 1.6 μL of tBP and 3.3 μL of LiTFSI solution were added in the solution. All solutions were prepared in a nitrogen-filled glove box, and were kept in the glove box until the $CO_2$ bubbling process was performed.

Gas bubbling and filtration: Two syringe needles were inserted into the vial through a PTFE/silicone septum, with one syringe needle used as a gas inlet connected to a $CO_2$ (or $O_2$) gas cylinder, and the other syringe needle used as the outlet. The bubbling rate was ~2 mL/s. While the solution was bubbled with $CO_2$, a UV flashlight (UV301D, Max. 3000 mW, 365 nm) was used to illuminate the solution for 1 minute. No changes in volume or concentration were observed after the bubbling process. The gas-bubbled solutions were filtered with PTFE hydrophobic filters (pore size≈0.22 μm), and the filtered solutions were used for hole transporting layers (HTLs). No filter was used for polymer solutions. Thicker spiro-OMeTAD:LiTFSI solutions (such as 100 mg of spiro-OMeTAD in 1.1 mL of CB) require extra UV exposure and a stabilization step. For example, after the 1-minute $CO_2$ bubbling, the solution was kept under UV light for 30 minutes further, and stored in $N_2$-filled glove box for at least 6 hours or more before use. The remaining tBP (30 uL/mL) was added in the stock solution and the final solution was filtered before use.

GC-FID measurement: The gas mixture in the headspace was analyzed by gas chromatography (SRI 8610C, Multiple Gas Analyzer #1) equipped with a flame ionization detector (FID) via syringe injection (250 μL). Ultrahigh-purity Ar (99.999%) was used as the carrier gas.

Collection of lithium carbonate: Bubbling spiro-OMeTAD:LiTFSI solution with $CO_2$ mainly produces two reaction products, namely oxidized spiro-OMeTAD and lithium carbonate ($Li_2CO_3$). The oxidized spiro-OMeTAD can be re-dissolved in the chlorobenzene-based reaction solution after $CO_2$ bubbling, but $Li_2CO_3$ is precipitated in the solution since the metal carbonate is insoluble in chlorobenzene. To collect $Li_2CO_3$ from the solution after the $CO_2$ bubbling process, the resulting solution was filtered with a PTFE hydrophobic filter (0.22 μm pore). The collected precipitate was rinsed with chlorobenzene and acetonitrile 3 times. The filter catching the precipitate was placed under vacuum for 12 hours to remove up residual solvents, and a white powder was collected by scratching the filter surface. The collected powder was stored in an Ar glove box until the TGA-MS measurement was performed.

Collection of $CO_2$-doped spiro-OMeTAD powder: After the $CO_2$ bubbling and filtration, the filtered solution can be directly spin-coated on the perovskite layer for HTL formation. Otherwise, the reaction product can be collected as a solid powder to facilitate handling and storage for a longer time. For better precipitate collection, the solution as changed from chlorobenzene to chloroform. The solution preparation procedure is the same except the solvent unless otherwise noted. Briefly, 65 mg of spiro-OMeTAD is dissolved in chloroform, and 20 μL of tBP and 70 μL of LiTFSI solution (170 mg of LiTFSI in 1 mL of acetonitrile) were added in the chloroform-based solution. The spiro-OMeTAD:LiTFSI solution was bubbled with $CO_2$ under UV light illumination for 1 minute. The resulting solution was filtered using a filter with pore size of 0.22 μm and the filtered solution was slowly dripped into a 100 mL bath of hexane. A dark brown solid powder immediately precipitated in the bath. The powder-dispersed solution was centrifuged two times with fresh hexane and the sediment was collected (FIG. S19). The collected dark brown powder was dried in a vacuum oven for 30 minutes and the dried powder was stored in an Ar glove box. This powder can be directly used as a hole transporting material, or can be used as a dopant for neutral spiro-OMeTAD, such as a 1:1 mixture. This approach is similar to the doping approach using AgTFSI, but does not produce potentially detrimental hygroscopic substances such as silver halides (e.g., AgI) from a residue AgTFSI in the HTL.

TGA-MS measurement: A Discovery TGA (TA Instruments) was used to measure mass change of samples as they were heated from room temperature to 1000° C. at a heating rate of 10° C./min under argon or air atmosphere. TGA data acquisition and evaluation, as well as instrument control, were carried out using the TRIOS software package. The evolved gases were analyzed with a Discovery TGA coupled to the Discovery MS by means of a stainless-steel transfer line which was kept at a constant temperature of 300° C. to avoid gas condensation in a capillary. Data acquisition was done by the mass spectrometer software Processes Eye triggered by the TGA system.

Planar perovskite solar cell fabrication: Pre-patterned indium tin oxide (ITO) coated glass substrates were cleaned using Di-water, acetone, and isopropanol, sequentially. Electron transport layers (ETLs) were deposited on the cleaned ITO substrates by spin casting a $Cl-TiO_2$ solution at the rate of 3000 rpm for 20 sec. The $Cl-TiO_2$-coated substrates were annealed on a hot plate at 150° C. for 30 min in air. The $Cl-TiO_2$-coated substrates were rinsed with a KOH solution (0.01M in DI water) and dried at 100° C. for 5 min. After drying, the substrates were transferred into a nitrogen-filled glovebox to deposit perovskite layers and HTLs. The $Cs_{0.05}FA_{0.81}MA_{0.14}PbI_{2.55}Br_{0.45}$ precursor solution (1.2 M) was prepared in the solvent mixture of DMF (800 μL) and DMSO (200 μL). One-step spin coating procedure was applied for the perovskite layer formation. While a perovskite solution was spin-coated on an ETL-coated substrate, 150 μL of CB was dripped 5 sec before the end of spinning procedure (4000 rpm, 20 s). After coating the perovskite layer, the substrate was put on the hotplate preheated at 100° C. for 10 min. After cooling down the substrate to room temperature, hole transporting material (HTM) solutions were spin-coated on dried perovskite layers. For spiro-OMeTAD-based HTLs, pristine and doped solutions were spin-coated at 3500 rpm for 40 sec. For polymer-based HTLs, the polymer solutions were spin-coated at 1000 rpm for 40 sec. After HTL deposition, gold (~50 nm) was deposited using a thermal evaporator (Angstrom Engineering) to form top contacts.

Solar cell J-V characteristics: The current density-voltage (J-V) characteristics were measured using a Keithley 2400 SMU under one AM1.5G sun irradiance (100 mW cm$^{-2}$), where 100 W Xenon arc lamp was used with no UV cutoff filter, calibrated by a Newport reference solar cell. The J-V measurements were carried out in a nitrogen-filled glove box with a scanning rate of 250 mV s$^{-1}$ (voltage step: 100 mV, delay time: 200 ms). The active area of a solar cell is 1.8 mm$^2$ that is defined by a shadow mask during the metal deposition. No further masking was applied.

Capacitance-voltage characterization: For the Mott-Schottky analysis, the capacitance of the solar cells was measured over the applied voltages from 0 V to 1 V at a frequency of 1 kHz with a small AC perturbation of 20 mV. From the slopes of the curve onsets, surface defect densities were calculated (Almora, Appl Phys Lett 2016, 109).

Conductivity measurement: For conductivity measurements, silicon substrates were patterned with platinum inter-digitated electrodes (IDEs) fabricated at the NYU Tandon Nanofab Cleanroom on 100 cm silicon wafer (University-Wafer) with a 250 nm thermally grown oxide layer. A 20 nm titanium adhesion layer, followed by a 200 nm platinum layer was deposited in a Kurt Lesker physical vapor deposition chamber. Electrode features were patterned with AZ 5214 E photoresist (Microchemicals GmbH) and SUSS Microtec MA 6 Contact Aligner followed by ion beam etching (IntlVac Nanoquest II). After patterning, wafers were diced into 1 cm$^2$ square dices with a Disco DAD3320 dicing saw. For spiro-OMeTAD samples, the IDE utilized has 39 pairs of fingers with 3000 μm length, 100 μm width, and 10 μm spacing. For polymer samples, IDEs with wider spacing were used, where 39 pairs of fingers with 3000 μm length, 5 μm width, and 100 μm spacing were deposited on the chips. On the patterned substrates, hole-transporting materials were spin-coated at the same spinning rates as those used in the fabrication of solar cells in a nitrogen-filled glovebox. The conductivity measurement was conducted with a Bio-Logic VSP potentiostat by applying a voltage from −1 to +1 V. The conductivity of the HTMs was calculated according to a reported equation (Snow, A. W., et al., Langmuir 1986, 2, 513-519): $\sigma = I/V \, d/(2n-1)lh$ where I is the current, V is the voltage, d is the spacing between adjacent electrodes, n is the number of finger pairs, l is the length of the inter-digitated fingers, and h is the film thickness.

UV-Vis-NIR absorption measurement: UV-vis-NIR spectra were measured with Cary 5000 UV-Vis-NIR.

Steady-state photoluminescence (PL) measurement: Fluorescence was measured on a Photon Technology International QuantaMaster4 Fluorometer (Horiba, Kyoto, Japan). The excitation wavelengths were set at maximum absorption peaks of spiro-OMeTAD and polymers, and the emission spectra were monitored at around their maximum photoluminescence, respectively.

X-ray photoelectron spectroscopy (XPS) measurement: The collected precipitate powder was pressed onto a tape and was placed in the XPS. The XPS spectra were collected using monochromatic 1486.7 eV Al Kα X-ray source on PHI VersaProbe II X-ray Photoelectron Spectrometer with a 0.47 eV system resolution. The energy scale was calibrated using Cu 2p3/2 (932.67 eV) and Au 4f7/2 (84.00 eV) peaks on a clean copper plate and a clean gold foil.

Figure 40:
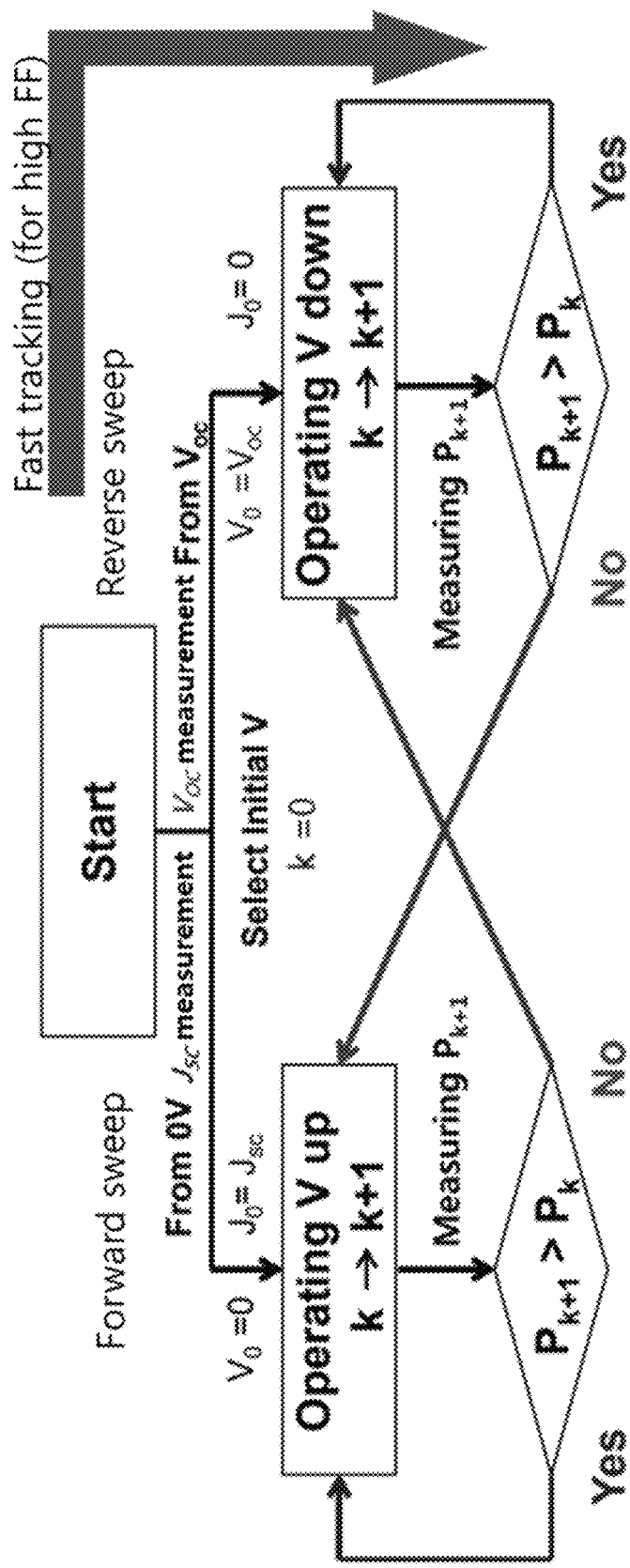
FIG. 40 depicts a logic diagram of a perturb and observe (P&O) method for MPP tracking of the devices.

Maximum power point (MPP) tracking: To track MPP, a program was written based on the perturb and observe (P&O) method. The logic diagram is shown in FIG. 40. To facilitate a rapid MPP tracking, the program starts from the open-circuit voltage ($V_{OC}$) and the applied voltage bias is lowered until the voltage reaches MPP. Once it reaches the voltage for MPP, the applied bias is perturbed with a voltage deviation of 0.01 V and the maximum power points are collected every 350 ms. A Keithley 2400 SMU was used to apply a voltage bias and to track the MPP. For the duration of the experiment, continuous light (1,000 W m$^{-2}$, AM1.5G) with no UV cutoff filter illuminated a solar cell without a temperature controller. Raw data including spikes that might originate from a lamp power instability was presented.

Time-of-flight secondary ion mass spectrometry (TOF-SIMS): TOF-SIMS (Physical Electronics NanoTOF) was used to obtain 2D ion maps and depth profiles of samples. 2D ion mapping for spiro-OMeTAD:LiTFSI composite films was conducted by using a 30 kV Bi+ liquid metal ion gun (LMIG) and analyzing positive secondary ions across 500 μm×500 μm area. The depth profiles of ions of interest were measured by sputtering perovskite solar cells using 3 kV Ar gas gun (500 nA current, rastered over 1000 μm×1000 μm area) followed by probing the composition of the rastered surface by using a 30 kV Bi+ liquid metal ion gun (LMIG) and analyzing positive secondary ions across 50 μm×50 μm area. For each sputter-probe cycle, samples were sputtered for 5 seconds.

Computation: Computational investigations were performed using the Ab-initio Quantum Chemistry calculation method implemented by the Gaussian 16 simulation package (Gaussian 16 Rev. C.01, Wallingford, C T, 2016) with PM6 semi-empirical method for initial screening and B3LYP level/6-311+G(d,p) basis set for geometry optimization. Maximally 3×(number of atoms−1) structures were generated by the Monte Carlo sampling method for initial screening, and the Packmol open source package (Martinez, J Comput Chem 2009, 30, 2157-2164) was used to find the initial configuration of the molecule clusters (Kim, D. Y. et al. J Power Sources 2019, 418, 74-83).

Results and Discussion

Figure 3:
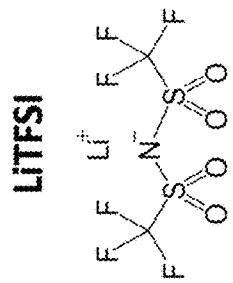
FIG. 3 depicts the molecular structures of spiro-OMeTAD and LiTFSI.
Figure 3:
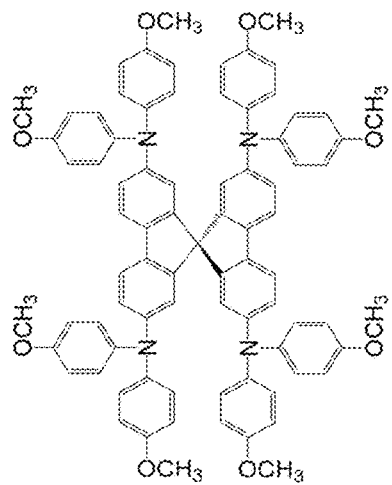
Figure 2:
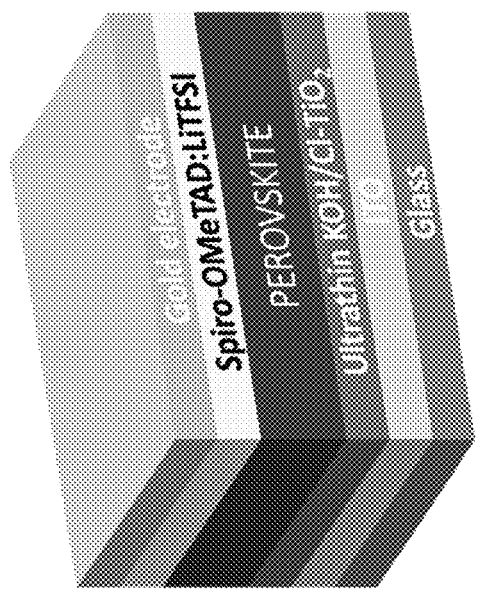
FIG. 2 is a schematic of an exemplary conventional perovskite solar cell device structure comprising a transparent conductive oxide (TCO), an electron conducting interlayer, the active layer comprised of a semiconducting material with a perovskite structure, a hole conducting interlayer, and a top metal contact. Indium tin oxide (ITO) is depicted as an exemplary TCO. The exemplary electron conducting interlayer consists of a chlorinated $TiO_2$ (Cl—$TiO_2$) and an ultrathin KOH. The exemplary perovskite composition is $Cs_{0.05}FA_{0.81}MA_{0.14}PbI_{2.55}Br_{0.45}$. For the hole conducting interlayer, spiro-OMeTAD mixed with a metal, salt such as LiTFSI was used. Gold was used for the top metal contact.

In a conventional perovskite solar cell structure, the active perovskite layer is sandwiched between electron and hole transporting layers (ETLs and HTLs) that are essential for charge selectivity (FIG. 2). For the HTL, spiro-OMeTAD paired with LiTFSI is typically used (FIG. 3). LiTFSI is employed as a co-dopant and as a radical cation stabilizer (Cappel, et al., Nano Lett 2012, 12, 4925-4931), but the actual doping process is typically initiated by exposing the spiro-OMeTAD:LiTFSI film to air and light. Oxygen ($O_2$), the actual dopant, oxidizes the spiro-OMeTAD film while LiTFSI mediates the reaction between $O_2$ and the spiro-OMeTAD under illumination, producing a TFSI-stabilized radical cation along with lithium oxides (Abate, A. et al. Phys Chem Chem Phys 2013, 15, 2572-2579):

Spiro-OMeTAD+$O_2$↔Spiro-OMeTAD$^{·+}$$O_2^{·-}$, and         (i)

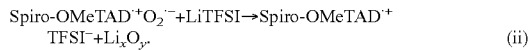
Spiro-OMeTAD$^{·+}$$O_2^{·-}$+LiTFSI→Spiro-OMeTAD$^{·+}$ TFSI$^-$+Li$_x$O$_y$.         (ii)

The perovskite active layer can also mediate the reaction in air under illumination (Wang, S., et al., Acs Appl Mater Inter 2015, 7, 24791-24798). During the reactions, doubly oxidized spiro-OMeTAD species can also occur, which act as a dopant to neutral spiro-OMeTAD, producing two singly oxidized spiro-OMeTAD molecules (Nguyen, W. H., et al., J Am Chem Soc 2014, 136, 10996-11001). These conventional oxidation processes however rely on very slow $O_2$ ingress and diffusion into the spiro-OMeTAD:LiTFSI blend film, which is time consuming (usually several hours to a day) and is largely dependent on ambient conditions. Furthermore, these processes could leave unreacted reactants and/or detrimental byproducts behind in the doped spiro-OMeTAD layer (Tan, B. et al. Adv Energy Mater, 2019, 9, 1901519; Boyd, C. C., et al., Chem Rev 2019, 119, 3418-3451).

Figure 4:
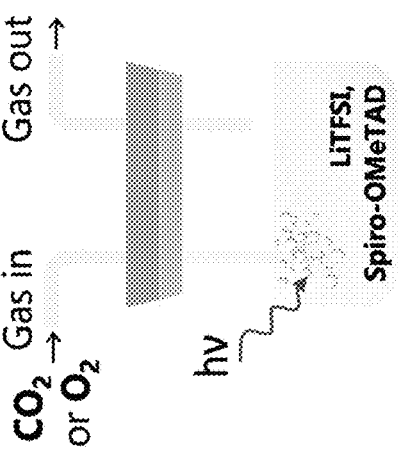
FIG. 4 is a schematic of an exemplary gas bubbling process: While 02 or C02 gas is blown into a spiro-OMeTAD:LiTFSI blend solution, UV light is shone into the solution. The processing time is 1 minute.
Figure 5:
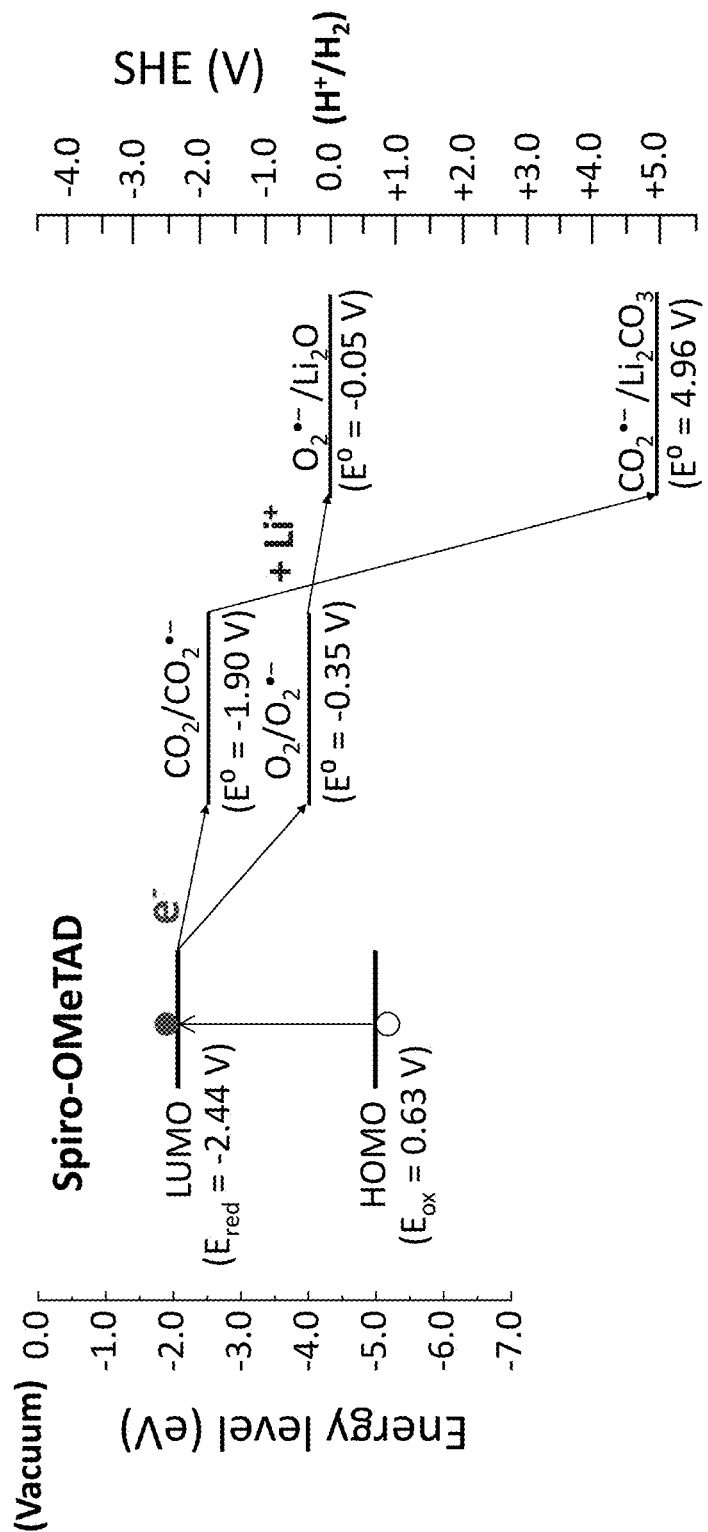
FIG. 5 is an energy band diagram of spiro-OMeTAD and gas reduction potentials of 02 and $CO_2$. Reduced or negatively charged gases will react with lithium ions, producing lithium oxide and carbonate. The HOMO level (−5.13 eV) of spiro-OMeTAD was estimated from the equation $E_{HOMO}=-(E_{ox}+4.5 eV)$, where the vacuum level (E=0 eV) is equivalent to −4.5 V vs SHE. The LUMO level (−2.06 eV) was estimated by adding the HOMO level and optical band gap ($E_{gap}$).
Figure 7:
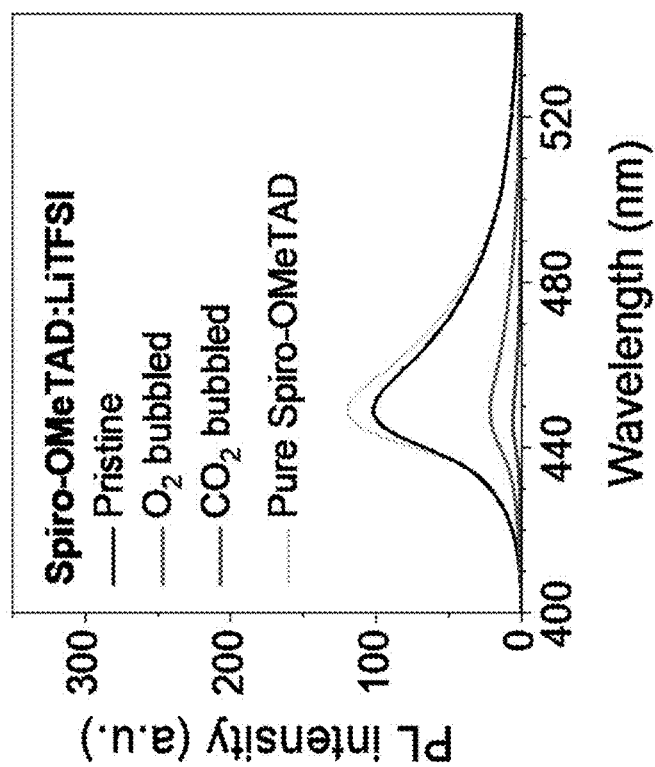
FIG. 7 shows the photoluminescence (PL) spectrum of a pure spiro-OMeTAD solution and spectra of an exemplary spiro-OMeTAD:LiTFSI blend solution. PL quenching is an indication of successful doping.
Figure 6:
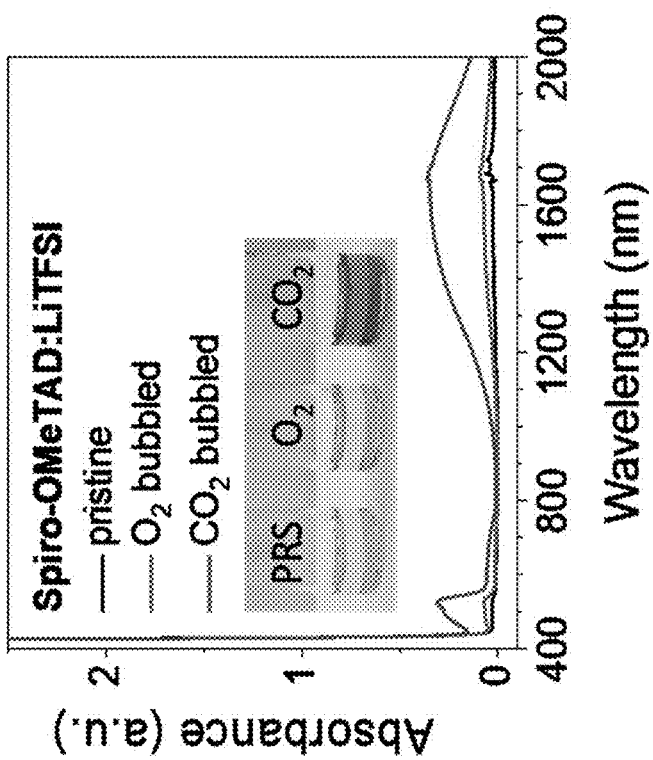
FIG. 6 shows the UV-Vis-NIR absorption spectra of pristine, $O_2$-bubbled, and exemplary $CO_2$-bubbled spiro-OMeTAD:LiTFSI solutions. The solvent is composed of chlorobenzene (91.8%), acetonitrile (6.4%), and 4-tert-Butylpyridine (1.8%). The formation of polaron peaks is an indication of successful doping. Inset shows photograph of the solutions.

To avoid this post-processing exposure, a method has been developed to pre-dope the spiro-OMeTAD molecules by bubbling the spiro-OMeTAD:LiTFSI blend solution with $O_2$ or carbon dioxide ($CO_2$). The duration for bubbling was set for one minute (FIG. 4). Like $O_2$, $CO_2$ is expected to be a dopant for the pre-doping process since the LUMO level (−2.05 eV) (Bard, A. J. & Faulkner, L. R. Electrochemical Methods: Fundamentals and Applications (Wiley, 2000); Cardona, C. M., et al., Adv Mater 2011, 23, 2367-2371; Xu, B. et al. Chem-Us 2017, 2, 676-687) of spiro-OMeTAD lies above the reduction potential of $CO_2$ to $CO_2^{·-}$ (E°=−1.90 V vs. SHE=−2.54 eV) (Benson, et al., Chem Soc Rev 2009, 38, 89-99; James Speight, P. D. Lange's Handbook of Chemistry, Sixteenth Edition. 16th ed./edn, (McGraw-Hill Education, 2005); M. W. Chase, J. NIST-JANAF Thermochemical Tables, Forth Edition. Journal of Physical and Chemical Reference Data, 1998). (FIG. 5). During the bubbling process, UV light (~365 nm, ~3.4 eV) at energy above the band gap of spiro-OMeTAD (~3 eV) is shone into the solutions to photoexcited spiro-OMeTAD molecules and initiate the doping process. UV-Vis-NIR absorption spectra of the pristine, $O_2$—, and $CO_2$-bubbled spiro-OMeTAD:LiTFSI solutions are shown in FIG. 6. After bubbling the solution with $O_2$, relatively weak absorption peaks centered at ~500 nm and ~1600 nm were observed (FIG. 6). These polaron peaks are known to arise in oxidized spiro-OMeTAD (Cappel, et al., Nano Lett 2012, 12, 4925-4931). Polaron-induced exciton quenching via charge transfer and/or Förster resonance energy transfer is expected (van Reenen, S., et al., Phys Rev B 2014, 89, 205206) and is observed from photoluminescence (PL) data (FIG. 7). Bubbling the solution with $CO_2$ gives rise to similar changes in the absorption and PL spectra of the solution, with even more pronounced absorption peaks (which is also apparent from the change in solution color from pale yellow to dark orange, as shown in the inset of FIG. 6) and even more PL quenching (FIG. 7). Thus, more oxidized spiro-OMeTAD molecules are present in the $CO_2$-bubbled solution as compared to the $O_2$-bubbled solution (Macdiarmid, A. G., et al., Philos T R Soc A 1985, 314, 3-15).

Figure 8:
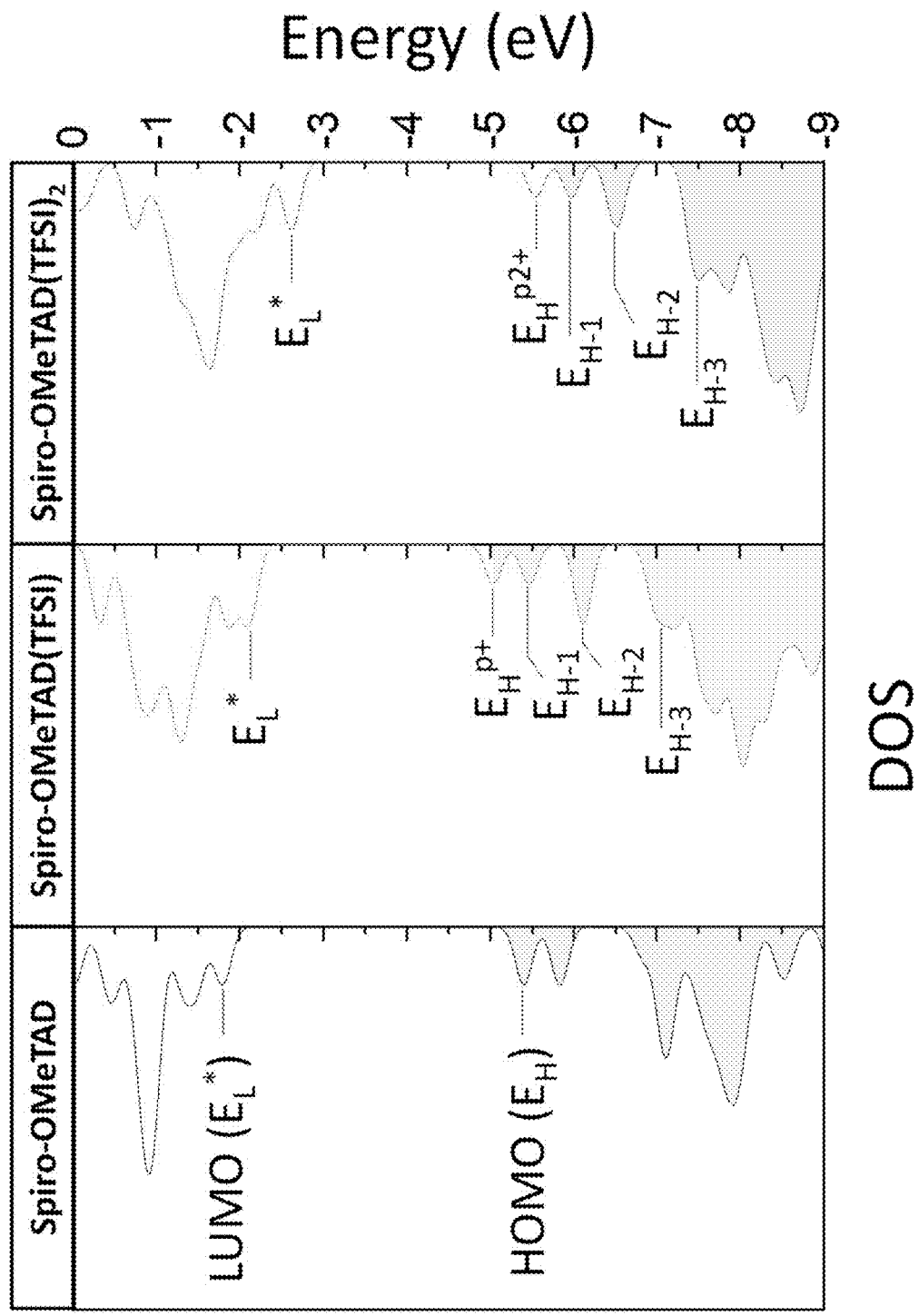
FIG. 8 is a plot of electronic structure calculation results (density of states, DOS) of undoped spiro-OMeTAD and spiro-OMeTAD with oxidation states of either +1 or +2, i.e., spiro-OMeTAD(TFSI) and spiro-OMeTAD(TFSI)$_2$, respectively. Here, the ionization potential (IP=−5.394 eV) of the pristine system was selected as a reference HOMO energy level.
Figure 9:
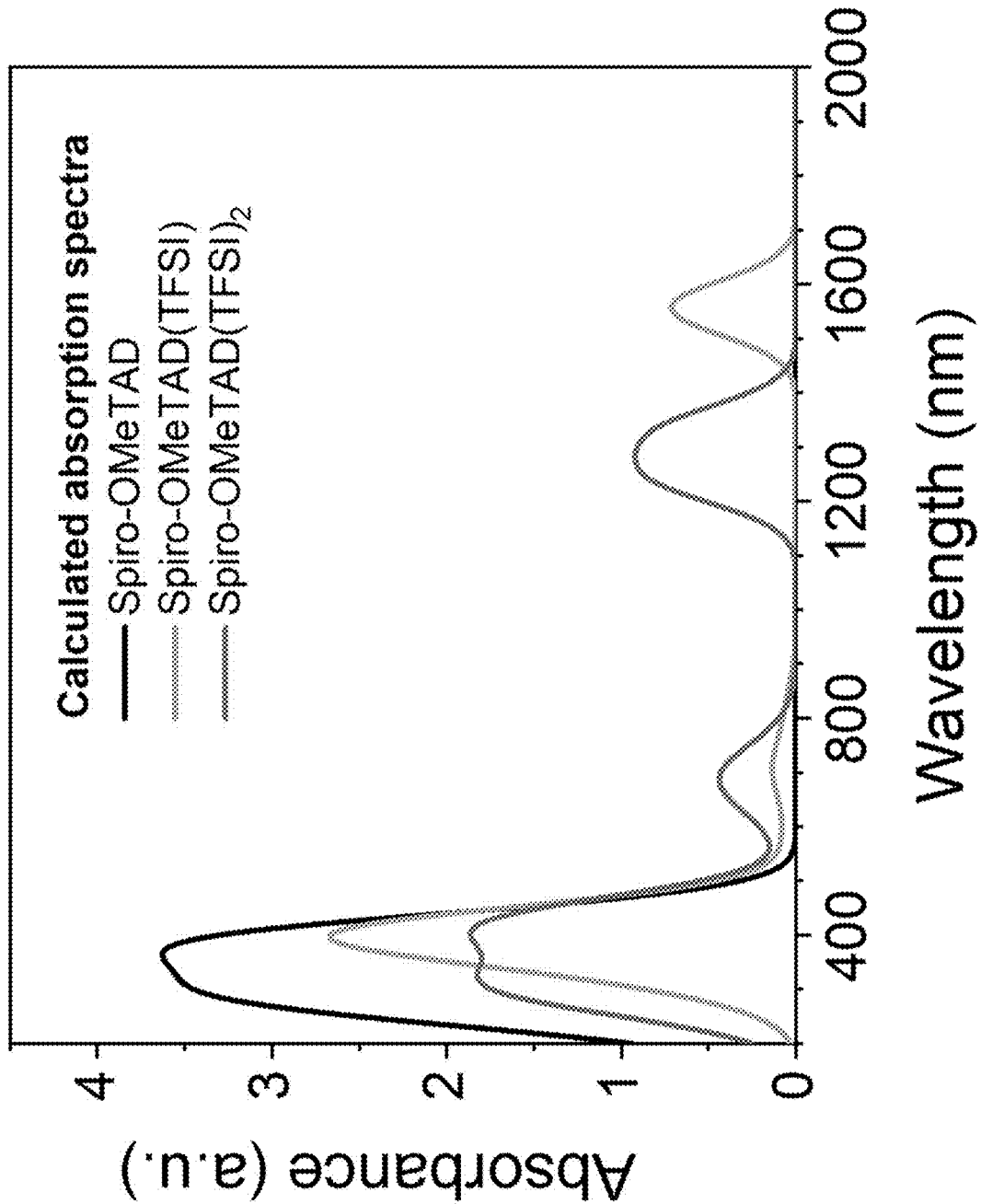
FIG. 9 is a plot of the calculated absorption spectra of the undoped spiro-OMeTAD and exemplary oxidized spiro-OMeTAD salts.

Density functional theory (DFT) calculations suggest that the new peaks observed in the experimental absorption spectra at 500 and 1600 nm are indeed attributed to optical transitions from lower energy levels to either a singly occupied molecular orbital (polaron state, P$^+$) or a fully empty state in the HOMO (polaron state, P$^{2+}$) of the oxidized spiro-OMeTAD (FIGS. 8 and 9). In the calculated absorption spectrum of a pure spiro-OMeTAD, only one prominent peak is found at around 350 nm (FIG. 9) which corresponds to the HOMO ($E_H$)→LUMO ($E_L^*$) transition (FIG. 8). Spiro-OMeTAD, with an oxidation state of +1, has a singly occupied molecular orbital which allows optical transitions from lower levels; the $E_{H-2}$→$E_H^{P+}$ transition is shown to be responsible for the absorption at ~1600 nm and the $E_{H-3}$→$E_H^{P+}$ transition for the absorption at ~700 nm (likely corresponding to the peak observed at 500 nm in the experimental spectrum). Spiro-OMeTAD, with an oxidation state of +2, has a fully empty state in its HOMO and transitions from $E_{H-2}$ to $E_H^{P2+}$ and $E_{H-3}$ to $E_H^{P2+}$ are possible, which are manifested as new absorption peaks at ~1300 nm and ~700 nm, respectively, in the calculated absorption spectrum. Although the absorption peak positions in the measured absorption spectrum of the $CO_2$-bubbled spiro-OMeTAD:LiTFSI solution are slightly different from the calculated spectra, the two new peaks observed in the doped films can be attributed to the newly occurred polarons in the oxidized spiro-OMeTAD.

Figure 10:
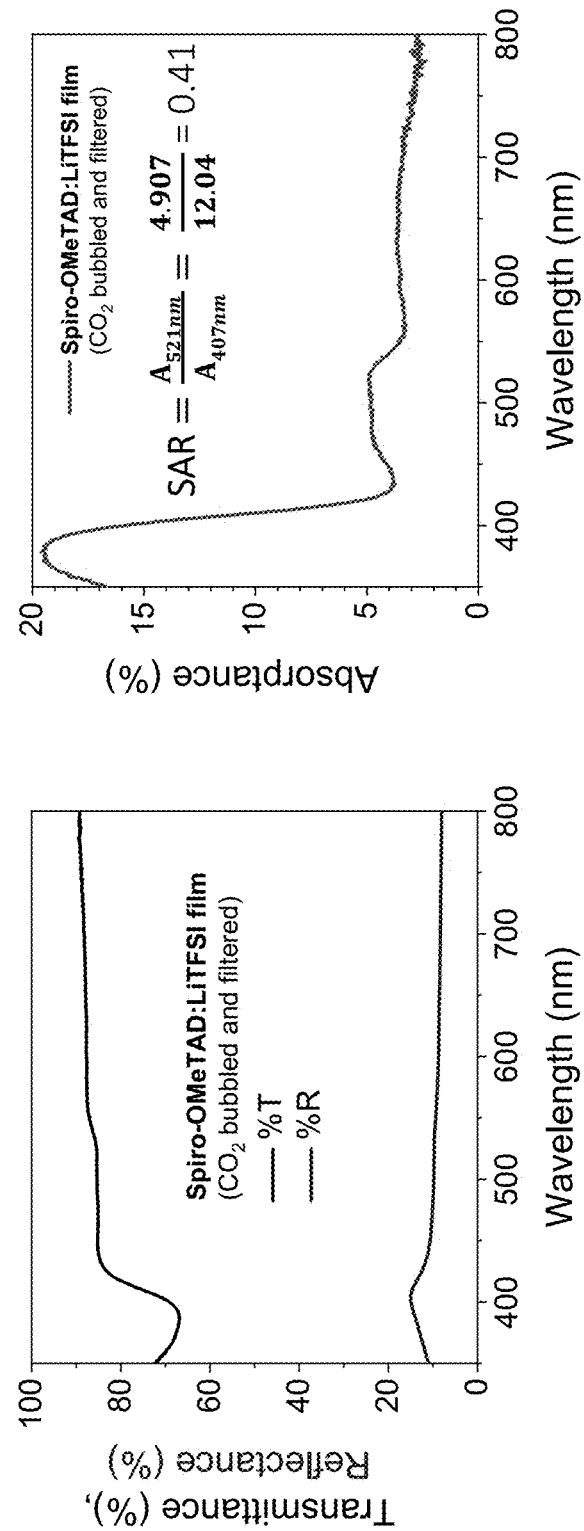
FIG. 10 depicts the spectra of transmittance and reflectance (left), and absorptance (right) for an exemplary spiro-OMeTAD:LiTFSI film processed with $CO_2$ bubbling and filtration. The SAR is calculated from the ratio of absorptance at 521 nm and 407 nm.

Assuming that the $CO_2$-bubbled spiro-OMeTAD solution contains both oxidized forms, i.e., spiro-OMeTAD(TFSI) and spiro-OMeTAD(TFSI)$_2$, the measured absorption spectrum (FIG. 6) may be the result of the superposition of two spectra (FIG. 9). Since doubly oxidized species, Spiro-OMeTAD$^{-2+}$ diradical dications, can oxidize neutral Spiro-OMeTAD molecules, most of the doubly oxidized species will be reduced into singly-oxidized Spiro-OMeTAD$^{-+}$ radical cations, producing two moles of Spiro-OMeTAD$^{-+}$. Based on the protocol suggested by Forward et al (Forward, R. L. et al. Acs Energy Lett 2019, 4, 2547-2551), about 5.7 mol % of spiro-OMeTAD$^{-2+}$ will occur during the $CO_2$-bubbling process (FIG. 10). Calculated from the equilibrium constant (Nguyen, W. H., et al., J Am Chem Soc 2014, 136, 10996-11001), 98.95% of 5.7 mol % spiro-OMeTAD$^{-2+}$ (i.e., 5.64 mol %) eventually will produce a total of 11.27 mol % of spiro-OMeTAD$^{-+}$, leaving 0.06 mol % dications. Thus, the majority of the reaction product will be singly oxidized species and might account for the absorption spectrum of the oxidized spiro-OMeTAD obtained from $CO_2$ bubbling. From the mole fraction calculations, the total doping efficiency is approximately 11.33%, which is equivalent to other reported processes in the literature.

Figure 11:
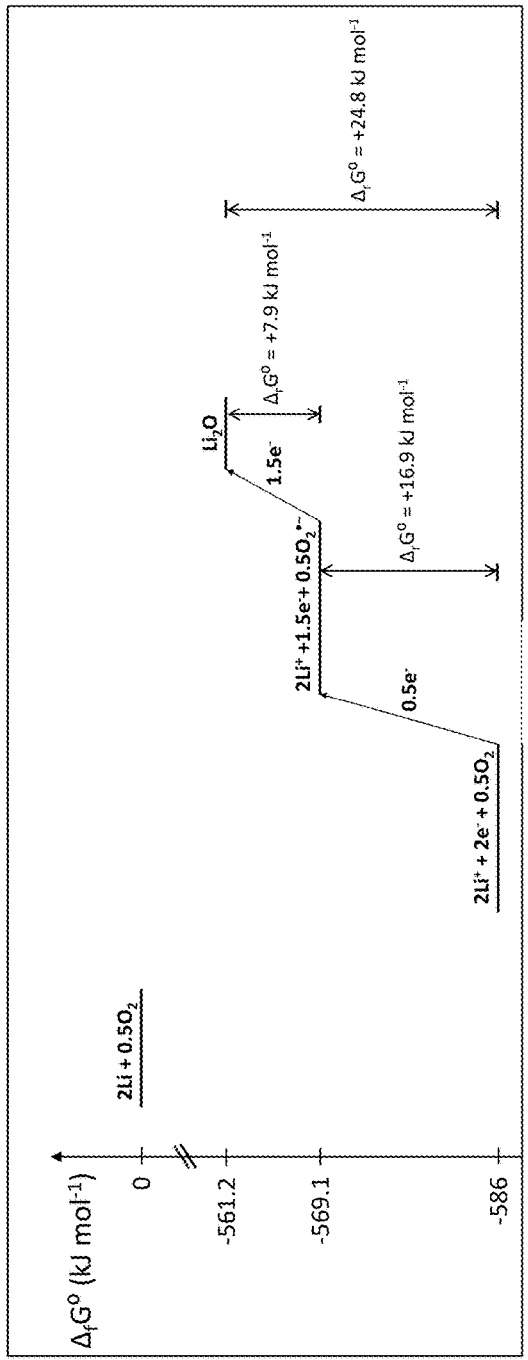
FIG. 11 depicts a possible detailed reaction paths for forming lithium oxide from an 02 bubbling process. Redox potential and Gibbs free energy of each reaction are calculated using values from the thermodynamic database.
Figure 12:
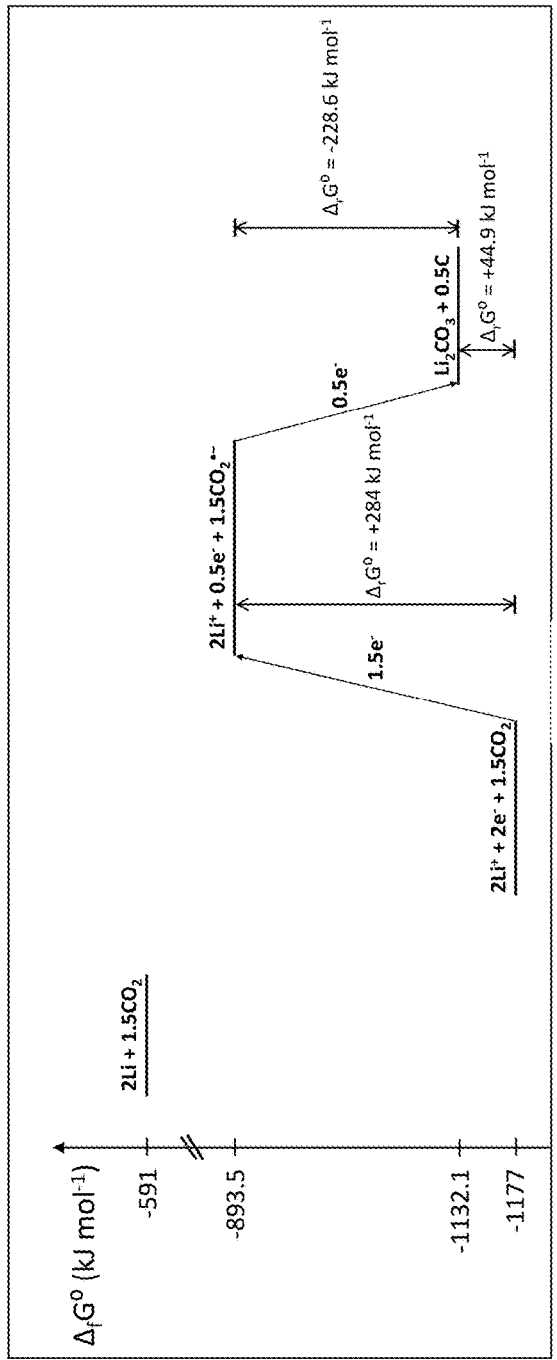
FIG. 12 depicts a possible detailed reaction paths for forming lithium carbonate from the $CO_2$ bubbling process.

The better doping performance of $CO_2$ might be attributed to the fact that the standard mole fraction solubility of $CO_2$ ($9.84 \times 10^{-3}$) in chlorobenzene (CB) at room temperature is an order of magnitude higher than that of $O_2$ ($7.79 \times 10^{-4}$) (Shirono, K., et al., J Chem Eng Data 2008, 53, 1867-1871; Solubility Data Series. Vol. 7, 311, Pergamon Press, 1981; Solubility Data Series. Vol. 50, 257, Pergamon Press, 1992). Since the reaction rate is largely associated with the concentrations of reactants, the amount of gases dissolved in the solution will determine the overall rate. In addition, further reduction of $CO_2^{\cdot-}$ to C is easier than that of superoxide to oxygen anion (Koppenol, W. H. & Rush, J. D. J Phys Chem-Us 1987, 91, 4429-4430), i.e., $CO_2^{\cdot-}$ doping has faster kinetics (FIGS. 11 and 12). Moreover, considering that the potential of $CO_2^{\cdot-}/Li_2CO_3$ is +4.96V, and the HOMO level of a neutral spiro-OMeTAD is at +0.63V (FIG. 5), the $CO_2^{\cdot-}$ radicals can directly oxidize neutral spiro-OMeTAD molecules. This, in combination with $CO_2$ being more soluble in CB, favors the oxidative $CO_2$ reaction.

While the spiro-OMeTAD molecules are being oxidized, the $O_2$ and $CO_2$ gases are reduced. In the $O_2$-bubbled solution, lithium oxides are expected to form after the oxidative reaction as follows (Abate, A. et al. Phys Chem Chem Phys 2013, 15, 2572-2579; Zhu, Z., et al., Angew. Chem. Int. Ed. 2019, 58, 19021; Gittleson, F. S. et al. Chemelectrochem 2015, 2, 1446-1457; Ryu, W. H. et al. Nat Commun 2016, 7):

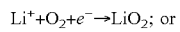

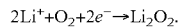

From the $O_2$-bubbled solution, no sediments were found in the solution, and filtering the solution with a 0.22 μm-pore-sized PTFE membrane filter did not yield any measurable precipitate. This might be attributed to less production of $Li_2O_2$ and/or precipitate particles smaller than the filter pores. In the $CO_2$-bubbled solution, lithium carbonates can be generated as follows (Feng, N. N., et al., Adv Energy Mater 2016, 6, 1502303; Xie, J. F., et al., J Mater Chem A 2018, 6, 13952-13958):

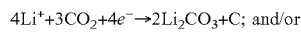

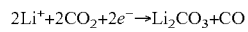

Figure 14:
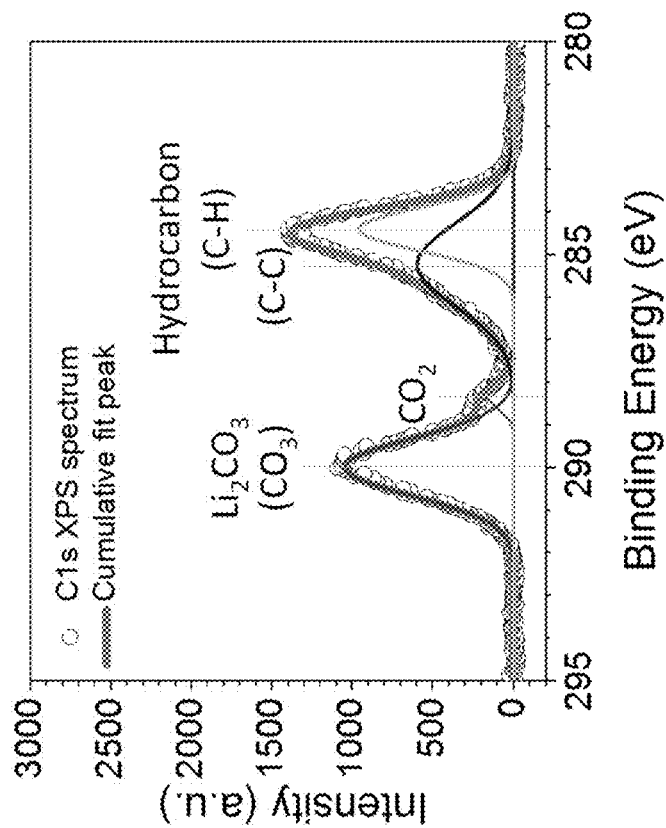
FIG. 14 is the C1s XPS spectrum of the collected precipitate obtained by filtering the $CO_2$-bubbled spiro-OMeTAD:LiTFSI solution.
Figure 13:
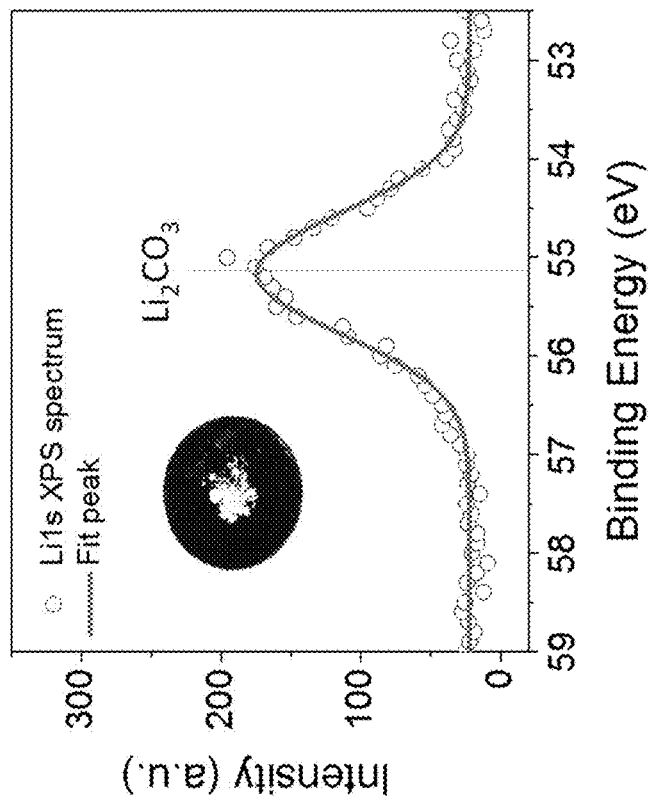
FIG. 13 is the Li1s XPS spectrum of the collected precipitate obtained by filtering the $CO_2$-bubbled spiro-OMeTAD:LiTFSI solution. The white powder precipitate is shown in the inset.
Figure 15:
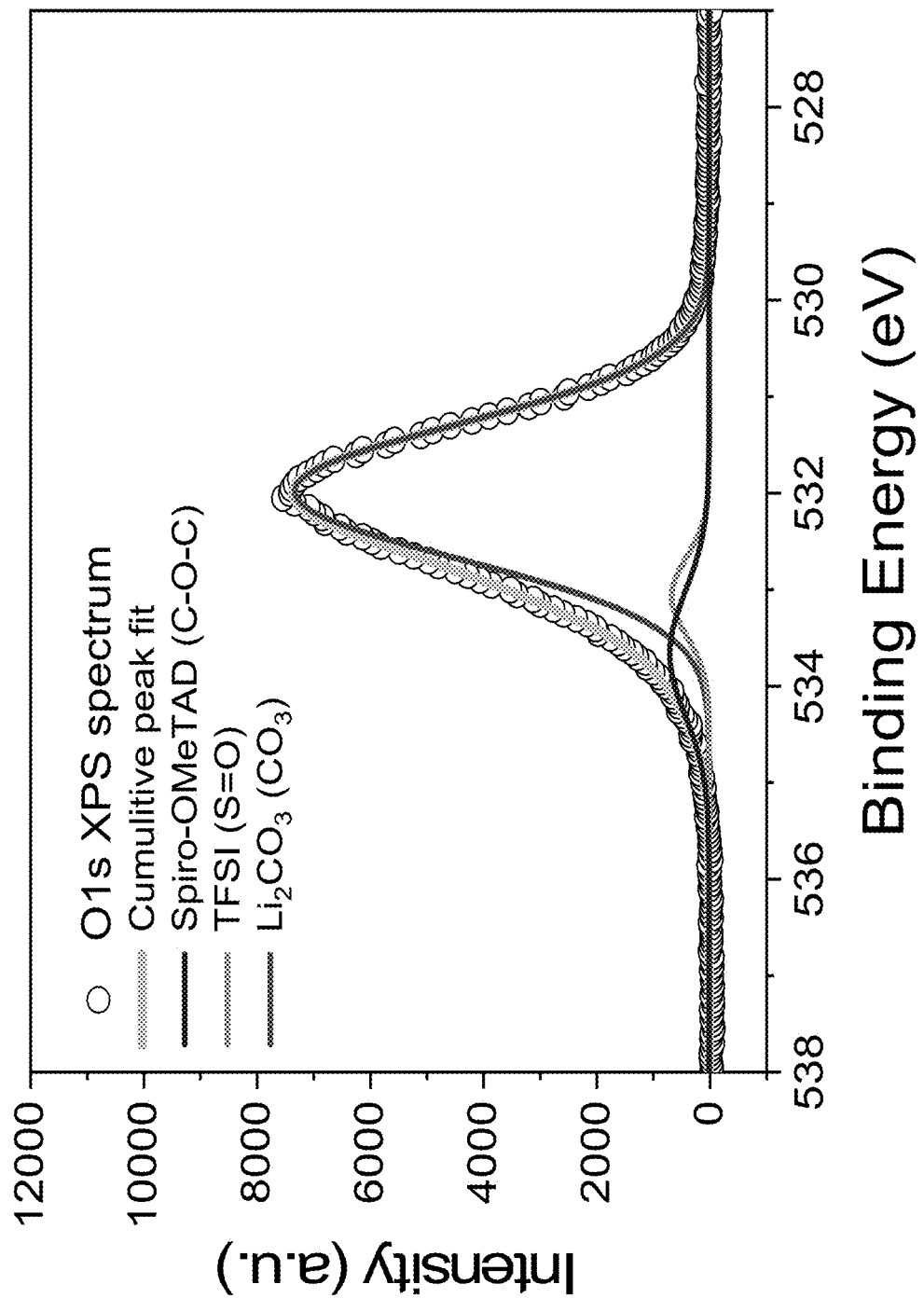
FIG. 15 depicts the XPS O1s regional spectrum for the precipitate collected from $CO_2$-bubbled spiro-OMeTAD:LiTFSI solution.
Figure 16:
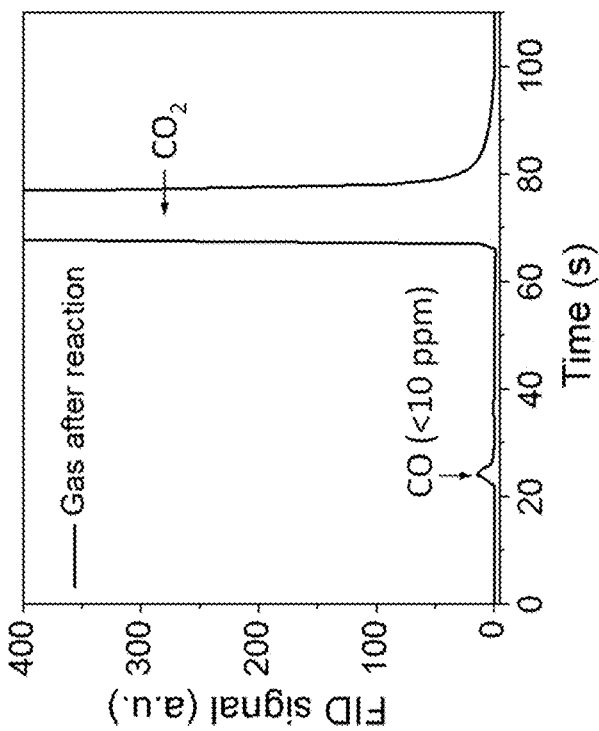
FIG. 16 is a plot of FID data for a gas sample taken from the headspace of the reaction vial. A trace amount of CO gas is found in the gas after the reaction with most of the gas consisting of $CO_2$.

X-ray photoelectron spectroscopy (XPS) demonstrates that the precipitate contains $Li_2CO_3$ (55 eV) as indicated in the Li1s XPS spectrum (FIG. 13). The existence of $Li_2CO_3$ in the precipitate is also confirmed by a carbonate signal ($CO_3$; 290 eV) in the C1s XPS spectrum (FIG. 14) (Edstrom, K., et al., Electrochim Acta 2004, 50, 397-403; Deng, X. Y. et al. Langmuir 2008, 24, 9474-9478). The binding energy found at 228.4 eV is assigned to either chemisorbed $CO_2^{\cdot-}$ (Deng, X. Y. et al. Langmuir 2008, 24, 9474-9478) or physisorbed linear $CO_2$ (Favaro, M. et al. Proc Natl Acad Sci 2017, 114, 6706-6711), originating from an intermediate or incomplete reaction species generated during the $CO_2$-bubbling process or from $CO_2$ in the atmosphere physisorbed during sample preparation. The C—C and C—H peaks at 285.2 eV and 284.4 eV in the C1s XPS spectrum might be attributed to unwashed reactants and/or products such as neutral spiro-OMeTAD and/or oxidized spiro-OMeTAD salts. Although the precipitate was rinsed with chlorobenzene and acetonitrile three times, it is possible that small amounts of reactants/products remain in the rinsed precipitate (FIG. 15). In addition, since the reaction of lithium ions with $CO_2$ radical anions can produce carbon species ($4Li^+ + 3CO_2 + 4e^- \rightarrow 2Li_2CO_3 + C$), C—C and C—H peaks in the C1s XPS spectrum could be due to carbon. Another precipitation reaction exists: $2Li^+ + 2CO_2 + 2e^- \rightarrow Li_2CO_3 + CO$; however, using gas chromatography-flame ionization detector (GC-FID) measurements, only a trace amount of CO (<10 ppm) was detected in the sampling gas after the reaction (FIG. 16). Thus, the main reaction leading to $Li_2CO_3$ formation is likely not due to this reaction path; and even if this reaction occurs, evolved CO gas might react with $Li^+$ ions in the solution, producing $Li_2CO_3$ and C, as follows (Ma, S. Y. et al. Chem Commun 2018, 54, 8072-8075):

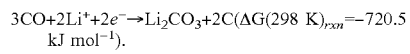

Figure 17:
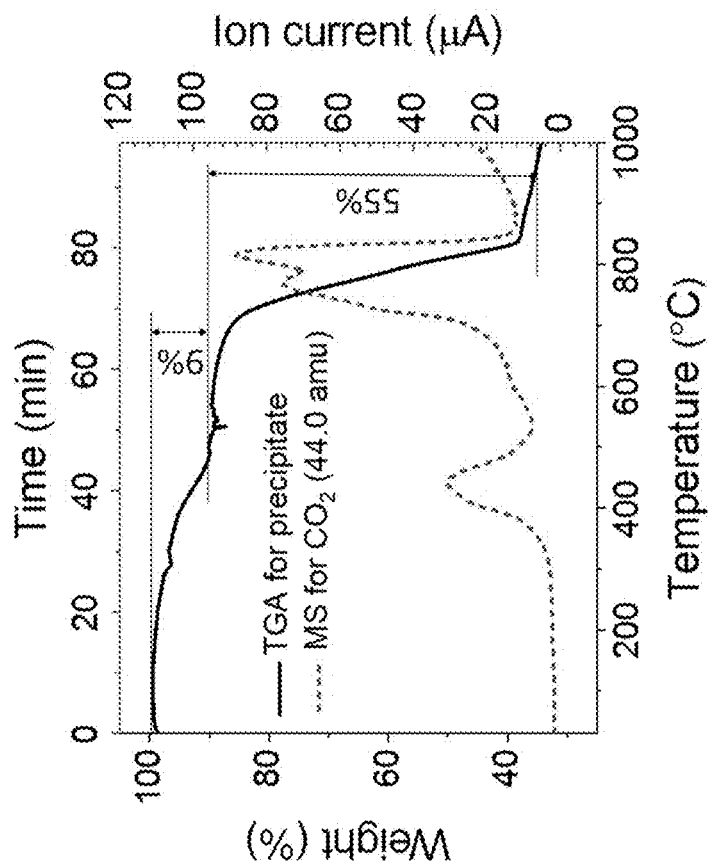
FIG. 17 is a TGA-MS analysis of the precipitate. During the temperature-dependent decomposition of the precipitate, $CO_2$ gas evolution was detected at the weight loss regions.
Figure 18:
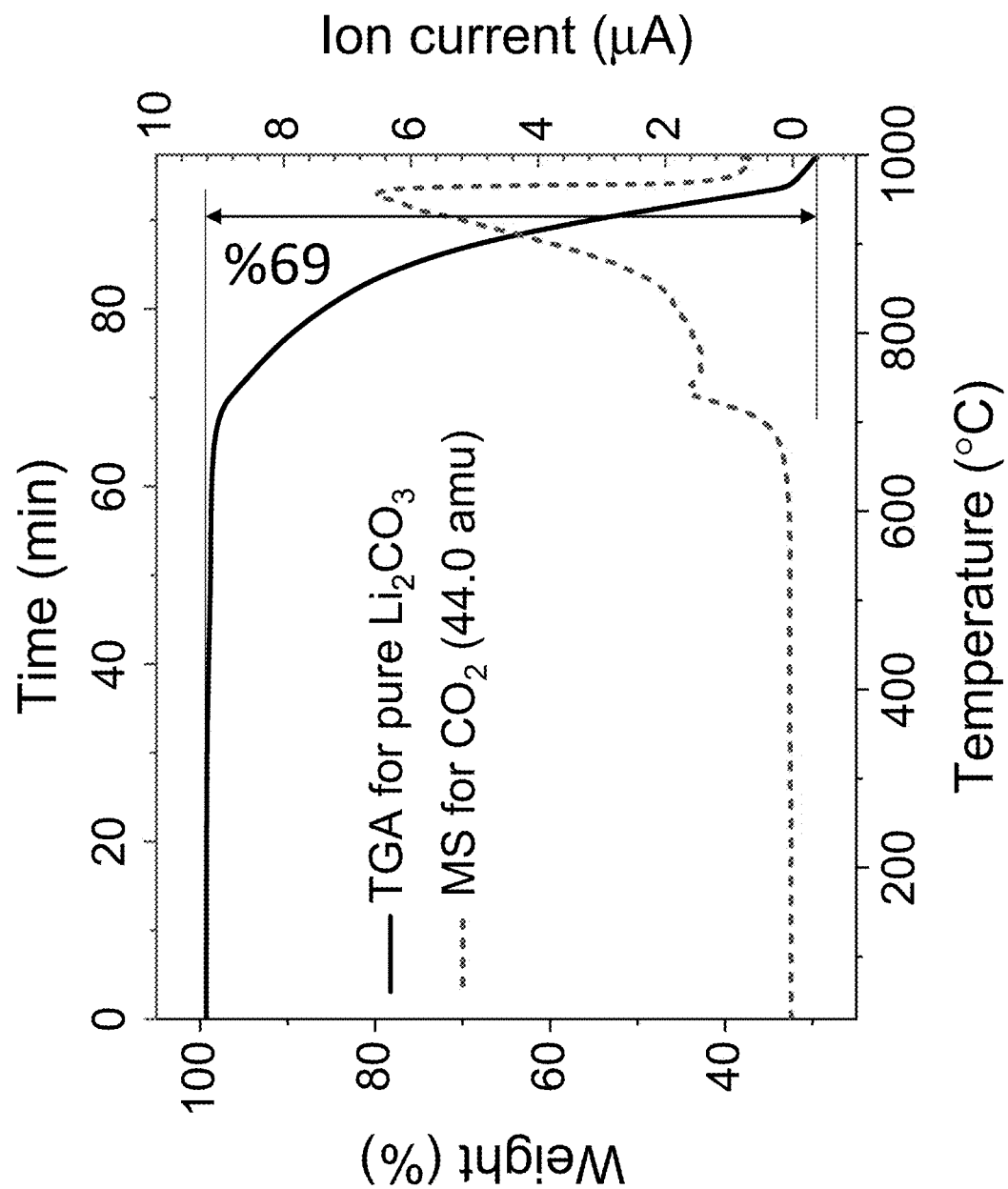
FIG. 18 is a TGA analysis of pure $Li_2CO_3$ (o weight loss vs. temperature) and on-line MS of $CO_2$ gas evolved during the decomposition of $Li_2CO_3$ heated from 30° C. to 1000° C. at 10 K min$^{-1}$ in Ar.

From thermogravimetric analysis, coupled with online mass spectrometry (TGA-MS), more quantitative information was obtained about the precipitate. To avoid any unexpected oxidation, the precipitation decomposition was performed at temperatures up to 1000° C. in an inert argon atmosphere. From the TGA-MS data (FIG. 17), two distinctive weight losses are observed at 250-500° C. and 700-850° C., respectively, which correspond to the two temperature ranges where $CO_2$ evolution was detected. The $CO_2$ evolution observed in the lower temperature region (250-500° C.) is most likely due to the decomposition of residual organic reactants/resultants in the precipitate and/or a release of $CO_2$ from physisorption or lithium carboxylic species from the reaction between $CO_2^{\cdot-}$, $Li^+$ and solvents (Strehle, B., et al., J Electrochem Soc 2017, 164, A2513-A2526). By comparing the generated product with a pure $Li_2CO_3$ reference sample, it was determined that the $CO_2$ evolution found in the higher temperature range (700-850° C.) is most likely attributed to the decomposition of the $Li_2CO_3$ product (FIG. 18). Based on the weight loss of the pure $Li_2CO_3$ during the decomposition, the precipitate (1 mg) is comprised of 79% $Li_2CO_3$ (790 μg), with the rest likely consisting of residual organic reactants/products, carbon and/or hydrocarbon species formed during the reaction.

Based on XPS, GC-FID and TGA-MS data of the carbonate species, it is estimated that a large volume of $CO_2$ gas is consumed during the doping process. The amount of $CO_2$ consumed can be calculated by considering the amount of generated $Li_2CO_3$ and estimating that 51% of LiTFSI participated in the precipitation reaction. From the consumption of LiTFSI, the estimated doping efficiency of spiro-OMeTAD to approximately 33%; 51% of LiTFSI was consumed and the mole ratio of spiro-OMeTAD versus LiTFSI was 6 to 4. The doping efficiency (~11%) estimated from SAR in a UV-Vis absorption spectrum (FIG. 10) is different from the doping efficiency (~33%) estimated by LiTFSI consumption (FIG. 17). This difference can be attributed to the presence of the tBP additive which can de-dope oxidized spiro-OMeTAD molecules (Lamberti, F. et al. Chem-Us 2019, 5, 1806-1817). After bubbling with $CO_2$, tBP remains in the solution and likely also remains in the film since the vapor pressure of tBP is as low as 0.5±0.4 mmHg at 25° C., much lower than those of other solvents in the solution such as CB (11.97 mmHg at 25° C.) and acetonitrile (88.50 mmHg at 25° C.) (Yaws, C. L. & Satyro, M. A. in The Yaws handbook of vapor pressure: Antoine coefficients Ch. 1, Houston, Tex: Gulf Pub, 2015). Although some suggest that tBP may be essential to prevent phase separation of spiro-OMeTAD and LiTFSI in the mixture solution (Wang, S. et al. Nano Lett 2016, 16, 5594-5600), it does seem to affect the doping efficiency rate and pathway.

Figure 19:
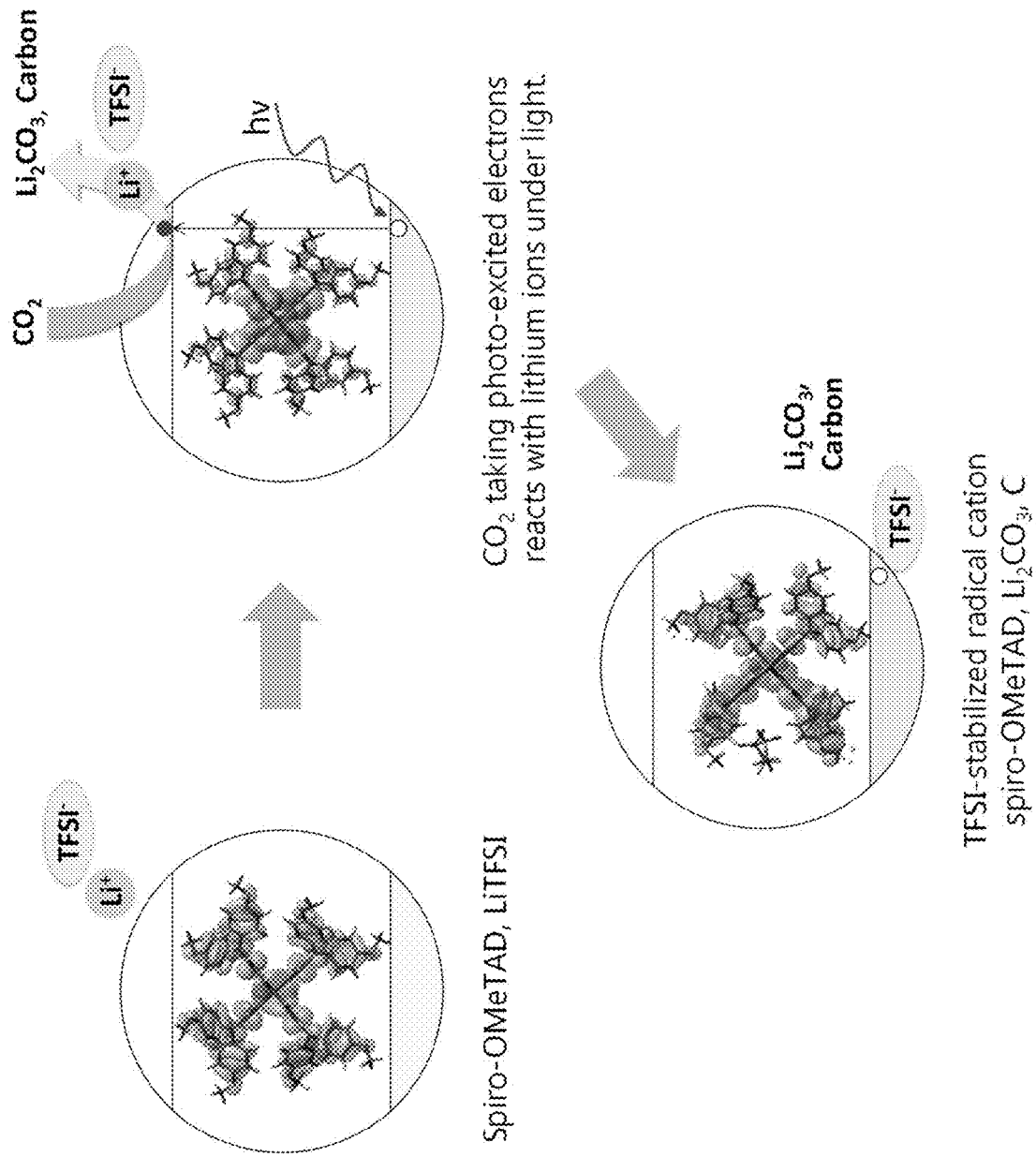
FIG. 19 depicts the proposed doping/precipitation reaction. Spiro-OMeTAD and LiTFSI are mixed in CB. The spiro-OMeTAD:LiTFSI blend solution is bubbled with $CO_2$ under UV light. The photoexcited electrons in the spiro-OMeTAD are transferred to the dissolved $CO_2$ gas, and the negatively charged $CO_2$ will react with lithium ions, producing $Li_2CO_3$ and carbon species. The oxidized spiro-OMeTAD is stabilized by TFSI$^-$, resulting in p-type doping. Insets in each step represent the electron wave function probability of HOMO energy level, here green and yellow iso-surfaces indicate different phases (iso-surface value of ±0.01 Å$^{-3/2}$).

While ambient $O_2$ doping of spiro-OMeTAD has been extensively studied, $CO_2$ doping is unexplored and a suitable mechanism has therefore not been identified. When a pristine spiro-OMeTAD:LiTFSI blend solution (FIG. 19, first step) is bubbled with $CO_2$ gas under UV light, the photo-excited electrons in the spiro-OMeTAD LUMO level are captured by the $CO_2$. The negatively charged (or radical anion) $CO_2$ can now react with the lithium ions (Weber, J. M. Int Rev Phys Chem 2014, 33, 489-519; Liu, B. et al. Energ Environ Sci 2019, 12, 887-922), producing $Li_2CO_3$ and carbon species (FIG. 19, second step). During the reaction, spiro-OMeTAD can be oxidized into radical cations and/or diradical dications, and are stabilized by $TFSI^-$, forming stabilized radicals (FIG. 19, third step), resulting in p-type doping. This mechanism is similar to what has previously been reported for $O_2$ doping, where the negatively charged gas species reacts with the metal ion, resulting in metal oxide precipitates.

Figure 20:
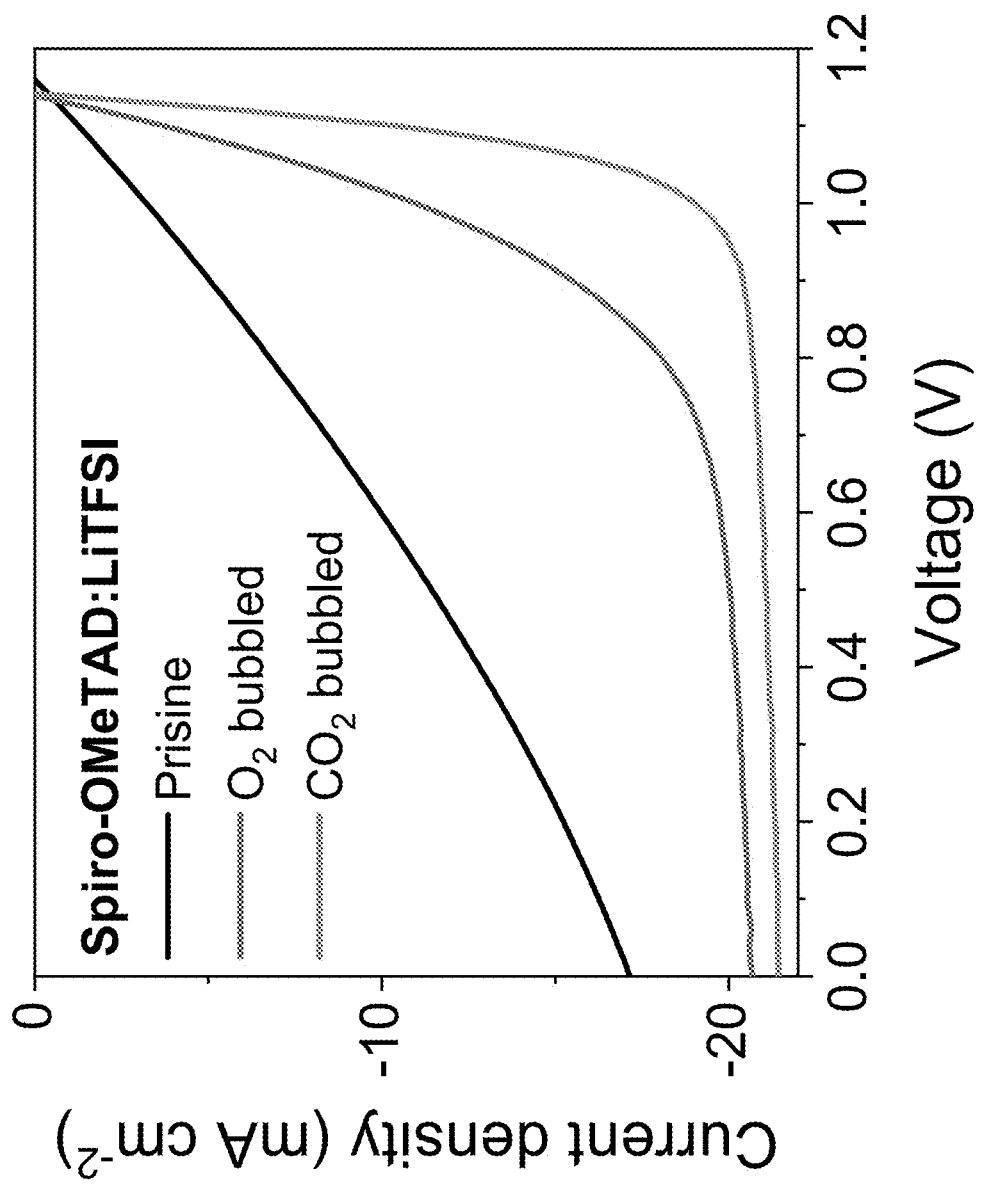
FIG. 20 is a plot of J-V characteristics of an exemplary perovskite solar cells using a pristine, $O_2$-bubbled, and $CO_2$-bubbled spiro-OMeTAD:LiTFSI as the hole-conducting layer.

Perovskite solar cells were fabricated incorporating $CO_2$-bubbled spiro-OMeTAD:LiTFSI as the HTL, in order to assess the practical applicability of $CO_2$ doping. Pristine and $O_2$-bubbled spiro-OMeTAD:LiTFSI films were examined for comparison. Current density-voltage (J-V) curves of solar cells using either a pristine, $O_2$-bubbled, or $CO_2$-bubbled spiro-OMeTAD:LiTFSI as HTLs are illustrated in FIG. 20. The solar cell with a pristine spiro-OMeTAD:LiTFSI gives poor device performance, exhibiting a power conversion efficiency (PCE) of 9.02% ($V_{OC}$=1.16 V, $J_{SC}$=17.7 mA cm$^{-2}$ and FF=0.44) (FIG. 20 and Table 1). The perovskite solar cells with $CO_2$-doped spiro-OMeTAD show a similar deviation in both sweep directions, 0.426% and 0.438% in the reverse and forward sweep directions, respectively. Upon 60-min air exposure, the deviations in reverse and forward sweep directions significantly reduce to 0.296% and 0.277%, respectively; much less than what was observed in the perovskite devices doped in the traditional manner. The solar cell with an $O_2$-bubbled spiro-OMeTAD:LiTFSI film shows an improved device performance, yet with a limited efficiency of 17.3% ($V_{OC}$=1.14 V, $J_{SC}$=20.9 mA cm$^{-2}$ and FF=0.74) (FIG. 20 and Table 2). In contrast, the solar cell using a $CO_2$-bubbled spiro-OMeTAD:LiTFSI as an HTL reached a PCE of 19.1% ($V_{OC}$=1.14 V, $J_{SC}$=21.2 mA cm$^{-2}$ and FF=0.79), which is slightly higher than the PCE of 18.3% (Table 3) obtained from a solar cell using a two-metal-salt approach, adding tris(2-(1H-pyrazol-1-yl)-4-tert-butylpyridine)cobalt(III) tri[bis(trifluoromethane)sulfonimide] (FK209 Co(III)TFSI salt) to the blend, skipping the need for air-exposure. The perovskite solar cells with Spiro-OMeTAD:LiTFSI:Co(III)TFSI exhibit a small deviation of 0.021% during the reverse sweep while the deviation in the forward sweep was 0.692%, approximately 30 times larger. This deviation in the reverse sweep increases to 0.860% (~40 times increase) upon 30-min air exposure where the highest efficiency (18.3%) in the batch is obtained (Table 3). Moreover, upon 60-min air exposure, the deviation in the forward sweep increases up to 1.509% which is almost a 10% deviation from the average value. Besides increasing the overall performance of the cells, reproducibility was also improved.

TABLE 1

Device parameters of perovskite solar cells using pristine and $CO_2$-bubbled spiro-OMeTAD:LiTFSI, and their evolutions over air-exposure time from 10 min to 120 min. Figures in parenthesis refer to the average parameters of 15 cells. The reverse sweep means the voltage bias sweep direction is from $V_{OC}$ to 0 V. The forward sweep is the opposite direction to the reverse sweep.

| | | | $V_{OC}$ [V] | $J_{SC}$ [mA cm$^{-2}$] | FF | PCE [%] |
|---|---|---|---|---|---|---|
| Air-exposure time (with pristine Sprio-OMeTAD) | 0 min | Reverse sweep | 1.16 (1.152 ± 0.010) | 19.7 (17.97 ± 2.455) | 0.516 (0.385 ± 0.095) | 11.8 (8.210 ± 2.955) |
| | | Forward sweep | 1.16 (1.160 ± 0.001) | 19.9 (18.42 ± 1.896) | 0.503 (0.393 ± 0.091) | 11.6 (8.560 ± 2.729) |
| | 10 min | Reverse sweep | 1.16 (1.151 ± 0.010) | 20.5 (20.35 ± 0.358) | 0.615 (0.527 ± 0.071) | 14.6 (12.37 ± 1.883) |
| | | Forward sweep | 1.16 (1.150 ± 0.010) | 20.6 (20.63 ± 0.219) | 0.612 (0.531 ± 0.068) | 14.6 (12.62 ± 1.769) |
| | 30 min | Reverse sweep | 1.16 (1.147 ± 0.014) | 20.6 (20.79 ± 0.361) | 0.679 (0.596 ± 0.063) | 16.5 (14.45 ± 1.664) |
| | | Forward sweep | 1.16 (1.150 ± 0.010) | 20.8 (21.03 ± 0.330) | 0.673 (0.597 ± 0.056) | 16.2 (14.44 ± 1.427) |

TABLE 1-continued

Device parameters of perovskite solar cells using pristine and $CO_2$-bubbled spiro-OMeTAD:LiTFSI, and their evolutions over air-exposure time from 10 min to 120 min. Figures in parenthesis refer to the average parameters of 15 cells. The reverse sweep means the voltage bias sweep direction is from $V_{OC}$ to 0 V. The forward sweep is the opposite direction to the reverse sweep.

|  |  |  | $V_{OC}$ [V] | $J_{SC}$ [mA cm$^{-2}$] | FF | PCE [%] |
|---|---|---|---|---|---|---|
|  | 60 min | Reverse sweep | 1.16 (1.148 ± 0.010) | 20.9 (21.12 ± 0.202) | 0.714 (0.668 ± 0.033) | 17.3 (16.20 ± 0.830) |
|  |  | Forward sweep | 1.14 (1.139 ± 0.005) | 21.0 (21.27 ± 0.250) | 0.712 (0.650 ± 0.048) | 17.1 (15.73 ± 1.042) |
|  | 120 min | Reverse sweep | 1.14 (1.130 ± 0.010) | 20.9 (21.22 ± 0.367) | 0.743 (0.733 ± 0.014) | 17.7 (17.59 ± 0.399) |
|  |  | Forward sweep | 1.14 (1.121 ± 0.020) | 21.0 (21.32 ± 0.400) | 0.728 (0.710 ± 0.014) | 17.3 (16.97 ± 0.462) |
| Air-exposure time (with $CO_2$ bubbled Sprio-OMeTAD) | 0 min | Reverse sweep | 1.14 (1.127 ± 0.010) | 21.2 (21.72 ± 0.461) | 0.789 (0.783 ± 0.009) | 19.1 (19.19 ± 0.426) |
|  |  | Forward sweep | 1.12 (1.115 ± 0.009) | 21.1 (21.74 ± 0.594) | 0.773 (0.761 ± 0.007) | 18.3 (18.45 ± 0.438) |
|  | 120 min | Reverse sweep | 1.12 (1.120 ± 0.001) | 21.0 (21.14 ± 0.319) | 0.795 (0.791 ± 0.005) | 18.7 (18.74 ± 0.296) |
|  |  | Forward sweep | 1.12 (1.106 ± 0.009) | 20.9 (21.12 ± 0.340) | 0.768 (0.766 ± 0.006) | 18.1 (17.89 ± 0.277) |

TABLE 2

Device parameters of perovskite solar cells using $O_2$-bubbled spiro-OMeTAD:LiTFSI and their evolutions over air-exposure time from 10 min to 120 min. Figures in parenthesis refer to the average parameters of 20 cells. The reverse sweep means the voltage bias sweep direction is from $V_{OC}$ to 0 V. The forward sweep is the opposite direction to the reverse sweep.

|  |  |  | $V_{OC}$ [V] | $J_{SC}$ [mA cm$^{-2}$] | FF | PCE [%] |
|---|---|---|---|---|---|---|
| Air-exposure time (with $O_2$ bubbled Sprio-OMeTAD) | 0 min | Reverse sweep | 1.12 (1.135 ± 0.009) | 20.6 (20.57 ± 0.579) | 0.625 (0.604 ± 0.065) | 14.4 (14.12 ± 1.540) |
|  |  | Forward sweep | 1.12 (1.139 ± 0.004) | 20.8 (20.87 ± 0.664) | 0.651 (0.607 ± 0.048) | 15.2 (14.80 ± 1.956) |
|  | 10 min | Reverse sweep | 1.12 (1.131 ± 0.010) | 20.8 (20.95 ± 0.707) | 0.692 (0.699 ± 0.038) | 16.8 (16.57 ± 0.946) |
|  |  | Forward sweep | 1.12 (1.129 ± 0.010) | 21.2 (21.13 ± 0.733) | 0.719 (0.684 ± 0.020) | 17.0 (16.18 ± 0.529) |
|  | 30 min | Reverse sweep | 1.12 (1.129 ± 0.010) | 20.8 (20.85 ± 0.681) | 0.729 (0.724 ± 0.028) | 17.0 (17.04 ± 0.754) |
|  |  | Forward sweep | 1.12 (1.129 ± 0.009) | 21.2 (21.11 ± 0.690) | 0.720 (0.711 ± 0.017) | 17.1 (16.63 ± 0.401) |
|  | 60 min | Reverse sweep | 1.12 (1.129 ± 0.013) | 21.0 (20.91 ± 0.733) | 0.754 (0.746 ± 0.017) | 17.7 (17.62 ± 0.656) |
|  |  | Forward sweep | 1.12 (1.119 ± 0.008) | 20.3 (21.10 ± 0.749) | 0.723 (0.718 ± 0.017) | 17.2 (16.82 ± 0.612) |
|  | 120 min | Reverse sweep | 1.12 (1.123 ± 0.012) | 21.3 (20.60 ± 0.763) | 0.760 (0.743 ± 0.020) | 17.7 (17.19 ± 0.789) |
|  |  | Forward sweep | 1.08 (1.105 ± 0.014) | 20.8 (20.83 ± 0.658) | 0.721 (0.716 ± 0.027) | 16.8 (16.32 ± 0.852) |

TABLE 3

Device parameters of perovskite solar cells with spiro-OMeTAD:LiTFSI:Co(III)TFSI blend film as a HTL. Figures in parenthesis refer to the average parameter values of 8 devices. The reverse sweep means the voltage bias sweep direction is from $V_{OC}$ to 0 V. The forward sweep is the opposite direction to the reverse sweep.

|  |  |  | $V_{OC}$ [V] | $J_{SC}$ [mA cm$^{-2}$] | FF | PCE [%] |
|---|---|---|---|---|---|---|
| Air-exposure time (Sprio-OMeTAD:LiTFSI:Co(III)TFSI) | 0 min | Reverse sweep | 1.08 (1.081 ± 0.011) | 23.5 (23.48 ± 0.995) | 0.71 (0.685 ± 0.021) | 18.1 (17.40 ± 0.021) |
|  |  | Forward sweep | 1.06 (1.061 ± 0.009) | 23.54 (23.46 ± 0.968) | 0.65 (0.624 ± 0.015) | 16.1 (15.54 ± 0.692) |
|  | 30 min | Reverse sweep | 1.10 (1.085 ± 0.009) | 22.5 (22.46 ± 0.383) | 0.74 (0.711 ± 0.023) | 18.3 (17.34 ± 0.860) |
|  |  | Forward sweep | 1.08 (1.062 ± 0.012) | 22.5 (22.31 ± 0.422) | 0.67 (0.639 ± 0.018) | 16.3 (15.17 ± 0.686) |

TABLE 3-continued

Device parameters of perovskite solar cells with spiro-OMeTAD:LiTFSI:Co(III)TFSI blend film as a HTL. Figures in parenthesis refer to the average parameter values of 8 devices. The reverse sweep means the voltage bias sweep direction is from $V_{OC}$ to 0 V. The forward sweep is the opposite direction to the reverse sweep.

| | | $V_{OC}$ [V] | $J_{SC}$ [mA cm$^{-2}$] | FF | PCE [%] |
|---|---|---|---|---|---|
| 60 min | Reverse sweep | 1.11 (1.103 ± 0.024) | 22.5 (22.01 ± 0.623) | 0.70 (0.678 ± 0.019) | 17.54 (16.94 ± 0.670) |
| | Forward sweep | 1.11 (1.076 ± 0.017) | 22.6 (21.95 ± 0.566) | 0.65 (0.599 ± 0.054) | 16.30 (14.17 ± 1.509) |

Figure 21:
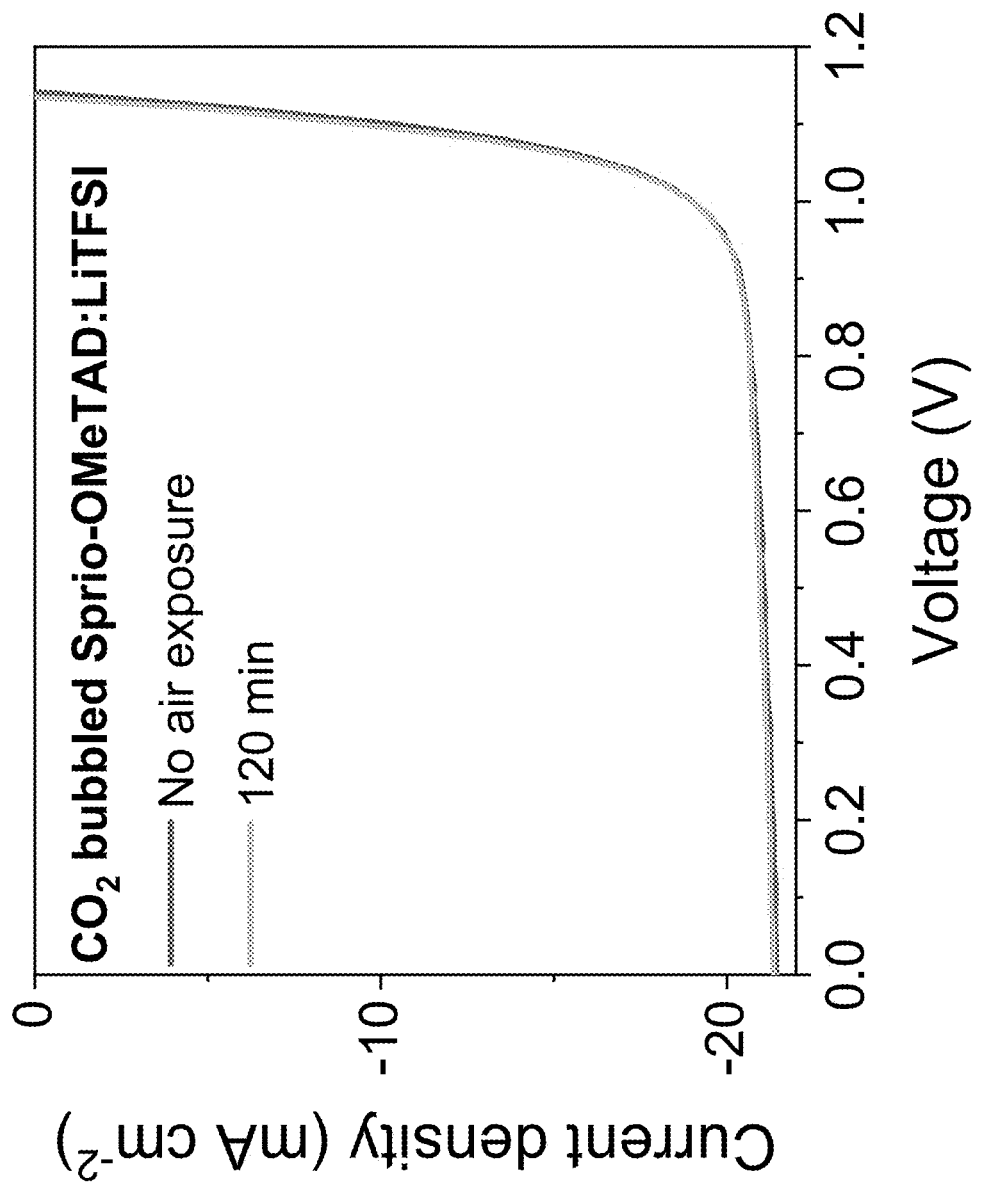
FIG. 21 is a plot of changes in J-V characteristics of an exemplary solar cell with $CO_2$-bubbled spiro-OMeTAD:LiTFSI upon air exposure.
Figure 22:
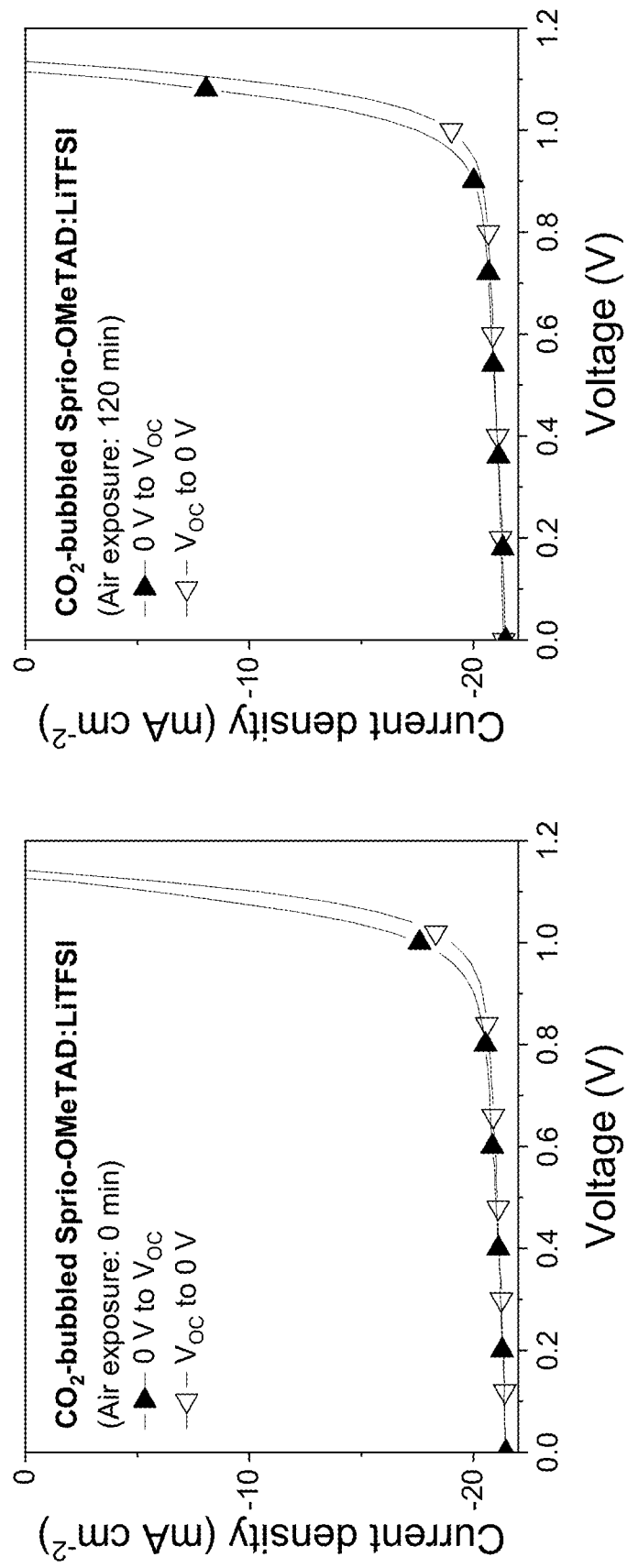
FIG. 22 shows J-V curves of an exemplary solar cell using $CO_2$-bubbled spiro-OMeTAD:LiTFSI as a hole transporting layer (HTL) before (left) and after (right) air exposure.
Figure 23:
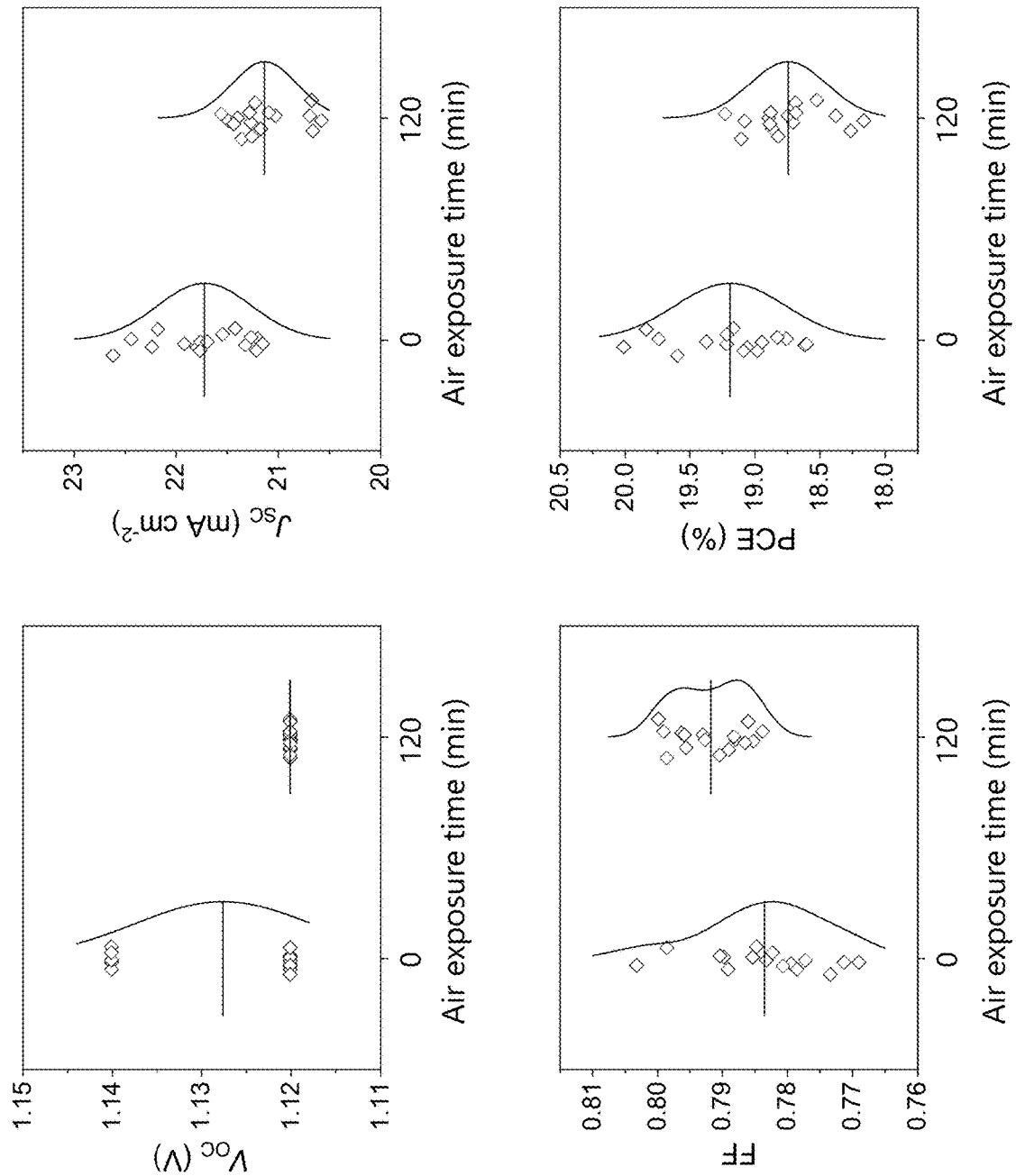
FIG. 23 is a series of charts depicting variations in $V_{OC}$, $J_{SC}$, FF, and PCE of exemplary solar cells using $CO_2$-bubbled spiro-OMeTAD:LiTFSI as a HTL before and after air exposure.
Figure 24:
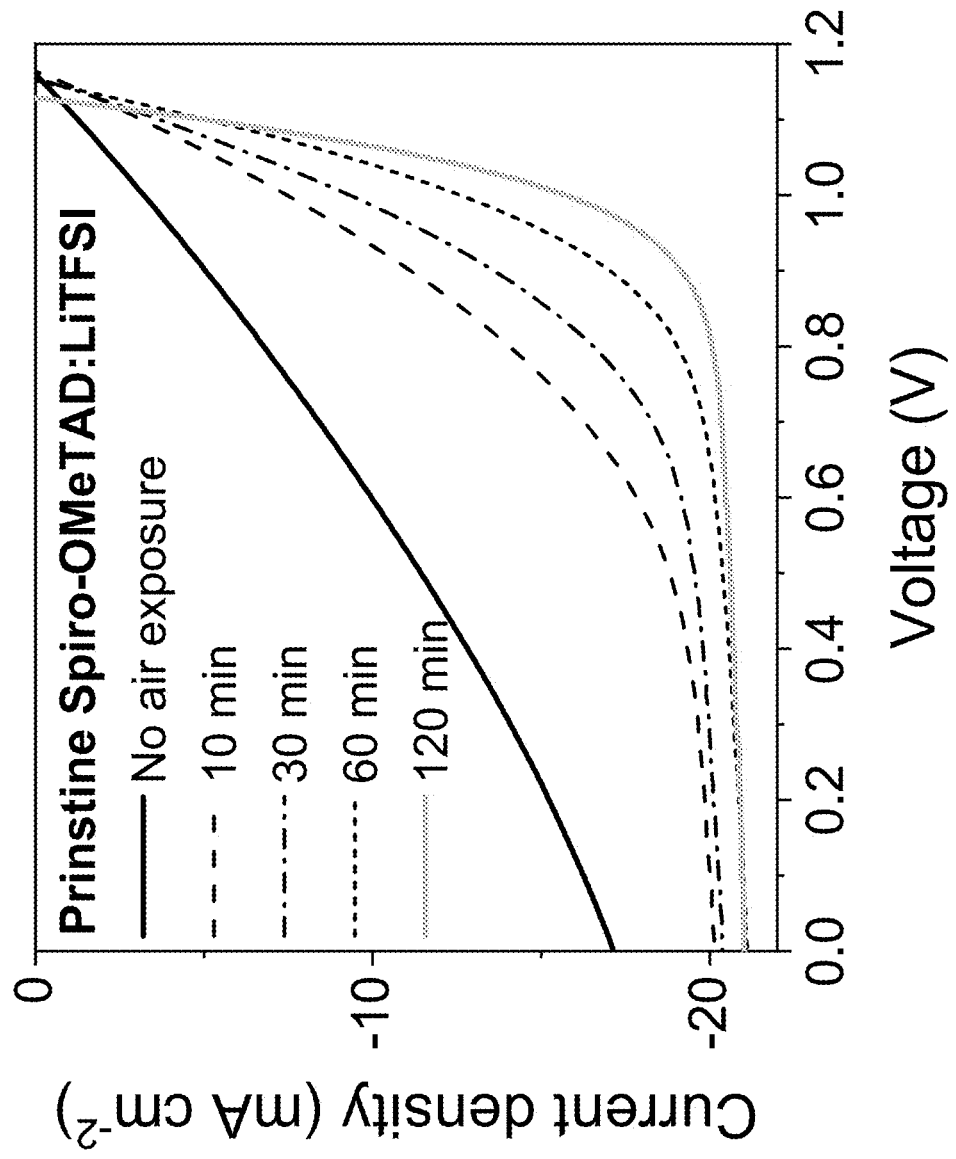
FIG. 24 is a plot of changes in J-V characteristics of a solar cell with pristine spiro-OMeTAD:LiTFSI upon air exposure.
Figure 25:
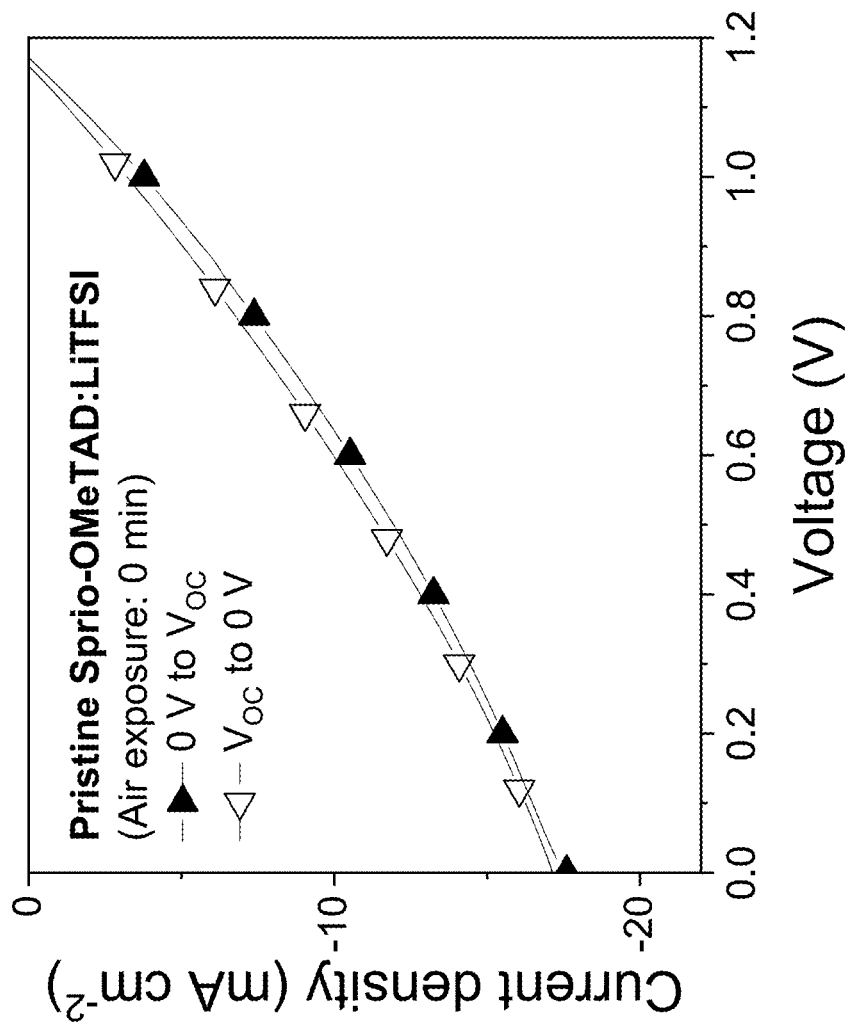
FIG. 25 shows J-V curves of a solar cell using pristine spiro-OMeTAD:LiTFSI as a HTL before air exposure.
Figure 26:
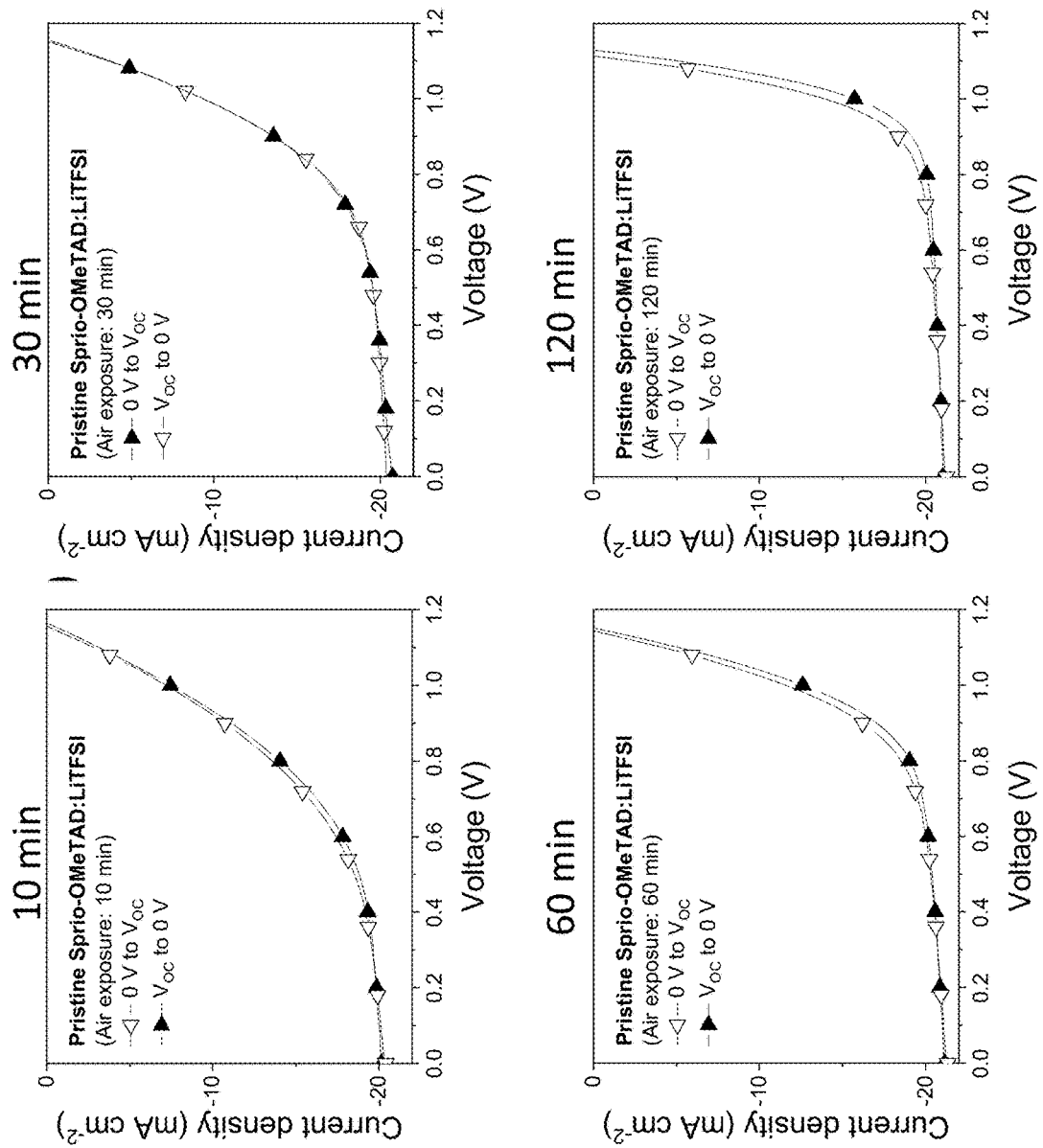
FIG. 26 is a series of J-V curves of a solar cell using pristine spiro-OMeTAD:LiTFSI as a HTL after exposure to air for 10 min, 30 min, 60 min, and 120 min.
Figure 27:
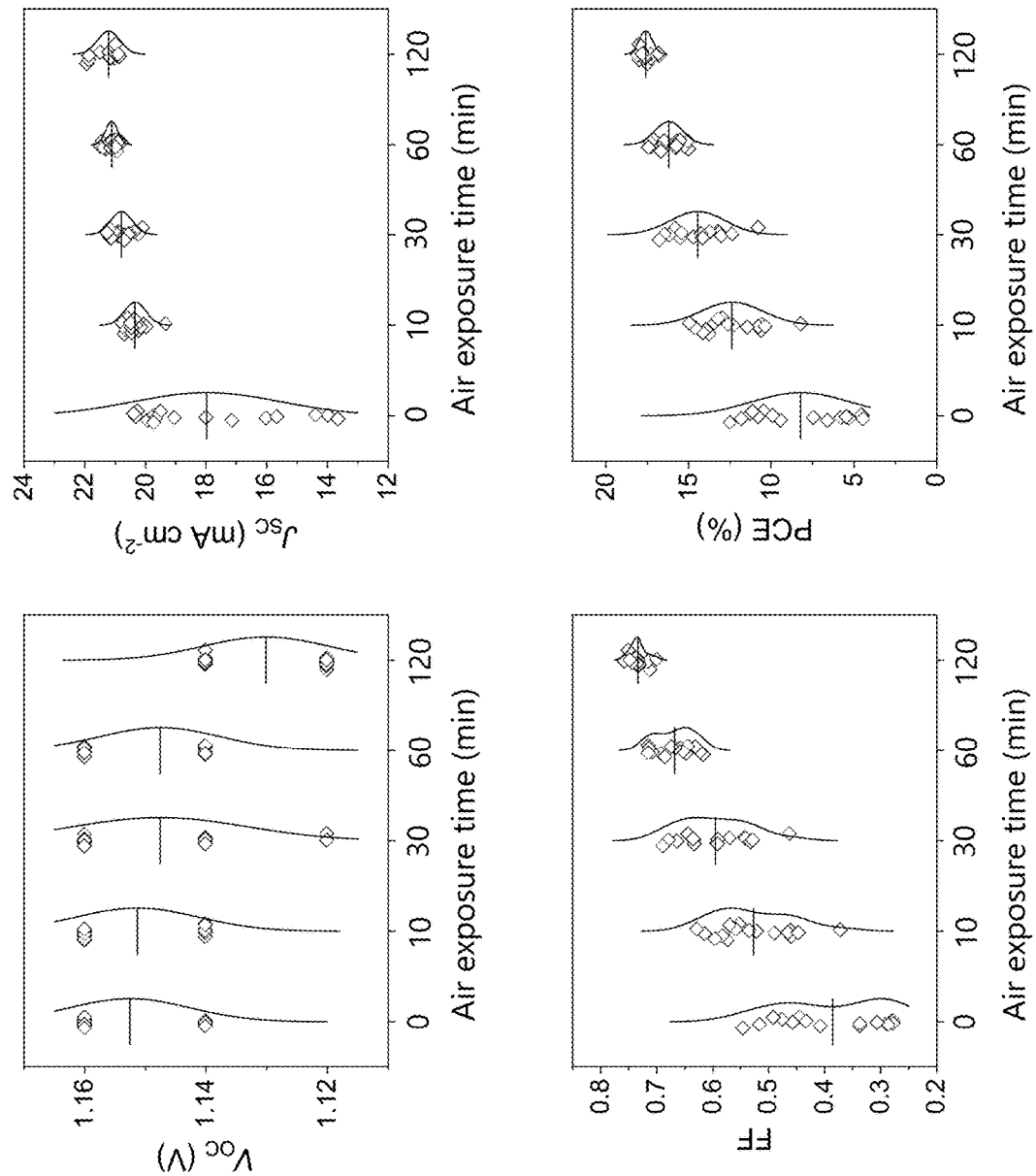
FIG. 27 is a series of charts depicting variations in $V_{OC}$, $J_{SC}$, FF, and PCE of solar cells using pristine spiro-OMeTAD:LiTFSI as a HTL before and after air exposure.
Figure 28:
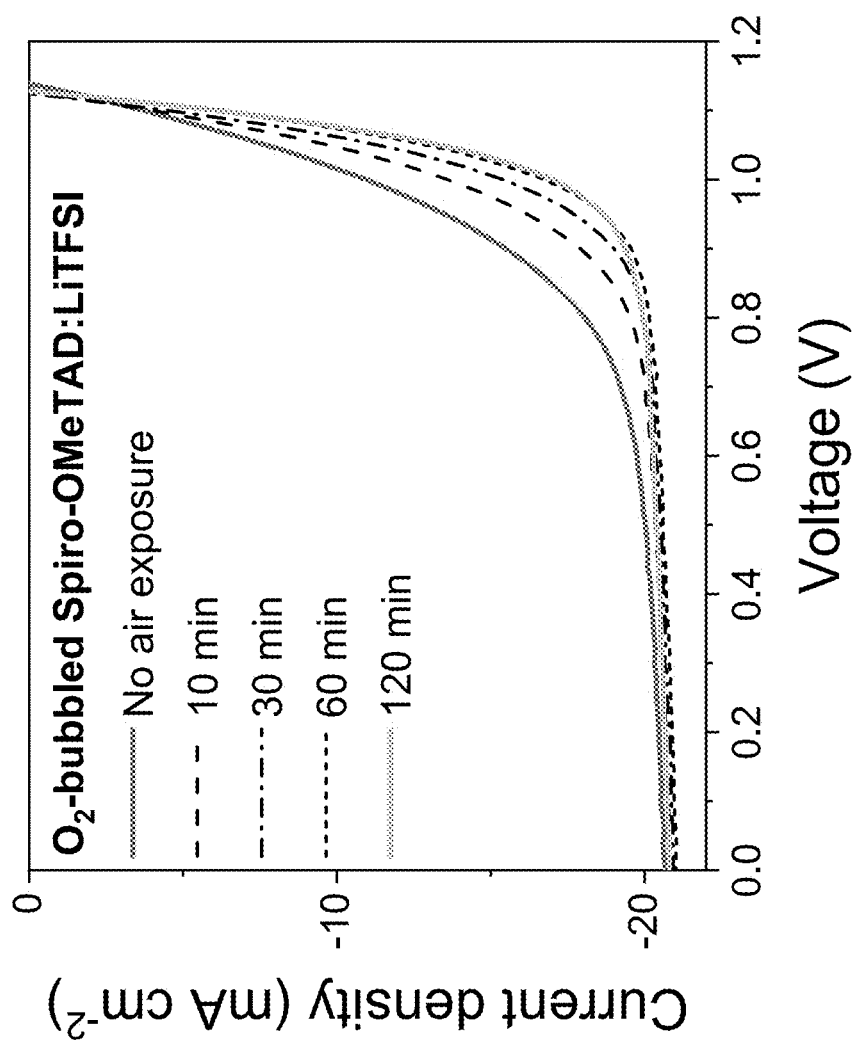
FIG. 28 is a plot of changes in J-V characteristics of a solar cell with $O_2$-bubbled spiro-OMeTAD:LiTFSI upon air exposure.
Figure 29:
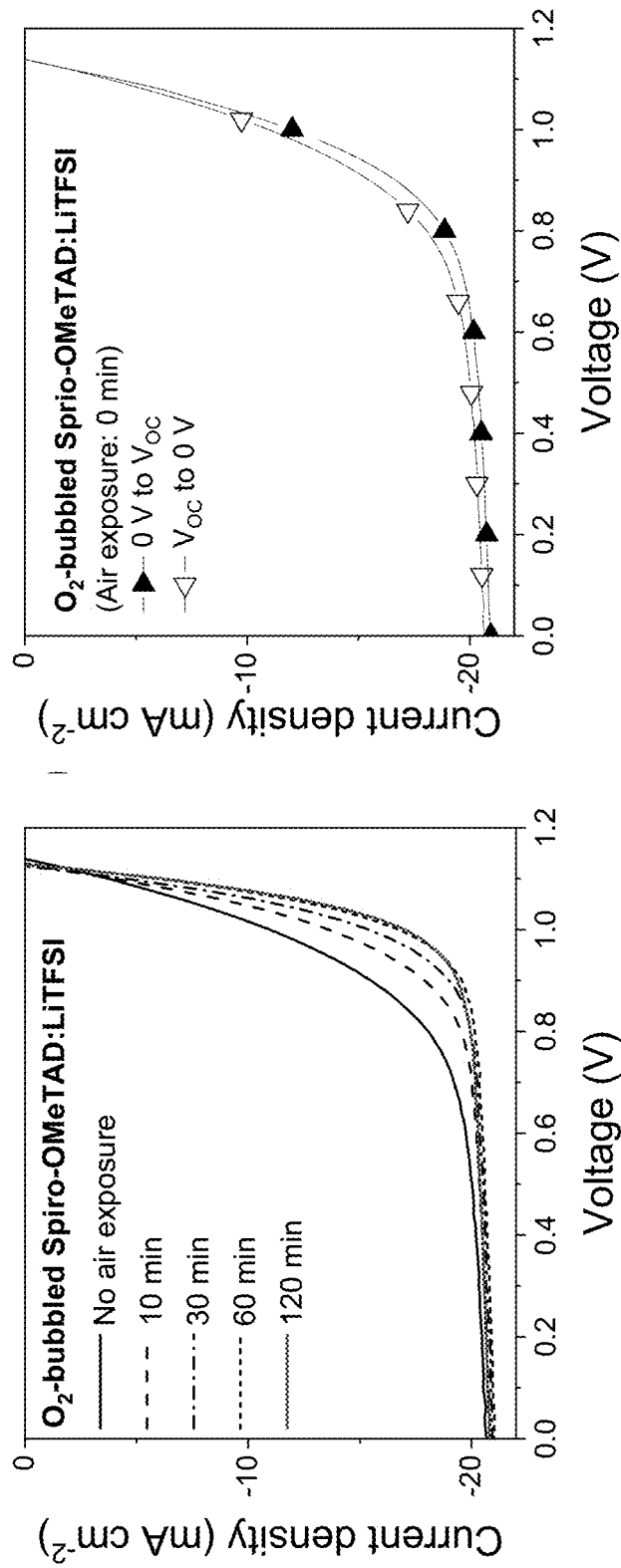
FIG. 29 is a pair of charts showing J-V curves of a solar cell using $O_2$-bubbled spiro-OMeTAD:LiTFSI as a HTL before and after air exposure (left) and J-V characteristic curves obtained from forward and reverse sweep directions before air exposure (right).
Figure 30:
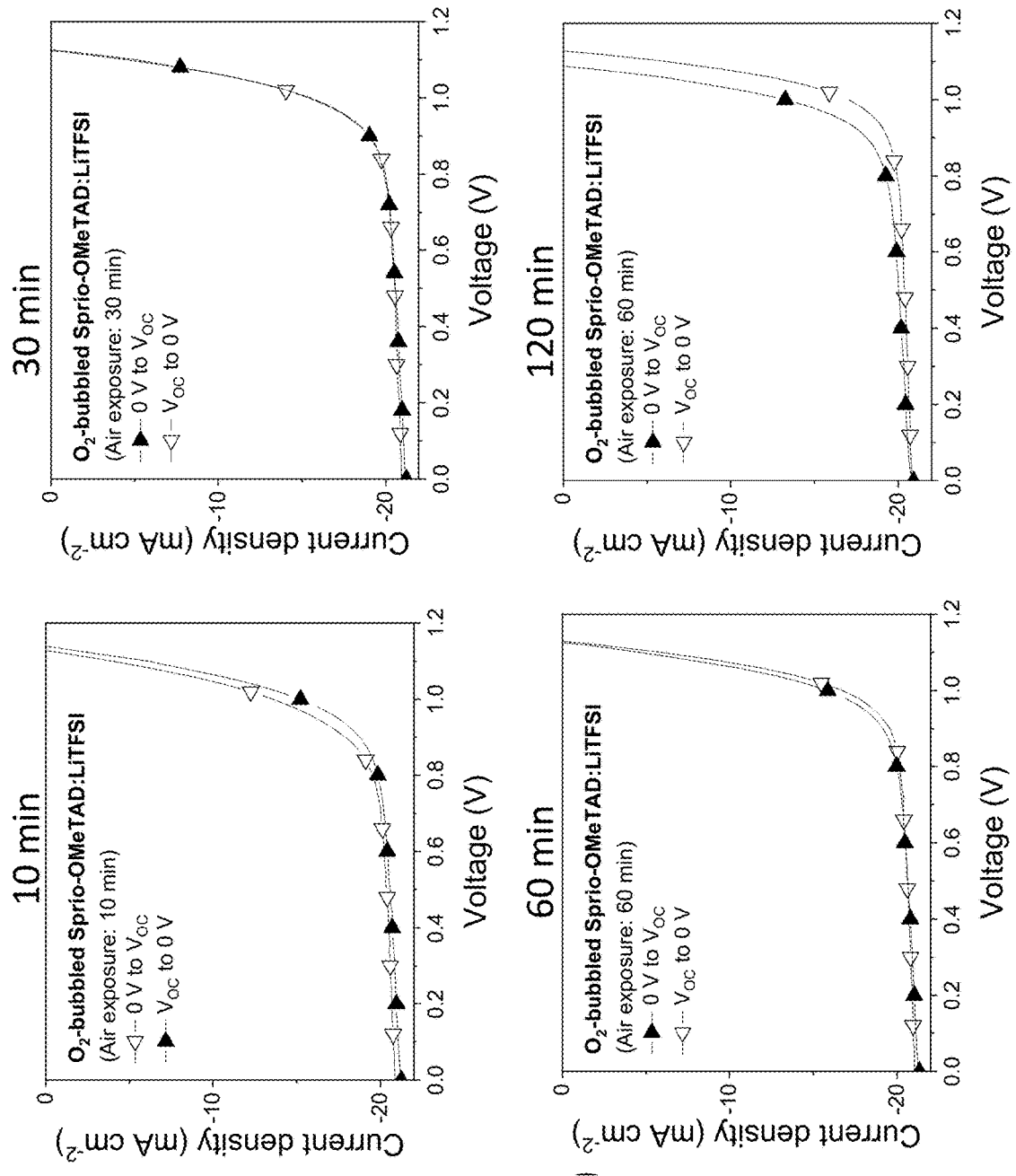
FIG. 30 is a series of J-V curves of a solar cell using $O_2$-bubbled spiro-OMeTAD:LiTFSI as a HTL after exposure to air for 10 min, 30 min, 60 min, and 120 min.
Figure 31:
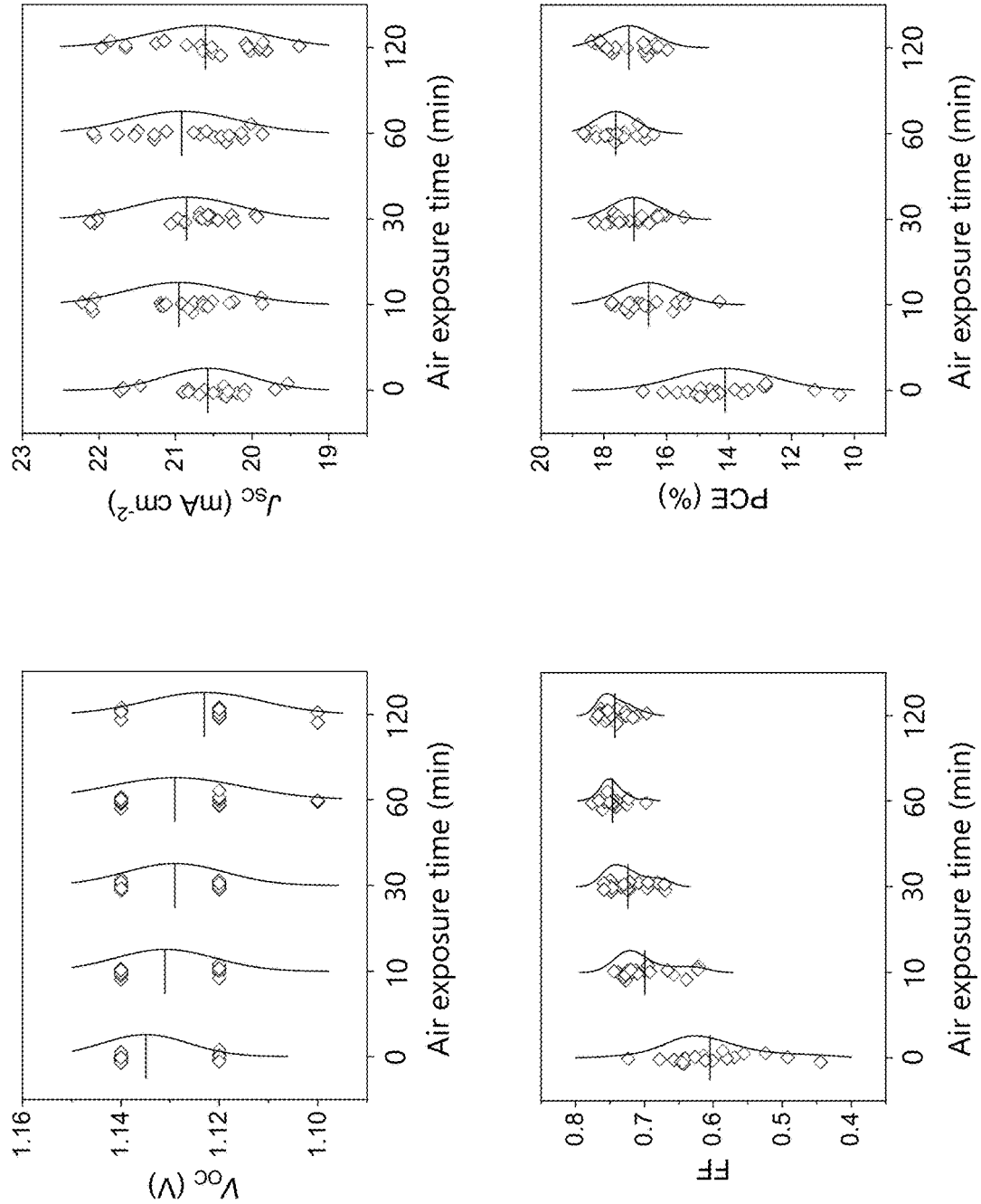
FIG. 31 is a series of charts depicting variations in $V_{OC}$, $J_{SC}$, FF, and PCE of solar cells using $O_2$-bubbled spiro-OMeTAD:LiTFSI as a HTL before and after air exposure.
Figure 33:
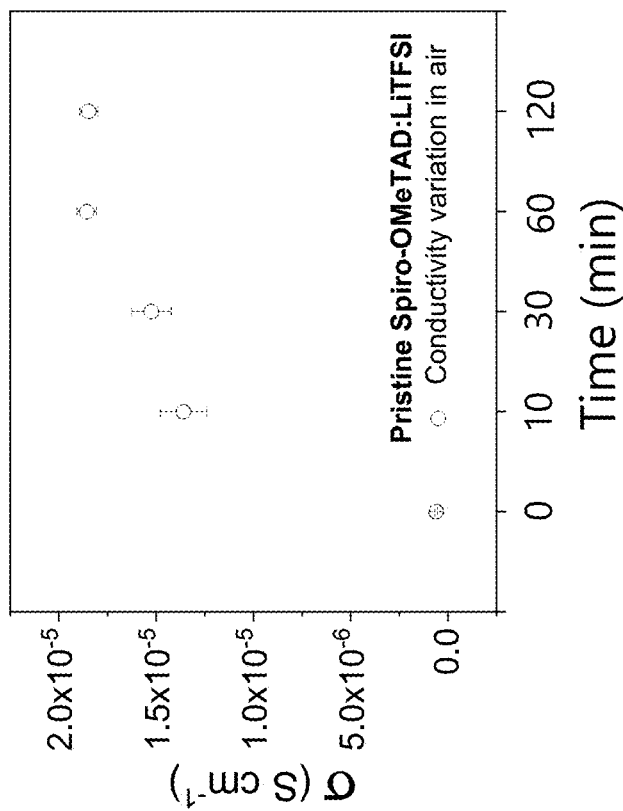
FIG. 33 plots the electrical conductivity evolution of pristine spiro-OMeTAD:LiTFSI films in air over time.
Figure 32:
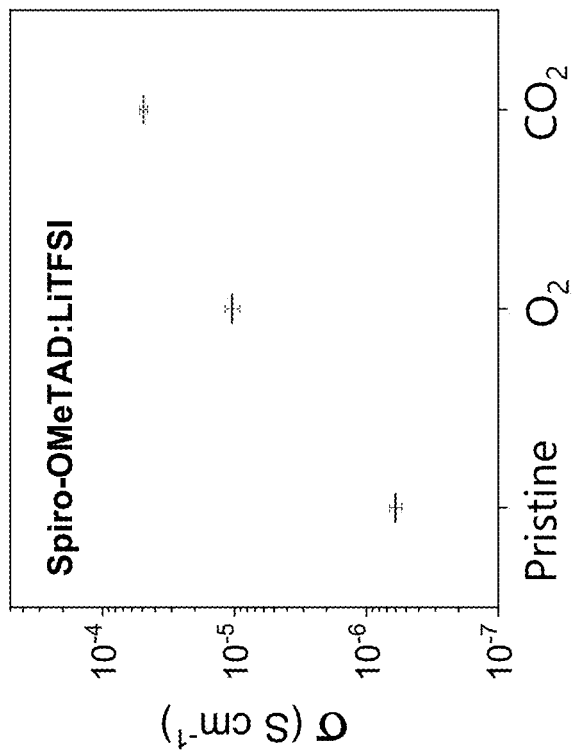
FIG. 32 is a chart showing electrical conductivities of the films fabricated with pristine, $O_2$- and $CO_2$-treated spiro-OMeTAD:LiTFSI solutions.
Figure 34:
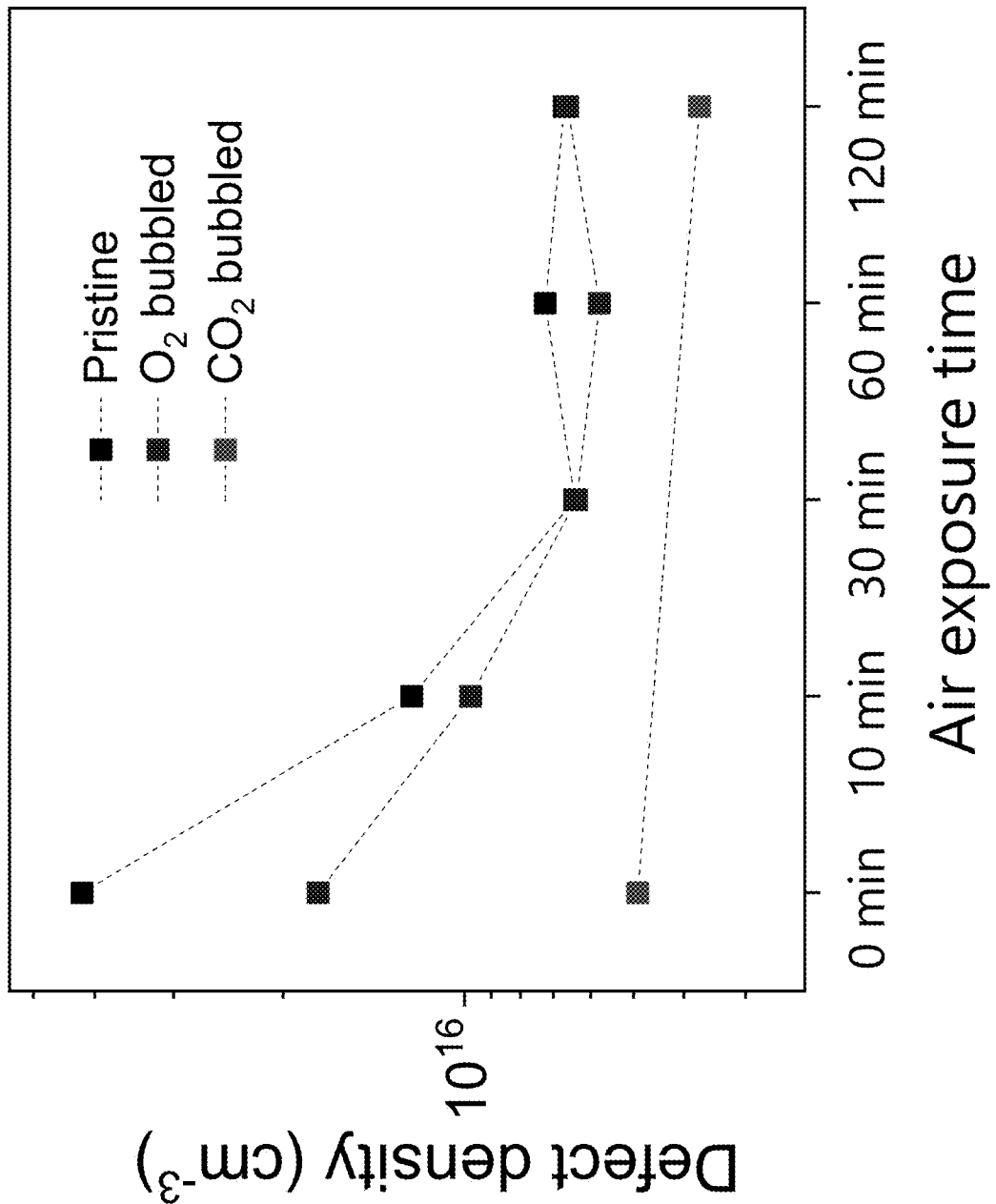
FIG. 34 is a plot showing the surface/interfacial defect densities of the solar cell using pristine, $O_2$- or $CO_2$-treated spiro-OMeTAD:LiTFSI over air-exposure time, estimated from the change in slope of the Mott-Schottky plots.
Figure 35:
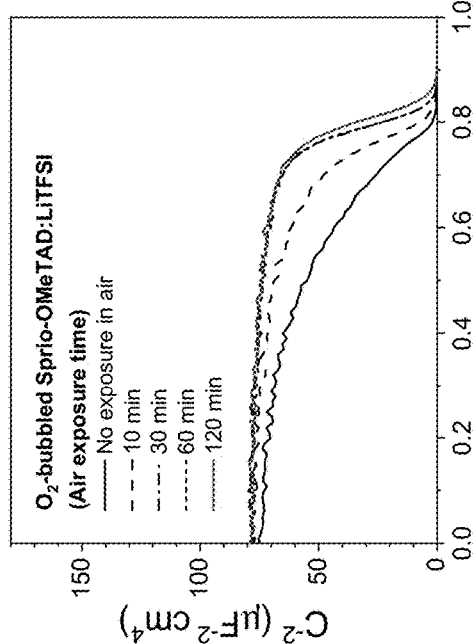
FIG. 35 is a Mott-Schottky plot for a solar cell using pristine spiro-OMeTAD:LiTFSI as the HTL. The device was measured before and after air exposure to track the variations in curve shape.
Figure 36:
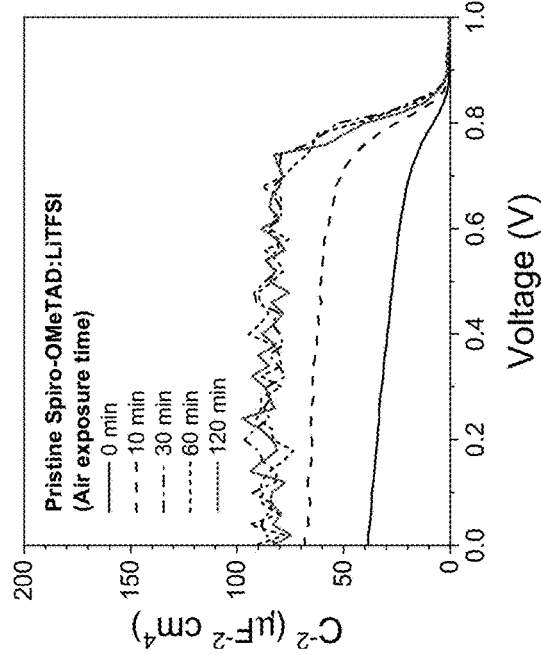
FIG. 36 is a Mott-Schottky plot for a solar cell using $O_2$-bubbled spiro-OMeTAD:LiTFSI as the HTL. The device was measured before and after air exposure to track the variations in curve shape.
Figure 37:
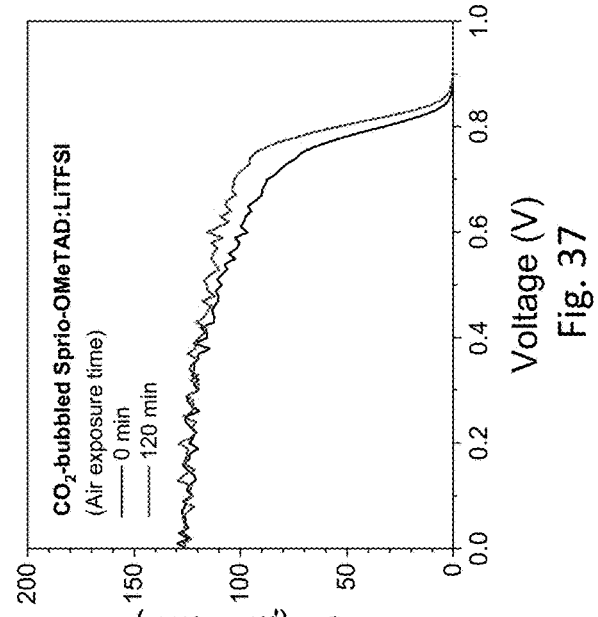
FIG. 37 is a Mott-Schottky plot for a solar cell using $CO_2$-bubbled spiro-OMeTAD:LiTFSI as the HTL. The device was measured before and after air exposure to track the variations in curve shape.

As mentioned above, in the conventional doping scheme, a post process where the spiro-OMeTAD:LiTFSI films are exposed to air is essential for enhancing the conductivity of the interlayer. Thus, perovskite solar cells are normally exposed to air for several hours or sometimes overnight depending on ambient conditions (McMeekin, D. P. et al. Joule 2019, 3, 387-401; Eperon, G. E. et al. ACS Nano 2015, 9, 9380-9393; Liu, G. L., et al., J Renew Sustain Ener 2018, 10). Notably, for the solar cells using $CO_2$-bubbled spiro-OMeTAD:LiTFSI no additional efficiency enhancement is found after the air-exposure process (FIG. 21, FIG. 22, and FIG. 23), while for the solar cells with the pristine (FIG. 24, FIG. 25, FIG. 26, and FIG. 27) and $O_2$-bubbled spiro-OMeTAD:LiTFSI (FIG. 28, FIG. 29, FIG. 30, and FIG. 31) the PCEs gradually increase during air exposure, reaching their maximum PCEs after two and one hour of air exposure, respectively (Table 1 and Table 2). The observed increase in the PCEs is mainly attributed to an increase in the conductivity of the spiro-OMeTAD films (An, Y. et al. Solar RRL 2018, 2, 1800126). The $CO_2$-bubbled spiro-OMeTAD:LiTFSI ($4.91 \times 10^{-5}$ S cm$^{-1}$) exhibits ~100 times higher conductivity than that of a pristine one ($6.04 \times 10^{-7}$ S cm$^{-1}$), and ~5 times higher than that of $O_2$-bubbled spiro-OMeTAD:LiTFSI ($1.04 \times 10^{-5}$ S cm$^{-1}$) (FIG. 32). Although the conventional air-exposure process enhances the conductivity of the pristine spiro-OMeTAD:LiTFSI film (FIG. 33) (Schloemer, T. H., et al., Chem Sci 2019, 10, 1904-1935; Hawash, Z., et al., Adv Mater Interfaces 2016, 3, 1600117), the resulting film still shows a lower conductivity ($1.86 \times 10^{-5}$ S cm$^{-1}$) than the $CO_2$-bubbled film. Moreover, the surface defect density in the solar cell is significantly reduced from $3.86 \times 10^{-16}$ cm$^{-3}$ obtained from the solar cell with a pristine spiro-OMeTAD:LiTFSI to $5.41 \times 10^{-15}$ cm$^{-3}$ when using $CO_2$-bubbled spiro-OMeTAD:LiTFSI (FIGS. 32 and 33). In the solar cells using a pristine and an $O_2$-bubbled spiro-OMeTAD:LiTFSI, the defect densities over air-exposure time considerably decrease from $3.86 \times 10^{-16}$ cm$^{-3}$ to $7.02 \times 10^{-15}$ cm$^{-3}$ and from $1.67 \times 10^{-16}$ cm$^{-3}$ to $6.94 \times 10^{-15}$ cm$^{-3}$, respectively (FIGS. 34, 35, and 36), while that for the solar cell using $CO_2$-bubbled spiro-OMeTAD:LiTFSI shows a negligible change (FIGS. 34 and 37).

Figure 39:
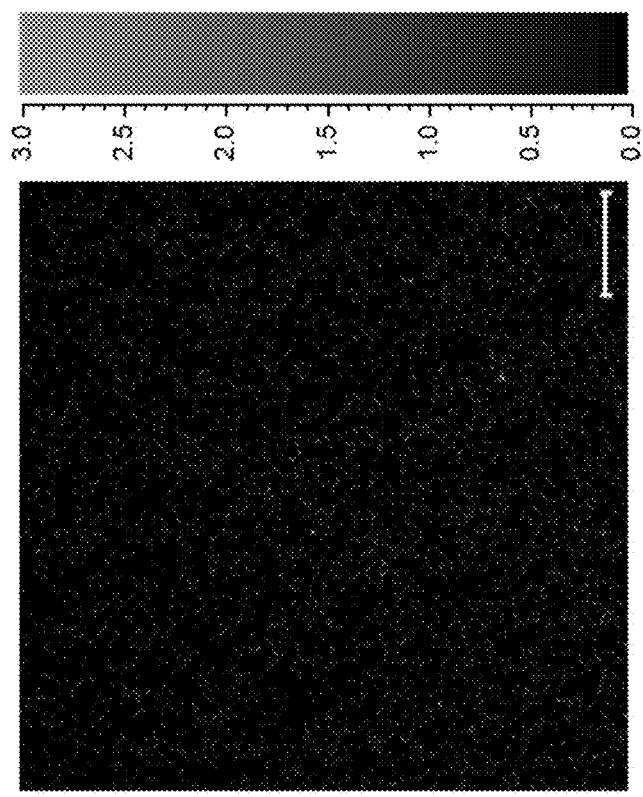
FIG. 39 depicts a TOF-SIMS 2D elemental map for a spiro-OMeTAD:LiTFSI processed with $CO_2$ bubbling and filtration. Green dots represent Li ions. The scale bar for the Li ion signal intensity was adjusted for the best viewing level.
Figure 38:
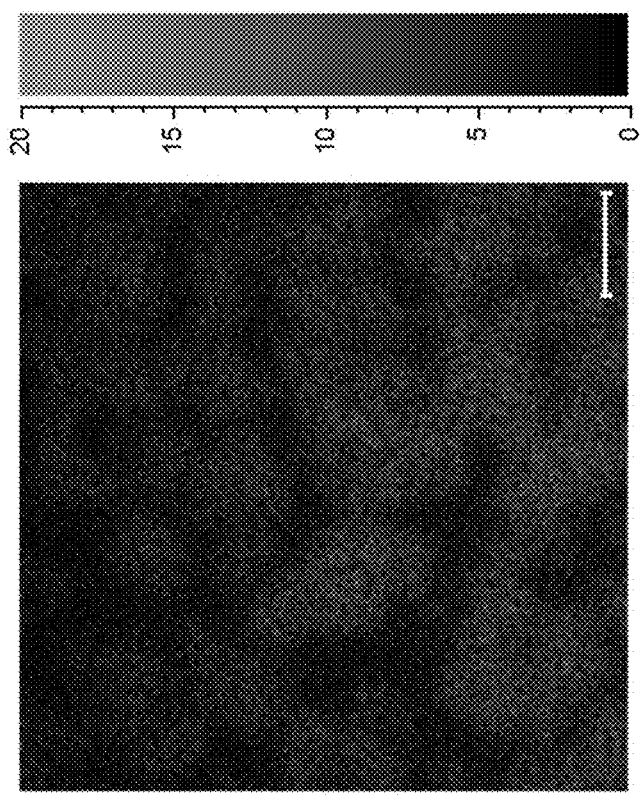
FIG. 38 depicts a TOF-SIMS 2D elemental map for a pristine spiro-OMeTAD:LiTFSI film. Green dots represent Li ions. The scale bar for the Li ion signal intensity was adjusted for the best viewing level.

A large amount of detrimental Li ions can be removed from the spiro-OMeTAD:LiTFSI solution by filtrating the solution following the $CO_2$-bubbling process. Since Li ions have been found to negatively impact the device reliability, the impact of the Li ion reduction in the HTL on the overall device reliability was determined. By conducting TOF-SIMS 2D elemental mapping on pristine spiro-OMeTAD:LiTFSI films, a clear indication is observed of Li ions (Counts: 270,007 on 500 μm×500 μm) that form a few hundred micrometer-sized clusters in the film (FIG. 38). A large reduction in the Li-ion density (Counts: 4,856 on 500 μm×500 μm) was found in the filtered $CO_2$-doped film (FIG. 39), verifying that the majority of the detrimental Li ions were removed upon doping and filtration.

Figure 41:
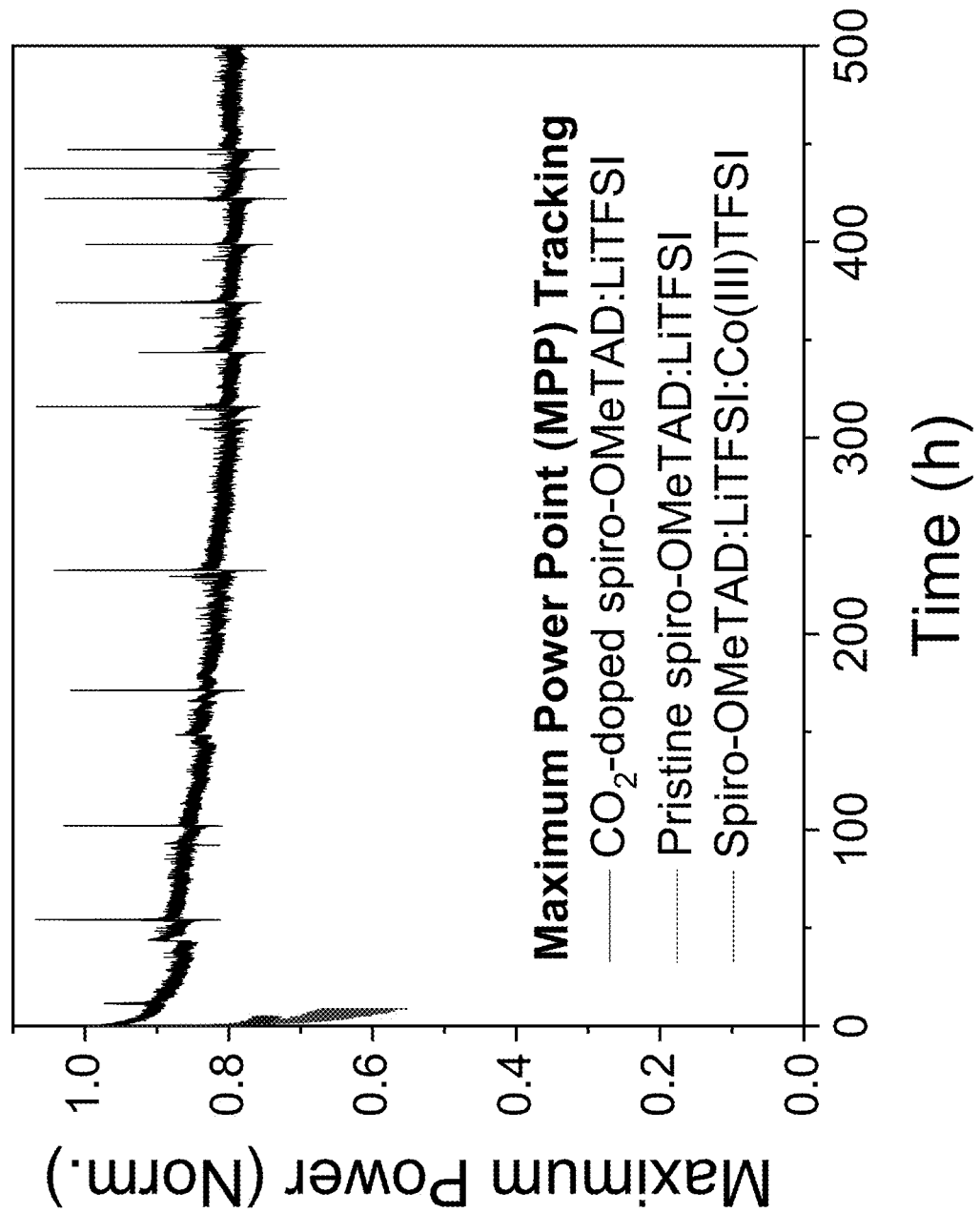
FIG. 41 shows maximum power point (MPP) traces for solar cells with a pristine spiro-OMeTAD:LiTFSI, a spiro-OMeTAD:LiTFSI:Co(III)TFSI, and a spiro-OMeTAD:LiTFSI processed with $CO_2$ bubbling and filtration, respectively. The MPP was collected every 350 ms under continuous light illumination (1000 W m$^{-2}$, AM1.5G) with neither a UV cutoff filter nor a temperature controller. Raw data including spikes that might originate from a lamp power instability was presented.

A maximum power point (MPP) tracker was set up to assess the solar cell reliability during operation (FIG. 40). The MPP for a control cell with a pristine spiro-OMeTAD:LiTFSI HTL drops below ~35% of its initial MPP within 6 hours (FIG. 41). Another control cell with a spiro-OMeTAD:LiTFSI:FK209 HTL also shows a rapid drop in the maximum power below ~75% of its initial MPP after 6 hours of MPP tracking (FIG. 41). In contrast, the perovskite solar cell with $CO_2$-doped spiro-OMeTAD:LiTFSI showed a much slower decrease in the MPP, retaining ~80% of its initial maximum power even at 500 h of MPP tracking (FIG. 41).

Figure 43:
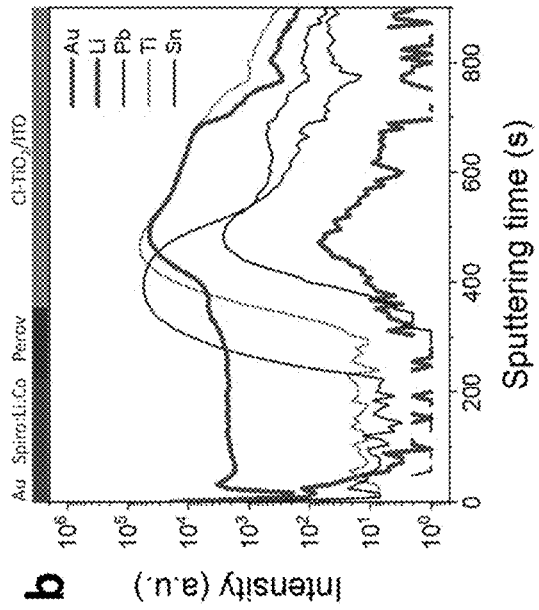
FIG. 43 depicts TOF-SIMS depth profiles for a solar cell with a spiro-OMeTAD:LiTFSI:Co(III)TFSI.
Figure 42:
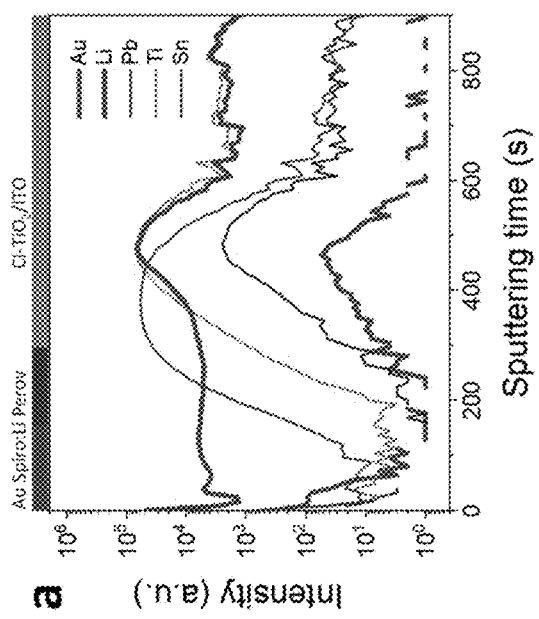
FIG. 42 depicts TOF-SIMS depth profiles for a solar cell with a pristine spiro-OMeTAD:LiTFSI.
Figure 44:
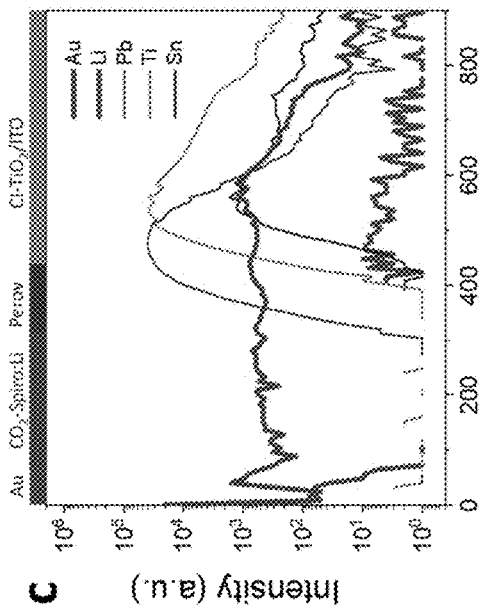
FIG. 44 depicts TOF-SIMS depth profiles for a solar cell with a spiro-OMeTAD:LiTFSI processed with $CO_2$ bubbling and filtration.

TOF-SIMS depth profiling was conducted to show how reducing the Li-ion content in the HTL reduces the overall Li-ion content in the vertical device direction and how this affects device reliability. For the solar cell with a pristine spiro-OMeTAD:LiTFSI HTL, a strong Li ion signal was detected throughout all the solar cell layers (active layer and both charge-extraction layers). The Li ions that intercalated into the perovskite active layer crystal structure can give rise to a decomposition of the perovskite material and a formation of metallic Pb (Tan, B. et al. Adv Energy Mater, 2019, 9, 1901519; Dawson, J. A. et al. Acs Energy Lett 2017, 2, 1818-1824), creating recombination sites. The Li ions were especially concentrated at the bottom contact layers (FIG. 42), which has been shown to result in device failure (Schloemer, T. H., et al., Chem Sci 2019, 10, 1904-1935; Li, Z. et al. Energ Environ Sci 2017, 10, 1234-1242; Lin, W. C. et al. Phys Chem Chem Phys 2017, 19, 21407-21413). Au from the top contact was also found at the bottom contact layers. This accumulation of Au ions can also give rise to recombination paths for electrons and can decrease the charge collection efficiency (Cacovich, S. et al. Nanoscale 2017, 9, 4700-4706), leading to irreversible degradation (Domanski, K. et al. Acs Nano 2016, 10, 6306-6314). Similar profiles were found for the solar cell with a spiro-OMeTAD:LiTFSI:FK209 HTL (FIG. 43); however, in the solar cell with $CO_2$-doped spiro-OMeTAD:LiTFSI, a Li-ion signal 1-2 orders of magnitude lower was detected in all layers, and no significant accumulation of Li and Au ions is found in the bottom contact layers (FIG. 44). Therefore, the improved solar cell reliability can be attributed in part to the reduction of diffused Li ions into the perovskite layer and less accumulation of extrinsic ions at the bottom contact layers. Considering the lower level of extrinsic ions in the solar cells and their improved reliability, using $CO_2$ to dope spiro-OMeTAD, followed by filtration, is a superior alternative to the doping approach using AgTFSI. AgTFSI can give rise to potentially detrimental hygroscopic substances such as silver halides (i.e., AgI) (Back, H. et al. Energ Environ Sci 2016, 9, 1258-1263; Depena, R. G. & Caimi, E. A. J Atmos Sci 1967, 24, 383). Moreover, alleviating concerns of using LiTFSI through the precipitate and filtration processes avoids sacrificing the device performance for device reliability that has been secured by not using LiTFSI in the spiro-OMeTAD HTL. Insufficient electrical conductivity of dopant-free HTL induces charge carrier accumulation in the perovskite layer (Rakstys, K., et al., Chem Sci 2019, 10, 6748-6769; Le Corre, V. M. et al. Acs Appl Energ Mater 2019, 2, 6280-6287), and leads to recombination at the interface between the perovskite (Luo, D. Y., et al., Nat Rev Mater 2020, 5, 44-60; Ahn, N. et al. Nat Commun 2016, 7), thereby reducing the conductivity of the HTL.

Figure 45:
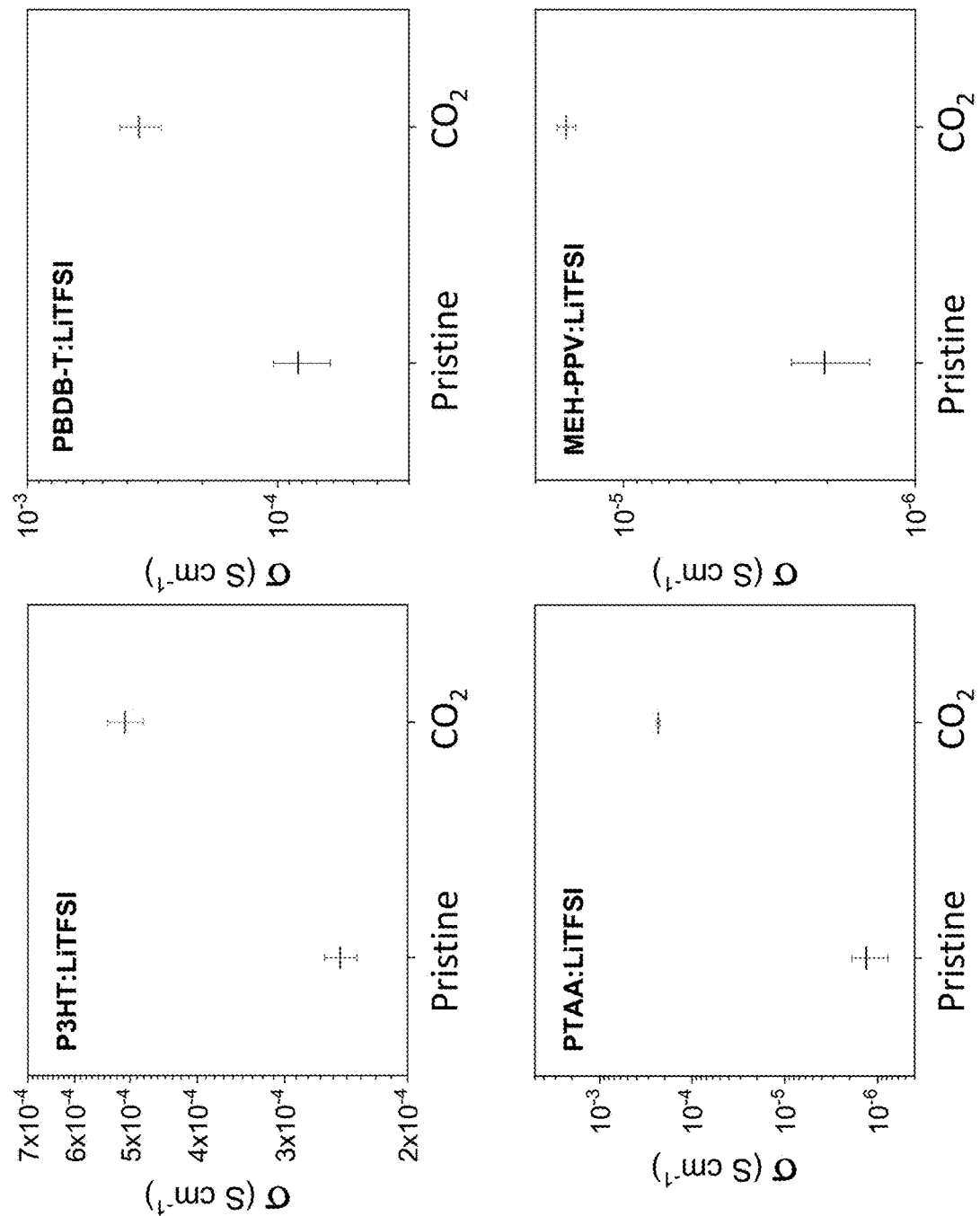
FIG. 45 is a series of plots showing electrical conductivities for organic hole transporting polymers P3HT:LiTFSI, PBDB-T:LiTFSI, PTAA:LiTFSI, and MEH-PPV:LiTFSI films with and without $CO_2$ doping.
Figure 46:
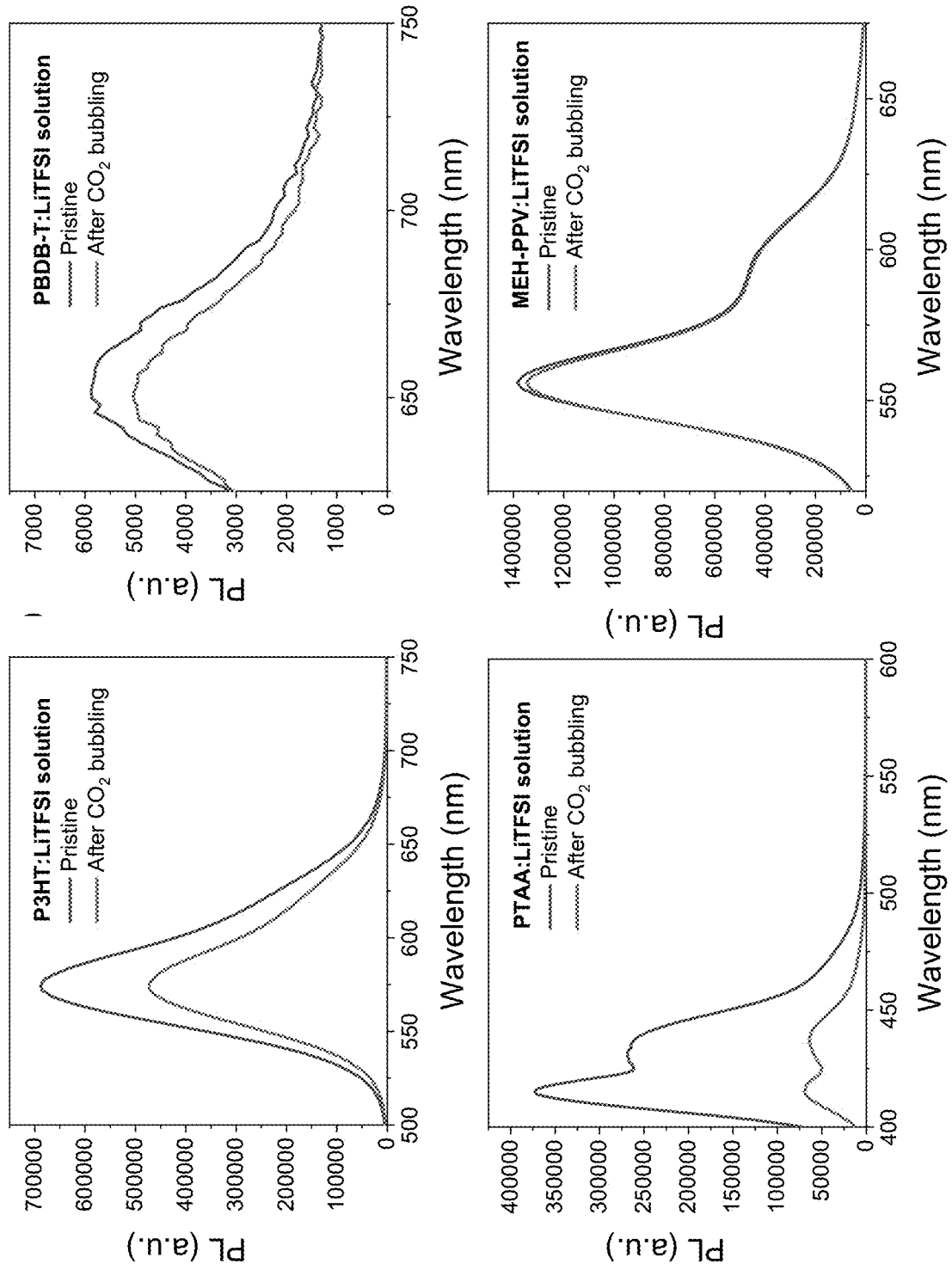
FIG. 46 is a series of plots of photoluminescence data for organic hole transporting polymers P3HT:LiTFSI, PBDB-T:LiTFSI, PTAA:LiTFSI, and MEH-PPV:LiTFSI solutions with and without $CO_2$ doping.
Figure 47:
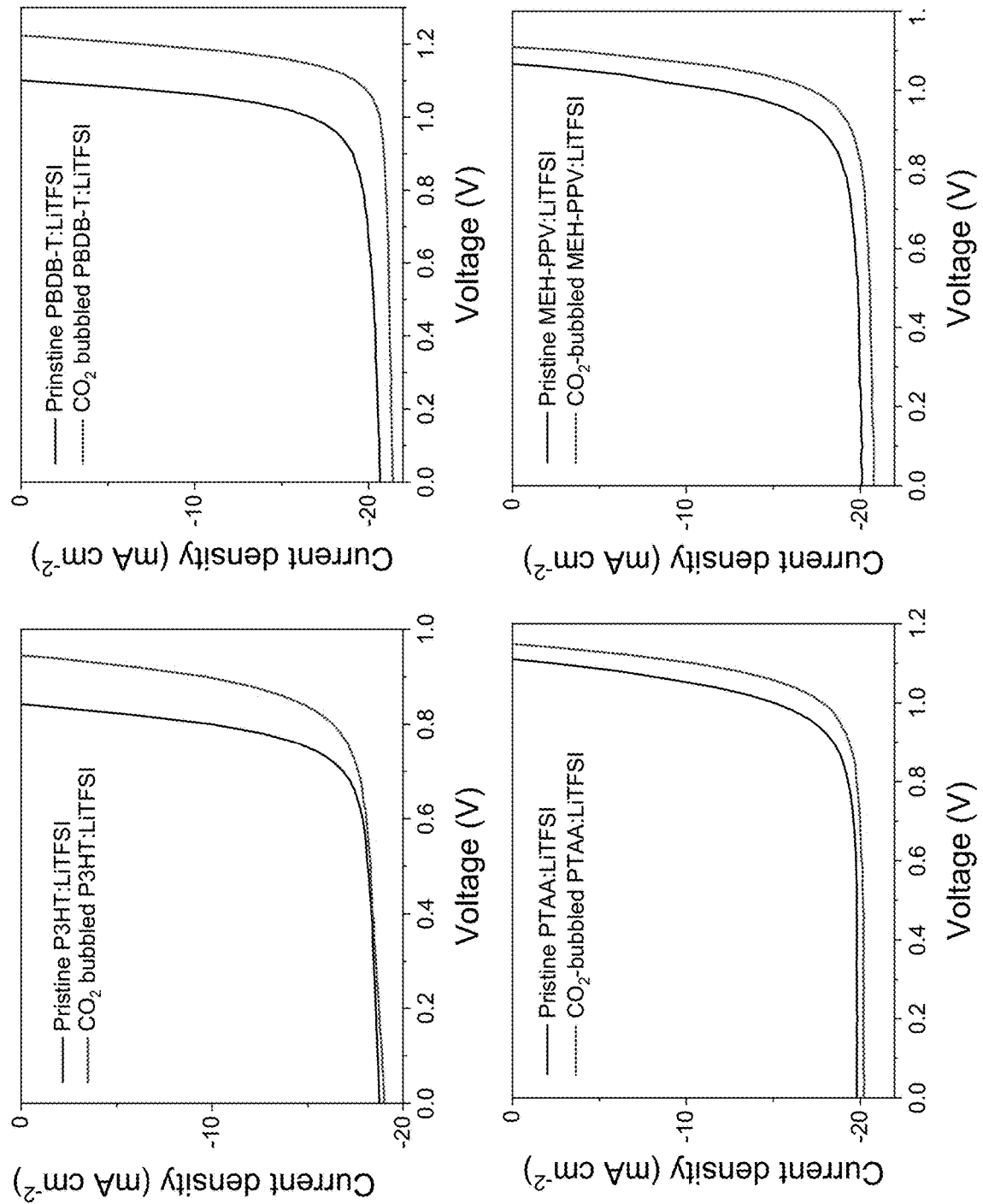
FIG. 47 is a series of plots showing J-V characteristics of perovskite solar cells using organic hole transporting polymers P3HT:LiTFSI, PBDB-T:LiTFSI, PTAA:LiTFSI, and MEH-PPV:LiTFSI solutions with and without $CO_2$ doping.

Finally, to demonstrate a broader applicability of this method, $CO_2$ was used to dope representative conjugated polymers: Poly(3-hexylthiophene-2,5-diyl) (P3HT), Poly[[4,8-bis[5-(2-ethylhexyl)-2-thienyl]benzo[1,2-b:4,5-b']dithiophene-2,6-diyl]-2,5-thiophenediyl[5,7-bis(2-ethylhexyl)-4,8-dioxo-4H,8H-benzo[1,2-c:4,5-c']dithiophene-1,3-diyl]] (PBDB-T), Poly[bis(4-phenyl)(2,4,6-trimethylphenyl)amine] (PTAA), and Poly[2-methoxy-5-(2-ethylhexyloxy)-1,4-phenylenevinylene] (MEH-PPV). The $CO_2$ doping enhanced the conductivity of the polymers by at least a factor of two and up to two orders of magnitude (FIG. 45), which is supported by PL quenching experiments (FIG. 46) (van Reenen, S., et al., Phys Rev B 2014, 89, 205206). Perovskite solar cells employing $CO_2$-doped polymer HTLs exhibit enhanced PCEs (FIG. 47 and Table 4): 11.5%→13.0% (P3HT), 17.3%→22.1% (PBDB-T), 16.7%→18.0% (PTAA), and 16.0%→17.8% (MEH-PPV). The efficiency enhancements are mostly attributed to enhanced FF and $V_{OC}$, as expected when the conductivity of charge-extraction layers is increased (Stolterfoht, M. et al. Energ Environ Sci 2017, 10, 1530-1539).

TABLE 4

Device parameters of perovskite solar cells using $CO_2$-bubbled polymer: LiTFSI. Figures in parenthesis refer to the average values of parameters for 8 cells.

|  |  | $V_{OC}$ [V] | $J_{SC}$ [mA cm$^{-2}$] | FF | PCE [%] |
|---|---|---|---|---|---|
| P3HT: LiTFSI | Pristine | 0.84 (0.828 ± 0.010) | 18.7 (18.60 ± 0.247) | 0.75 (0.755 ± 0.007) | 11.80 (11.63 ± 0.121) |
|  | $CO_2$ bubbled | 0.94 (0.940) | 19.0 (18.89 ± 0.120) | 0.73 (0.728 ± 0.004) | 13.0 (12.94 ± 0.159) |
| PBDB-T: LiTFSI | Pristine | 1.10 (1.092 ± 0.010) | 20.6 (20.56 ± 0.239) | 0.76 (0.769 ± 0.012) | 17.3 (17.27 ± 0.528) |
|  | $CO_2$ bubbled | 1.23 (1.205 ± 0.014) | 21.4 (21.10 ± 0.203) | 0.84 (0.816 ± 0.019) | 22.1 (20.21 ± 0.835) |
| PTAA: LiTFSI | Pristine | 1.10 (1.105 ± 0.009) | 19.8 (20.15 ± 0.703) | 0.76 (0.743 ± 0.024) | 16.7 (16.56 ± 0.710) |
|  | $CO_2$ bubbled | 1.14 (1.120 ± 0.010) | 20.2 (20.38 ± 0.704) | 0.78 (0.766 ± 0.010) | 18.0 (17.49 ± 0.679) |
| MEH-PPV: LiTFSI | Pristine | 1.06 (1.055 ± 0.009) | 20.1 (19.49 ± 0.482) | 0.75 (0.752 ± 0.004) | 16.0 (15.47 ± 0.381) |
|  | $CO_2$ bubbled | 1.10 (1.100 ± 0.001) | 20.8 (20.01 ± 0.646) | 0.78 (0.778 ± 0.008) | 17.8 (17.14 ± 0.635) |

The feasibility of doping small-molecule and polymeric organic semiconductors with $CO_2$ for use as HTLs in perovskite solar cells has been presented herein. $CO_2$ leads to rapid oxidation of the semiconductor by stealing electrons. The negatively charged $CO_2$ gas reacts with lithium ions, added for charge neutrality, forming carbonates that can be easily filtered out of the solution before use. The $CO_2$-doping process rapidly (~1 min) enhances the HTL conductivity by 1-2 orders of magnitude, yielding reliable, high-efficiency perovskite solar cells without the need of any post-processing with air and light. This novel doping process significantly reduces the device fabrication time by several hours, while simultaneously removing potentially detrimental compounds from the solar cell.

The disclosures of each and every patent, patent application, and publication cited herein are hereby incorporated herein by reference in their entirety. While this invention has been disclosed with reference to specific embodiments, it is apparent that other embodiments and variations of this invention may be devised by others skilled in the art without departing from the true spirit and scope of the invention. The appended claims are intended to be construed to include all such embodiments and equivalent variations.

We claim:

1. A method of producing a doped organic semiconductor, the method comprising the steps of:
    providing an organic semiconductor solution;
    contacting the organic semiconductor solution with $CO_2$; and
    irradiating the organic semiconductor solution with ultraviolet light;
    wherein the organic semiconductor solution comprises a metal salt.

2. The method of claim 1, wherein the organic semiconductor solution comprises at least one organic semiconductor.

3. The method of claim 1, wherein the organic semiconductor solution comprises spiro-OMeTAD or a derivative thereof.

4. The method of claim 1, wherein the metal salt has the formula $M^+X^-$;
    wherein M is a monocationic metal ion; and
    $X^-$ is a monoanionic species.

5. The method of claim 1, wherein the organic semiconductor solution comprises a semiconducting polymer.

6. The method of claim 5, wherein the semiconducting polymer is selected from the group consisting of poly(3-hexylthiophene) (P3HT), poly[(2,6-(4,8-bis(5-(2-ethylhexyl)thiophen-2-yl)-benzo[1,2-b:4,5-b']dithiophene))-alt-(5,5-(1',3'-di-2-thienyl-5',7'-bis(2-ethylhexyl)benzo[1',2'-c:4',5'-c']dithiophene-4,8-dione)]) (PBDB-T), poly[bis(4-phenyl)(2,4,6-trimethylphenyl)amine] (PTAA), and poly[2-methoxy-5-(2-ethylhexyloxy)-1,4-phenylenevinylene] (MEH-PPV).

7. The method of claim 1, wherein the step of contacting the organic semiconductor with $CO_2$ comprises the step of bubbling $CO_2$ through the organic semiconductor solution.

8. The method of claim 1, wherein the step of contacting the organic semiconductor with $CO_2$ occurs simultaneously with the step of irradiating the organic semiconductor solution with ultraviolet light.

9. A doped organic semiconductor material produced using the method of claim 1.

10. A hole transport layer comprising the doped organic semiconductor material of claim 9.

11. A photovoltaic device comprising the doped organic semiconductor material of claim 9.

12. A method of producing a doped organic semiconductor, the method comprising the steps of:
   providing an organic semiconductor solution;
   contacting the organic semiconductor solution with $CO_2$;
      irradiating the organic semiconductor solution with ultraviolet light; and removing at least one precipitate from the organic semiconductor solution.

13. The method of claim 12, wherein the precipitate comprises $M_2CO_3$;
   wherein M is a monocationic metal ion.

14. A method of producing a doped organic semiconductor, the method comprising the steps of:
   providing an organic semiconductor solution;
   contacting the organic semiconductor solution with $CO_2$;
      irradiating the organic semiconductor solution with ultraviolet light; and isolating a mixture of the organic semiconductor and a doped organic semiconductor from the organic semiconductor solution.

* * * * *